US011184109B2

(12) United States Patent
Maunder et al.

(10) Patent No.: US 11,184,109 B2
(45) Date of Patent: Nov. 23, 2021

(54) PARALLEL TURBO DECODING WITH NON-UNIFORM WINDOW SIZES

(71) Applicant: ACCELERCOMM LIMITED, Hampshire (GB)

(72) Inventors: Robert Maunder, Hampshire (GB); Matthew Brejza, Hampshire (GB); Luping Xiang, Hampshire (GB)

(73) Assignee: Accelercomm Limited, Southampton (GB)

( * ) Notice: Subject to any disclaimer, the term of this patent is extended or adjusted under 35 U.S.C. 154(b) by 356 days.

(21) Appl. No.: 16/475,640

(22) PCT Filed: Feb. 6, 2018

(86) PCT No.: PCT/GB2018/050332
§ 371 (c)(1),
(2) Date: Jul. 2, 2019

(87) PCT Pub. No.: WO2018/146462
PCT Pub. Date: Aug. 16, 2018

(65) Prior Publication Data
US 2021/0176006 A1    Jun. 10, 2021

(30) Foreign Application Priority Data
Feb. 13, 2017   (GB) ..................... 1702341

(51) Int. Cl.
*H03M 13/03*    (2006.01)
*H04L 1/00*     (2006.01)
(Continued)

(52) U.S. Cl.
CPC ........ *H04L 1/0045* (2013.01); *H03M 13/258* (2013.01); *H03M 13/27* (2013.01);
(Continued)

(58) Field of Classification Search
CPC ..... H04L 1/0045; H04L 1/006; H04L 1/0071; H03M 13/258; H03M 13/27; H03M 13/2957; H03M 13/45
See application file for complete search history.

(56) References Cited

U.S. PATENT DOCUMENTS 5,721,746 A * 2/1998 Hladik ................ H03M 13/616
  714/792
6,075,822 A * 6/2000 Oh .................... H03M 13/4169
  375/262

(Continued)

FOREIGN PATENT DOCUMENTS

CN     102611464 B    1/2015
CN     102723958 B    2/2015
(Continued)

OTHER PUBLICATIONS

"3rd Generation Partnership Project; Technical Specification Group Radio Access Network; Evolved Universal Terrestrial Radio Access (E-UTRA); Multiplexing and channel coding (Release 10)", 3GPP TS 36.212 V10.8.0, (Jun. 2013), http://www.3gpp.org.
(Continued)

*Primary Examiner* — Christine T. Tu
(74) *Attorney, Agent, or Firm* — Haverstock & Owens LLP

(57) ABSTRACT

A turbo decoder circuit performs a turbo decoding process to recover a frame of data symbols from a received signal comprising soft decision values for each data symbol of the frame. The data symbols of the frame have been encoded with a turbo encoder comprising upper and lower convolutional encoders which can each be represented by a trellis, and an interleaver which interleaves the encoded data between the upper and lower convolutional encoders. The turbo decoder circuit comprises a clock, a configurable
(Continued)

network circuitry for interleaving soft decision values, an upper decoder and a lower decoder. Each of the upper and lower decoders include processing elements, which are configured, during a series of consecutive clock cycles, iteratively to receive, from the configurable network circuitry, a priori soft decision values pertaining to data symbols associated with a window of an integer number of consecutive trellis stages representing possible paths between states of the upper or lower convolutional encoder. The processing elements perform parallel calculations associated with the window using the a priori soft decision values in order to generate corresponding extrinsic soft decision values pertaining to the data symbols. The configurable network circuitry includes network controller circuitry which controls a configuration of the configurable network circuitry iteratively, during the consecutive clock cycles, to provide the a priori soft decision values for the upper decoder by interleaving the extrinsic soft decision values provided by the lower decoder, and to provide the a priori soft decision values for the lower decoder by interleaving the extrinsic soft decision values provided by the upper decoder. The interleaving performed by the configurable network circuitry controlled by the network controller is in accordance with a predetermined schedule, which provides the a priori soft decision values at different cycles of the one or more consecutive clock cycles to avoid contention between different a priori soft decision values being provided to the same processing element of the upper or the lower decoder during the same clock cycle. Accordingly the processing elements can have a window size which includes a number of stages of the trellis so that the decoder can be configured with an arbitrary number of processing elements, making the decoder circuit an arbitrarily parallel turbo decoder.

22 Claims, 19 Drawing Sheets

(51) Int. Cl.
  *H03M 13/25* (2006.01)
  *H03M 13/27* (2006.01)
  *H03M 13/29* (2006.01)
  *H03M 13/45* (2006.01)
(52) U.S. Cl.
  CPC ....... *H03M 13/2957* (2013.01); *H03M 13/45* (2013.01); *H04L 1/006* (2013.01); *H04L 1/0071* (2013.01)

(56) References Cited

U.S. PATENT DOCUMENTS

| | | | |
|---|---|---|---|
| 2005/0102600 A1 | 5/2005 | Anandakumar | |
| 2011/0161782 A1* | 6/2011 | Engin | H03M 13/6566 714/763 |

FOREIGN PATENT DOCUMENTS

| | | |
|---|---|---|
| WO | 2003056707 A1 | 7/2003 |
| WO | 2005/064800 A1 | 7/2005 |
| WO | 2011082509 A1 | 7/2011 |
| WO | 2016023762 A1 | 2/2016 |

OTHER PUBLICATIONS

"IEEE Standard for Air Interface for Broadband Wireless Access Systems", IEEE Std. 802.16TM-2012, (Revision of IEEE Std 802.16-2009), Aug. 17, 2012, IEEE Standards Association.
Berrou, Claude et al. , "Near Shannon Limit Error-Correcting Coding and Decoding : Turbo-Codes(1)", pp. 1064-1070.
Robertson, Patrick et al., "A Comparison of Optimal and Sub-Optimal MAP Decoding Algorithms Operating in the Log Domain", Institute for Communications Technology, German Aerospace Research Establishment (DLR), pp. 1009-1013.
"IEEE Standard for Information technology Telecommunications and Information exchange between systems Local and metropolitan area networks Specific requirements", Part 11: Wireless LAN Medium Access Control (MAC) and Physical Layer (PHY) Specifications, Amendment 5: Enhancements for Higher Throughput, IEEE Computer Society, EEE Std 802.11n TM 2009, pp. 1-502.
MacKay D.J.C. et al., "Near Shannon limit performance of low density parity check codes", Electronics Letters, Mar. 13, 1997, vol. 33, No. 6, pp. 457-458.
Fossorier,Marc P.C. et al., "Reduced Complexity Iterative Decoding of Low-Density Parity Check Codes Based on Belief Propagation", IEEE Transaction on Communications, vol. 47, No. 5, May 1999, pp. 673-679.
'5G Radio Access', Ericsson White Paper, 284-3204 Uen, Jun. 2013, pp. 1-9.
Chandrasetty, Vikram Arklgud et al., "FPGA Implementation of a LDPC Decoder using a Reduced Complexity Message Passing Algorithm", Journal of Networks, vol. 6, No. 1, Jan. 2011, pp. 36-45, 2011 Academy Publisher.
Ilnseher, Thomas et al., "A 2.15GBit/s Turbo Code Decoder for LTE Advanced Base Station Applications", 2012 7th International Symposium on Turbo Codes and Iterative Information Processing (ISTC), pp. 21-25.
Fanucci, Luca et al., "VLSI Design of a Fully-Parallel High-Throughput Decoded for Turbo Gallager Codes", 2006 the Institute of Electronics, Information and Communication Engineers, IEICE Trans Fundamentals, vol. E89-A, No. 7 Jul. 2006, pp. 1976-1986.
Vogrig, Daniele et al.,"A 0.35-m CMOS Analog Turbo Decoder for the 40-bit Rate 1/3 UMTS Channel Code", IEEE Joiurnal of Solid-State Circuits, vol. 40, No. 3 , Mar. 2005, pp. 753-762.
Dong, Quang Trung et al., "Stochastic Decoding of Turbo Codes", IEEE Transactions on signal processing, vol. 58, No. 12, Dec. 2010, pp. 6421-6425.
Nimbalker, Ajit et al., "ARP and QPP Interleaves for LTE TURBO Coding", Wireless and Solutions Research Motorola Labs, IEEE Communications Society subject matter experts for publication in th WCNC-2008 proceedings, pp. 1032-1037.
Li, Liang et al., "A Low-Complexity Turbo Decoder Architecture for Energy-Efficient Wireless Sensor Networks", IEEE Transaction on Very Large Scale Integration (VLSI) Systems, vol. 21, No. 1, Jan. 2013, pp. 14-22.
Radosavljevic, Predrag et al., "Optimized Message Passing Schedules for LDPC Decoding", Department of Electrical and Computer Engineering, pp. 591-595.
Xianjun, Jia et al., "a 122Mb/s Turbo Decoder using a Mid-range GPU", 978-4673-2480-9/13, pp. 1090-1094.
"Turbo IP Core User Guide", UG-Turbo Nov. 11, 2015, Altera.
Gonzalez-Perez, Luis F. et al., "Parallel and Configurable Turbo Decoder Implementation for 3GPP-LTE", 978-4799-2079-2/13.
Wu, Yufei et al., "Data Width Requirements in SISO Decoding With Modulo Normalization", IEEE Transactions on Communications,vol. 49, No. 11, Nov. 2001.
Zhang, Juntan et al., "Shuffled Iterative Decoding", IEEE Transactions on Communications, vol. 53, No. 2, Feb. 2005, pp. 209-213.
Chang, Chihming, "Arbitrary Size Benes Networks", University of Pittsburgh Department of Computer Science, pp. 1-6.
International Search Report and Written Opinion for the PCT/GB2018/050332 application dated Apr. 5, 2018.
Abbasfar A et al, "An efficient and practical architecture for high speed turbo decoders", Proc. IEEE 58th Vehicular Technology Conference 2003 (VTC 2003-Fall), Orlando, FL, USA,Oct. 6, 2003 (Oct. 6, 2003), p. 337-341vol. 1, XP010700880, DOI: 10.1109/VETECF.2003.1285035 external link ISBN: 9780780379541, p. 338, left-hand column—p. 339, right-hand col. 2,3,9 ,figures 1,3 table I.
Yang Sun et al, "Efficient hardware implementation of a highly-parallel 3GPP LTE/LTE-advance turbo decoder", Jul. 17, 2010 (Jul.

(56) References Cited

OTHER PUBLICATIONS 17, 2010), vol. 44, No. 4, p. 305-315, XP028257389 DOI: 10.1016/J.VLSI.2010.07.001 external link ISSN:0167-9260 [retrieved on Jul. 17, 2010] 1-22 ,p. 312, left-hand column—p. 314, left-hand column; figure 19.

Maunder Robert G, "A Fully-Parallel Turbo Decoding Algorithm", Aug. 1, 2015 (Aug. 1, 2015), vol. 63, No. 8, p. 2762-2775, XP011665444, DOI: 10.1109/TCOMM.2015.2450208 external link ISSN:0090-6778 [retrieved on Aug. 7, 2015] 1-22, p. 2767, left-hand column—p. 2769, left-hand column figure 1(c).

* cited by examiner

PARALLEL TURBO DECODING WITH NON-UNIFORM WINDOW SIZES

TECHNICAL FIELD OF THE DISCLOSURE

The present disclosure relates to detection circuits for performing a turbo detection process to recover a frame of data symbols from a received signal comprising one or more parity and/or systematic soft decision values for each data symbol of the frame, the data symbols of the frame having been encoded with a turbo encoder comprising upper and lower convolutional encoders which can each be represented by a trellis having a plurality of trellis states.

Embodiments of the present disclosure may provide therefore receivers configured to recover the frame of data symbols using a turbo decoder and methods for decoding turbo encoded data. In one example the data symbols are bits.

The present application claims the Paris convention priority to UK patent application 1702341.7 the contents of which are herein incorporated by reference.

BACKGROUND OF THE DISCLOSURE

Over the past two decades, wireless communication has been revolutionized by channel codes that benefit from iterative decoding algorithms. For example, the Long Term Evolution (LTE) [1] and WiMAX [2] cellular telephony standards employ turbo codes [3], which comprise a concatenation of two convolutional codes. Conventionally, the Logarithmic Bahl-Cocke-Jelinek-Raviv (Log-BCJR) algorithm [4] is employed for the iterative decoding of the Markov chains that are imposed upon the encoded bits by these convolutional codes. Meanwhile, the WiFi standard for Wireless Local Area Networks (WLANs) [5] has adopted Low Density Parity Check (LDPC) codes [6], which may operate on the basis of the min-sum algorithm [7]. Owing to their strong error correction capability, these sophisticated channel codes have facilitated reliable communication at transmission throughputs that closely approach the capacity of the wireless channel. However, the achievable transmission throughput is limited by the processing throughput of the iterative decoding algorithm, if real-time operation is required. Furthermore, the iterative decoding algorithm's processing latency imposes a limit upon the end-to-end latency. This is particularly relevant, since multi-gigabit transmission throughputs and ultra-low end-to-end latencies can be expected to be targets for next-generation wireless communication standards [8]. Therefore, there is a demand for iterative decoding algorithms having improved processing throughputs and lower processing latencies. Owing to the inherent parallelism of the min-sum algorithm, it may be operated in a fully-parallel manner, facilitating LDPC decoders having processing throughputs of up to 16.2 Gbit/s [9]. By contrast, the processing throughput of state-of-the-art turbo decoders [10] is limited to 2.15 Gbit/s. This may be attributed to the inherently serial nature of the Log-BCJR algorithm, which is imposed by the data dependencies of its forward and backward recursions [4]. More specifically, the turbo-encoded bits generated by each of typically two convolutional encoders must be processed serially, spread over numerous consecutive time periods, which are clock cycles in a practical integrated circuit implementation. Furthermore, the Log-BCJR algorithm is typically applied to the two convolutional codes alternately, until a sufficient number of decoding iterations have been performed. As a result, thousands of time periods are required to complete the iterative decoding process of the state-of-the-art turbo decoder.

Accordingly, providing an alternative to the Log-BCJR decoder, which has fewer data dependencies and which enables highly parallel processing represents a technical problem.

SUMMARY OF THE DISCLOSURE

According to a first example embodiment of the present technique there is provided a turbo decoder circuit for performing a turbo decoding process to recover a frame of data symbols from a received signal comprising either parity or parity and systematic soft decision values (LLR values) for each data symbol of the frame. The data symbols of the frame may have been encoded with a turbo encoder using a systematic code or non-systematic code, so that the received soft decision values for the frame may comprise soft decision values for systematic and parity symbols for the example of the systematic code or parity symbols for the non-systematic code. The turbo decoder circuit recovers data symbols of the frame, which have been encoded with a turbo encoder comprising upper and lower convolutional encoders which can each be represented by a trellis, and an interleaver which interleaves the encoded data between the upper and lower convolutional encoders. The turbo decoder circuit comprises a clock, a configurable network circuitry for interleaving soft decision values, an upper decoder and a lower decoder. Each of the upper and lower decoders include processing elements, which are configured, during a series of consecutive clock cycles, iteratively to receive, from the configurable network circuitry, a priori soft decision values (a priori LLRs) pertaining to data symbols associated with a window of an integer number of consecutive trellis stages representing possible paths between states of the upper or lower convolutional encoder. The processing elements perform parallel calculations associated with the windows using the a priori soft decision values in order to generate corresponding extrinsic soft decision values pertaining to the data symbols. The configurable network circuitry includes network controller circuitry which controls a configuration of the configurable network circuitry iteratively, during the consecutive clock cycles, to provide the a priori soft decision values for the upper decoder by interleaving the extrinsic soft decision values provided by the lower decoder, and to provide the a priori soft decision values for the lower decoder by interleaving the extrinsic soft decision values provided by the upper decoder. The interleaving performed by the configurable network circuitry controlled by the network controller is in accordance with a predetermined schedule, which provides the a priori soft decision values at different cycles of the one or more consecutive clock cycles to avoid contention between different a priori soft decision value being provided to the same processing element of the upper or the lower decoder during the same clock cycle.

According to example embodiments of the present technique therefore, each of the processing elements of the upper decoder and the lower decoder perform calculations associated with its window of the trellis. This means that each of the processing elements is performing the calculations associated with the forward and backward recursions of the turbo decoding for a section of the trellis associated with and corresponding to a section of the data symbols of the frame. As a result of the arbitrarily parallel processing of the turbo decoder, the processing elements can divide up the trellis of the upper decoder without restriction on the mapping of the window size to the processing elements although a greater decoding rate can be achieved by sharing the window sizes of the trellis stages between the available processing elements as much as possible. This also means that the size of the frame can vary independently of the number of processing elements available to perform the turbo decoding, so that the window sizes formed by partitioning the trellis can be configured dynamically. This arbitrarily parallel nature of the turbo decoding circuit is achieved at least in part as a result of the predetermined schedule which configures the configurable network, which not only interleaves the soft decision values in accordance with the interleaving performed at the encoder, but also manages the delivery of the soft decision values to avoid contention caused by different soft decision values being delivered to the same processing element in the same clock cycle.

Various further aspects and features of the present disclosure are defined in the appended claims and include a method of turbo decoding, a communications device, and an infrastructure equipment of a wireless communications network.

BRIEF DESCRIPTION OF DRAWINGS

Embodiments of the present disclosure will now be described by way of example only with reference to the accompanying drawings wherein like parts are provided with corresponding reference numerals and in which:

FIG. 14a is a schematic circuit diagram of part of a processing element shown in FIG. 11 configured to calculate the bit metric vector in the first forward sub-processing element and FIG. 13b is a schematic block diagram of part of the processing element shown in FIG. 11 configured to calculate the extrinsic and a posteriori log-likelihood ratios in the second forward sub-processing element;

DESCRIPTION OF EXAMPLE EMBODIMENTS

Example Communications System

Figure 1:
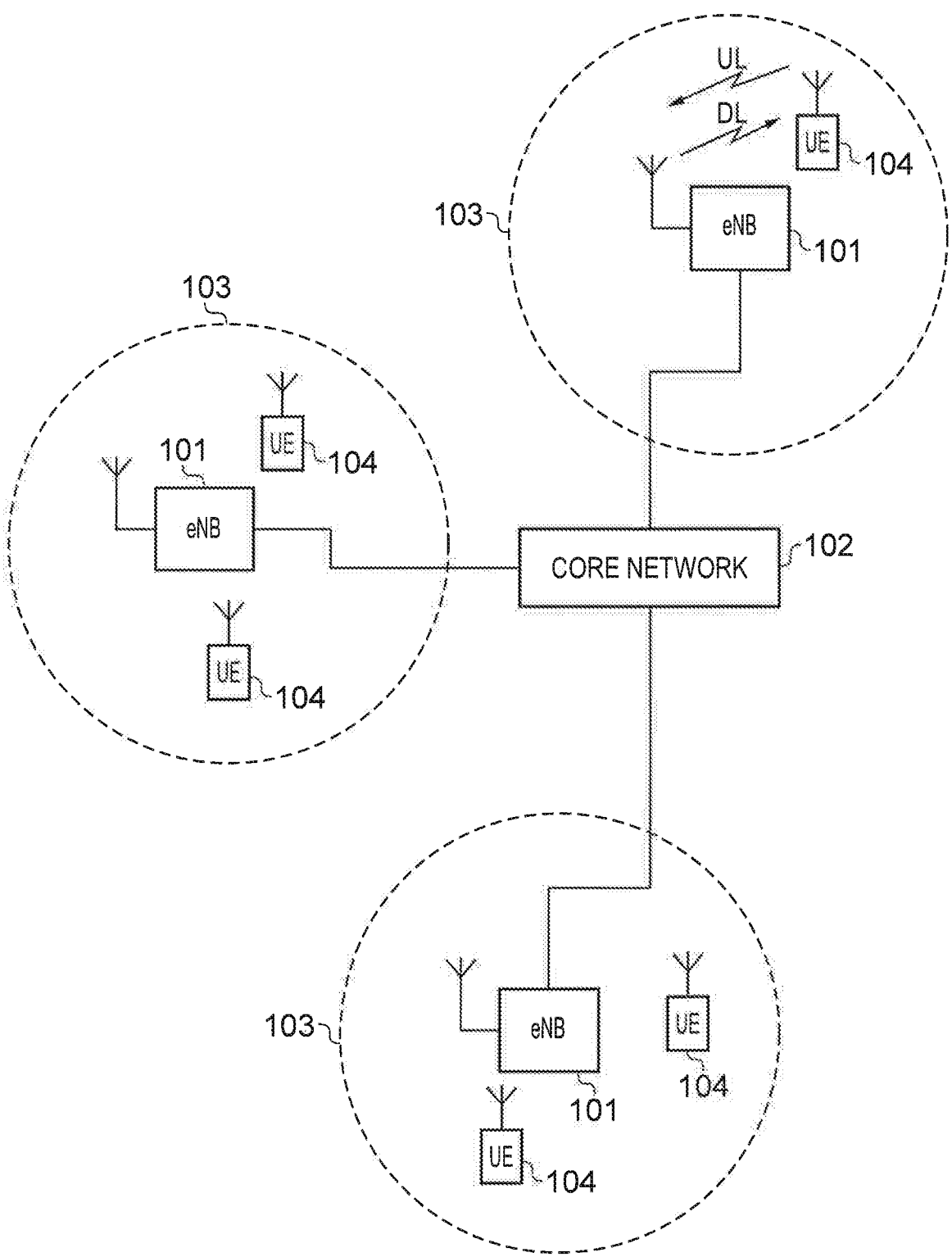
FIG. 1 is a schematic diagram of a mobile communications system operating in accordance with the LTE standard.

FIG. 1 provides a schematic diagram of a conventional mobile telecommunications system, where the system includes mobile communications devices 104, infrastructure equipment 101 and a core network 102. The infrastructure equipment may also be referred to as a base station, network element, enhanced Node B (eNodeB) or a coordinating entity for example, and provides a wireless access interface to the one or more communications devices within a coverage area or cell. The one or more mobile communications devices may communicate data via the transmission and reception of signals representing data using the wireless access interface. The network entity 101 is communicatively linked to the core network 102 where the core network may be connected to one or more other communications systems or networks which have a similar structure to that formed from communications devices 104 and infrastructure equipment 102. The core network may also provide functionality including authentication, mobility management, charging and so on for the communications devices served by the network entity. The mobile communications devices of FIG. 1 may also be referred to as communications terminals, user equipment (UE), terminal devices and so forth, and are configured to communicate with one or more other communications devices served by the same or a different coverage area via the network entity. The communications system may operate in accordance with any known protocol, for instance in some examples the system may operate in accordance with the 3GPP Long Term Evolution (LTE) standard where the network entity and communications devices are commonly referred to as eNodeB and UEs, respectively.

As will be appreciated from the operation explained above, the physical layer of the UEs and the eNodeBs are configured to transmit and receive signals representing data. As such a typical transmitter/receiver chain is shown in FIGS. 2 and 3.

Figure 2:
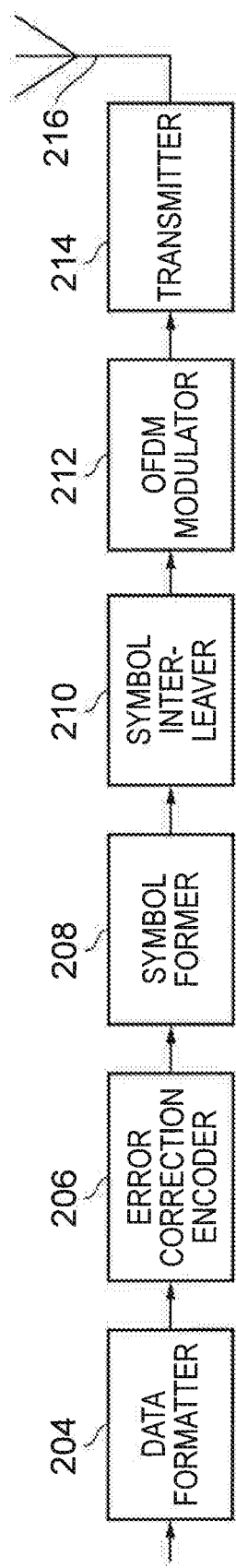
FIG. 2 is a schematic block diagram of an example transmitter for the LTE system shown in FIG. 1.
Figure 3:
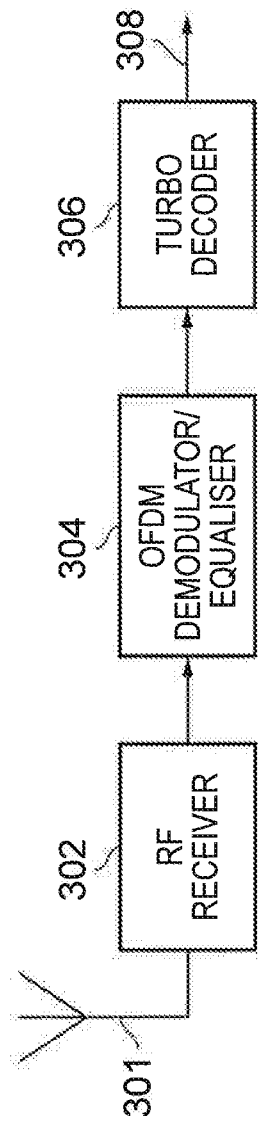
FIG. 3 is a schematic block diagram of an example receiver for the LTE system shown in FIG. 1.

FIG. 2 provides a schematic block diagram illustrating components which make up a transmitter which may form part of the e-NodeB 101 or a communications device 104 of the physical layer transmission via the wireless access interface of the LTE system as illustrated in FIG. 1. In FIG. 2, data is received via an input at a data formatter 204 and formed into frames or sub frames for transmission. Frames of data are then encoded with an error correction code by an error correction encoder 206 and fed to a symbol former 208 which forms the error correction encoded bits into groups of bits for mapping onto symbols for modulation. The data symbols are then interleaved by a symbol interleaver 210 and fed to an OFDM modulator 212 which modulates the subcarriers of an OFDM symbol with the data symbols which have been received from the interleaver 210. The OFDM symbols are then converted to an RF frequency and transmitted by a transmitter 214 via an antenna 216.

Correspondingly, a receiver operating to receive data transmitted via the physical layer for either the communications device 104 or an eNodeB 101 via an LTE wireless access interface includes a receiver antenna 301, which detects the radio frequency signal transmitted via the wireless access interface to a radio frequency receiver 302. FIG. 3 represents a simplified version of a receiver and several blocks will make up an OFDM demodulator/equaliser 304 which converts the time domain OFDM symbol into the frequency domain and demodulates the subcarriers of the OFDM symbol to recover the data symbols and performs deinterleaving etc. However an output of the OFDM demodulator/equaliser 304 is to feed the encoded soft decision values representing the data bits to a turbo decoder 306. The turbo decoder performs a turbo decoding algorithm to detect and recover an estimate of the transmitted data bits which are output as a stream of data bits on an output 308 corresponding to the input of the transmitter.

Figure 4:
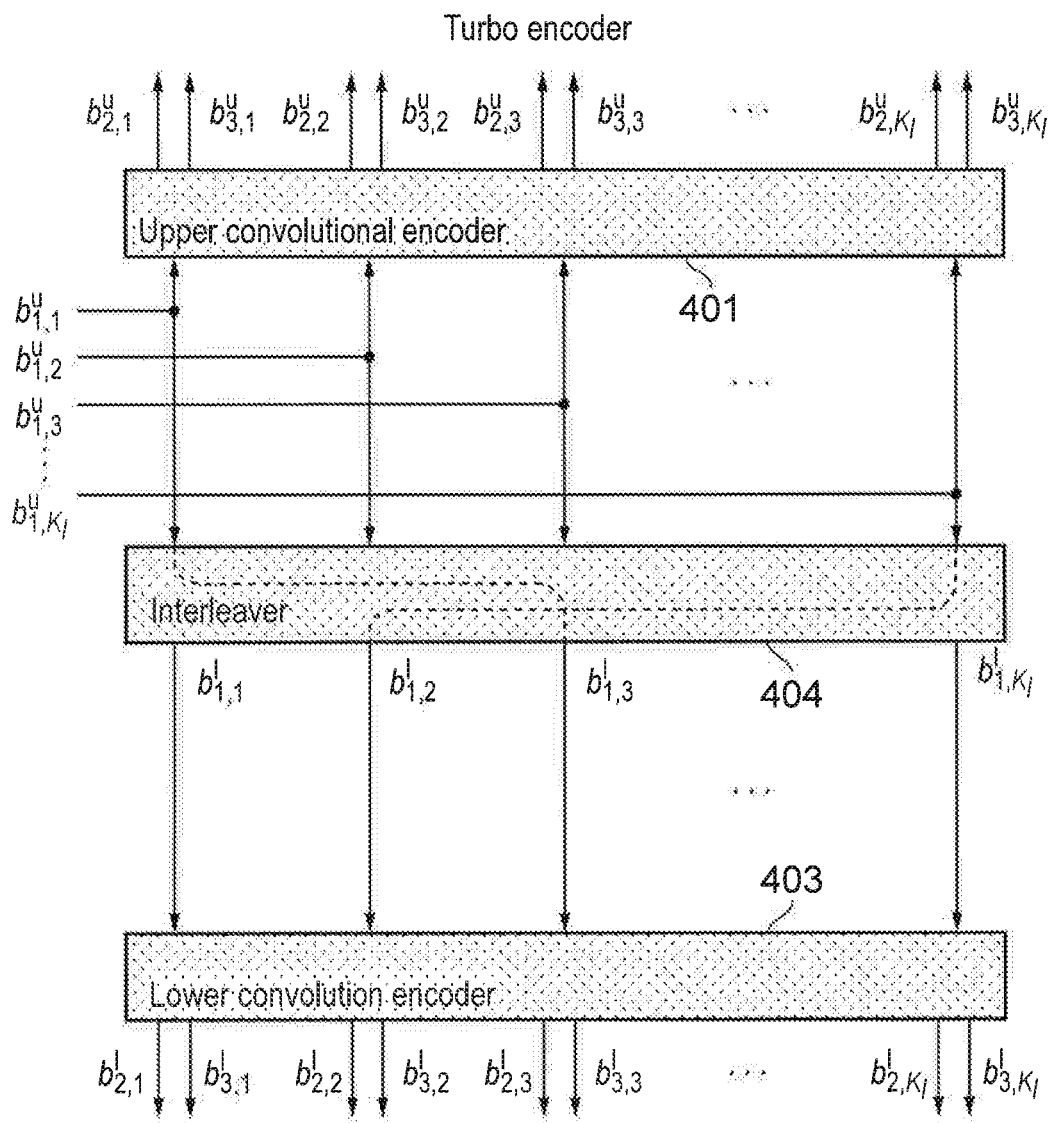
FIG. 4 is a schematic block diagram of a simplified turbo encoder.

For the example of LTE as mentioned above, an example embodiment of an error correction encoder 206 shown in FIG. 2 is shown in FIG. 4. FIG. 4 provides an example representation illustrating a simplified turbo encoder, which encodes a message frame $b_1^u = [b_{1,k}^u]_{k=1}^{K_I}$ comprising $K_I$ number of bits, each having a binary value $b_{1,k}^u \in \{0, 1\}$. This message frame is provided to an upper convolutional encoder 401, and a lower convolutional encoder 403, as shown in FIG. 4. The upper convolutional encoder 401 performs a convolutional encoding process such as the examples provided below to generate two $K_I$-bit encoded frames, namely a parity frame $b_2^u = [b_{2,k}^u]_{k=1}^{K_I}$ and a systematic frame $b_3^u = [b_{3,k}^u]_{k=1}^{K_I}$. Meanwhile, the message frame $b_1^u$ is interleaved, by an internal turbo encoding interleaver 404, in order to obtain the $K_I$-bit interleaved message frame $b_1^l = [b_{1,k}^l]_{k=1}^{K_I}$ which, as shown in FIG. 4 is provided to a lower convolutional encoder 403, which also applies a convolutional encoder to generate two more $K_I$-bit encoded frames, namely a parity frame $b_2^l = [b_{2,k}^l]_{k=1}^{K_I}$ and a systematic frame $b_3^l = [b_{3,k}^l]_{k=1}^{K_I}$, although the latter is not transmitted. Here, the superscripts 'u' and 'l' indicate relevance to the upper and lower convolutional encoders 401, 403, respectively. However, in the following, these superscripts are only used when necessary to explicitly distinguish between the two convolutional encoders 401, 403 of the turbo encoder and are omitted when the discussion applies equally to both. Note that the turbo encoder represents the $K_I$-bits of the message frame $b_1^u$ by transmitting three encoded frames, comprising a total of $3K_I$-bits and resulting in a turbo coding rate of $R = K_I/(3K_I) = 1/3$.

As explained above with reference to FIG. 2, following turbo encoding, the encoded frames may be modulated onto a wireless channel and transmitted to a receiver, such as the example provided in FIG. 3.

LTE Turbo Encoder

Figure 5:
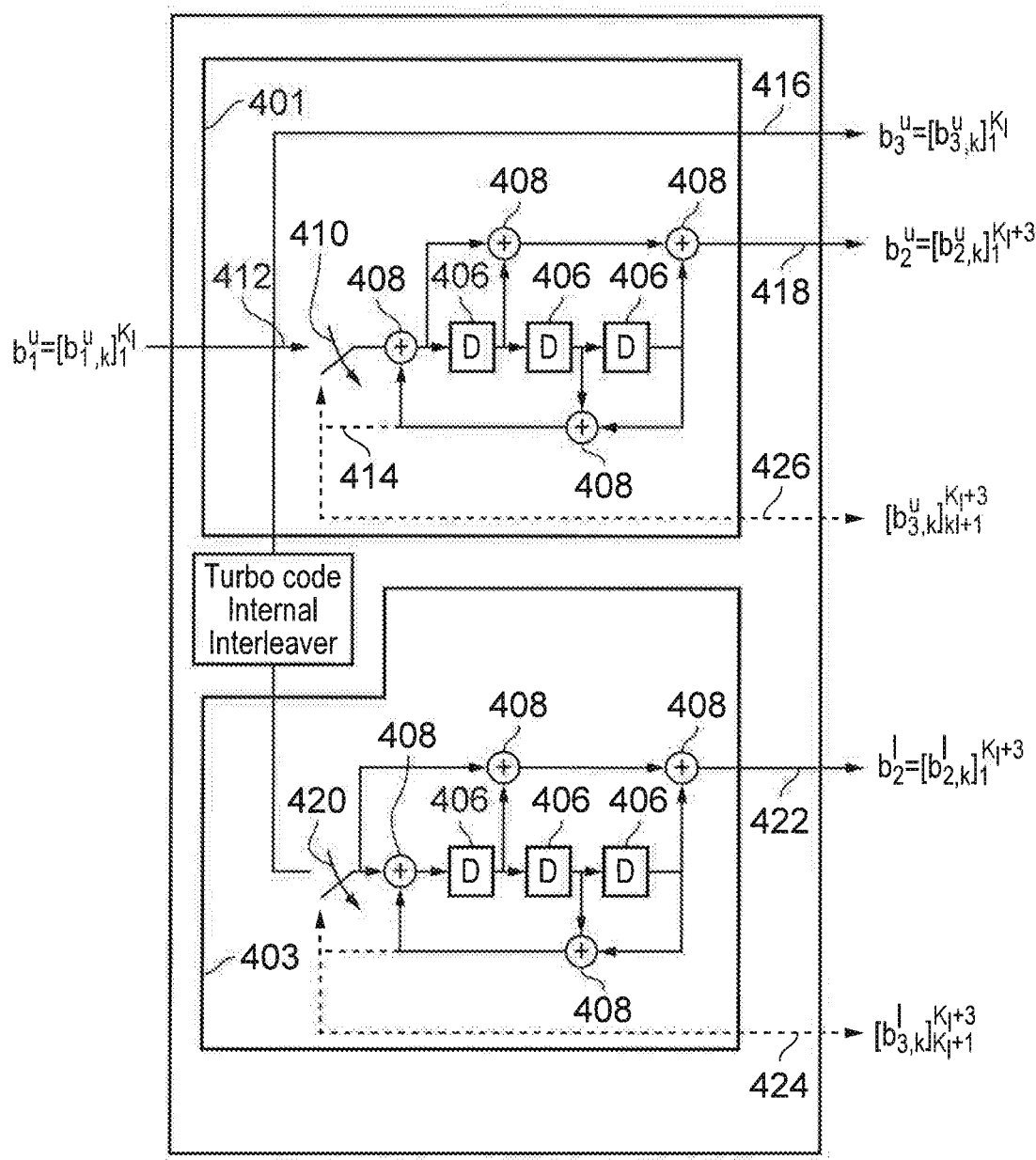
FIG. 5 is a schematic block diagram showing a more detailed example of an LTE turbo encoder.

A more specific illustration of the LTE turbo encoder [1] is provided in FIG. 5, which also illustrates the termination mechanism. For the example shown in FIG. 5 the turbo encoder is a 1/3 rate code in which data bits received from a data formatter 204 as shown in FIG. 2 are fed to an upper convolutional encoding processor 401. As can be seen in FIG. 5 the received $K_I$-bits of the message frame $b_1^u = [b_{1,k}^u]_{k=1}^{K_I}$ are also fed to a lower convolutional encoding processor 403 via a turbo code internal interleaver 404. In accordance with a known arrangement the $K_I$-bits of the message frame $b_1^u = [b_{1,k}^u]_{k=1}^{K_I}$ are fed to memory elements 406 which are connected to other memory elements 406 to form a shift register type arrangement. An output of the memory elements 406 is used to form an input to XOR units 408, which form at their output a bit from a logical XOR of their inputs, which forms either an encoded output bit or a bit which is fed back as an input to one of the memory elements 406. A switch in the upper convolutional encoder 410 switches the input bits between an input 412 and an output of the upper convolutional encoder 414 to form respectively, on a first output 416, a systematic frame $b_3^u = [b_{3,k}^u]_{k=1}^{K_I}$, and on a third output 426, three message termination bits $$[b_{3,k}^u]_{k=K_I+1}^{K_I+3}.$$

A second output 416 of the upper convolutional encoder 401 provides a parity frame $b_2^u = [b_{2,k}^u]_{k=1}^{K_I+3}$. In FIG. 5 the three message termination bits $$[b_{3,k}^u]_{k=K_I+1}^{K_I+3}$$

are used to terminate the upper convolutional encoder 401 in a known state, which is not shown in FIG. 4 for simplicity.

In the lower convolutional encoder 403 a switch 420 switches between the received bits from the internal interleaver 404 and corresponds to the switch 410 for the upper convolutional encoder. In a similar manner to the upper convolutional encoder, output channels 422, 424 of the lower convolutional encoder provide respectively a parity frame $b_2^l = [b_{2,k}^l]_{k=1}^{K_I+3}$ and three message termination bits $$[b_{3,k}^l]_{k=K_I+1}^{K_I+3}..$$

The systematic data bits of the lower convolutional encoder $b_3^l = [b_{3,k}^l]_{k=1}^{K_I}$ are not output from the lower convolutional encoder because these are already present on the first output 416. Accordingly, with the first output 416 providing the input bits as a systematic code the second and fourth outputs 418, 422 providing respective parity bits, the turbo encoder provides a 1/3 rate code. As with the upper convolutional encoder, three message termination bits $$[b_{3,k}^l]_{k=K_I+1}^{K_I+3}$$

are used to terminate the lower convolutional encoder 403 in a known state, which is not shown in FIG. 4 for simplicity.

In summary, the LTE turbo encoder [1] of FIG. 5 employs twelve additional termination bits to force each convolutional encoder into the final state $S_{K_I+3}=1$. More specifically, the upper convolutional encoder 401 generates the three message termination bits $b_{3,K_I+1}^u$, $b_{3,K_I+2}^u$, $b_{3,K_I+3}^u$ as well as the three parity termination bits frame $b_{2,K_I+1}^u$, $b_{2,K_I+2}^u$, $b_{2,K_I+3}^u$. The lower convolutional encoder 403 operates in a similar manner, generating corresponding sets of three message termination bits $b_{3,K_I+1}^l$, $b_{3,K_I+2}^l$, $b_{3,K_I+3}^l$ as well as the three parity termination bits $b_{2,K_I+1}^l$, $b_{2,K_I+2}^l$, $b_{2,K_I+3}^l$. In contrast to the systematic frame $b_3^u$ that is produced by the upper convolutional encoder, that of the lower convolutional encoder $b_3^l$ is not output by the LTE turbo encoder. Owing to this, the LTE turbo encoder uses a total of $(3K_I+12)$ bits to represent the $K_I$ bits of the message frame $b_1^u$, giving a more precise coding rate of $R=K_I/(3K_I+12)$.

Figure 6:
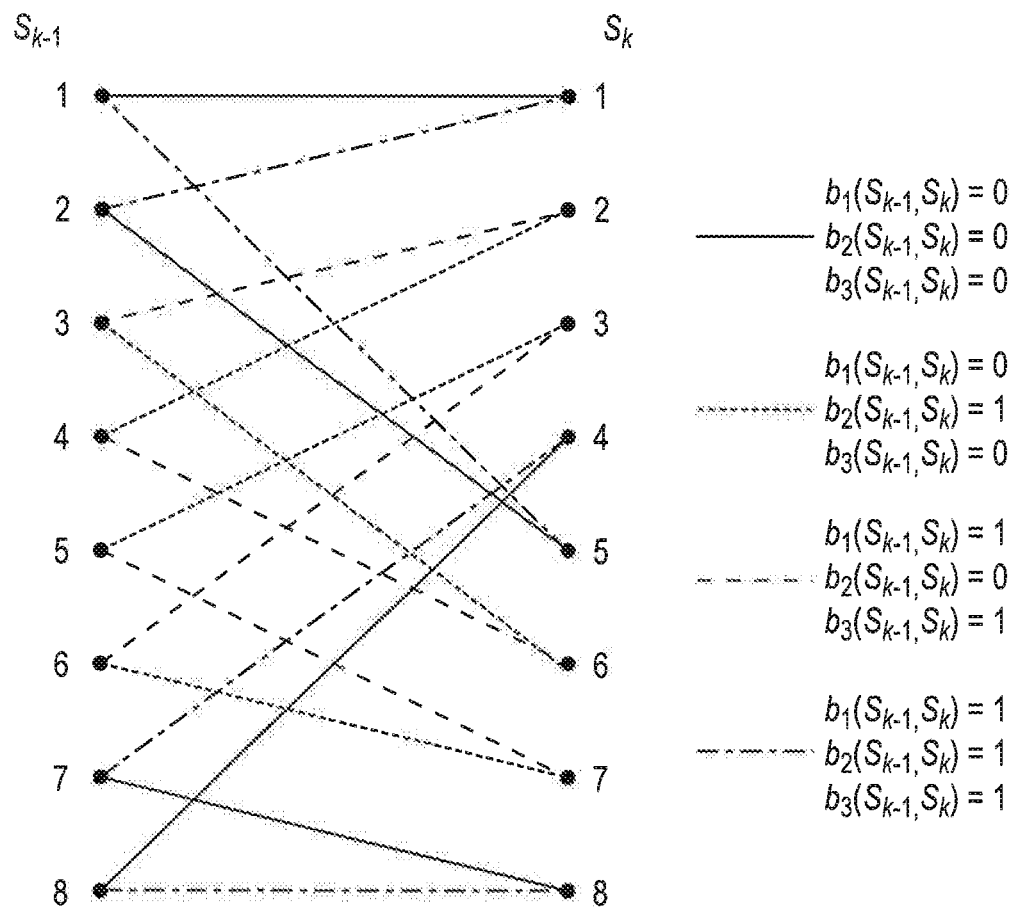
FIG. 6 is an illustration of state and state transitions representing encoding using a convolutional encoder forming part of the turbo encoder of FIG. 5.

The example of the turbo encoder presented in FIG. 5 provides upper and lower convolutional encoders 401, 403, which each have three memory elements 406. As will be known by those acquainted with convolutional encoders, the binary content of the memory elements 406 can be interpreted as a state, so that the convolutional encoding process can be synthesised as transitions through a trellis comprising the possible states of the convolutional encoder. As such, a convolutional encoder or a turbo encoder can be described as a Markov process and therefore represented as a trellis diagram. An example of state transition diagram for a convolutional encoder is shown in FIG. 6. The state transition diagram of FIG. 6 represents one stage of a trellis having M=8 states and K=2 transitions per state, and can therefore provide an example corresponding to the upper and lower convolutional encoders 401, 403, which operate in the same manner. For the upper convolutional encoder 401 begins from an initial state of $S_0=1$ and successively transitions into each subsequent state $S_k \in \{1, 2, \ldots, M\}$ by considering the corresponding message bit $b_{1,k}$. Since there are two possible values for the message bit $b_{1,k} \in \{0,1\}$ there are K=2 possible values for the state $S_k$ that can be reached by transitioning from the previous state $S_{k-1}$. In FIG. 6 for example, a previous state of $S_{k-1}=1$ implies that the subsequent state is selected from $S_k \in \{1, 5\}$. This example can also be expressed using the notation c(1, 1)=1 and c(1, 5)=1, where $c(S_{k-1}, S_k)=1$ indicates that it is possible for the convolutional encoder to transition from $S_{k-1}$ into $S_k$, whereas $c(S_{k-1}, S_k)=0$ indicates that this transition is impossible. Of the K=2 options, the value for the state $S_k$ is selected such that $b_1(S_{k-1}, S_k)=b_{1,k}$. For example, $S_{k-1}=1$ and $b_{1,k}=0$ gives $S_k=1$, while $S_{k-1}=1$ and $b_{1,k}=1$ gives $S_k=5$ in FIG. 6. In turn, binary values are selected for the corresponding bit in the parity frame $b_2$ and the systematic frame $b_3$, according to $b_{2,k}=b_2(S_{k-1}, S_k)$ and $b_{3,k}=b_3(S_{k-1}, S_k)$. In the example of FIG. 6, $S_{k-1}=1$ and $S_k=1$ gives $b_{2,k}=0$ and $b_{3,k}=0$, while $S_{k-1}=1$ and $S_k=5$ gives $b_{2,k}=1$ and $b_{3,k}=1$.

Examples of LTE Turbo Decoders

Figure 7:
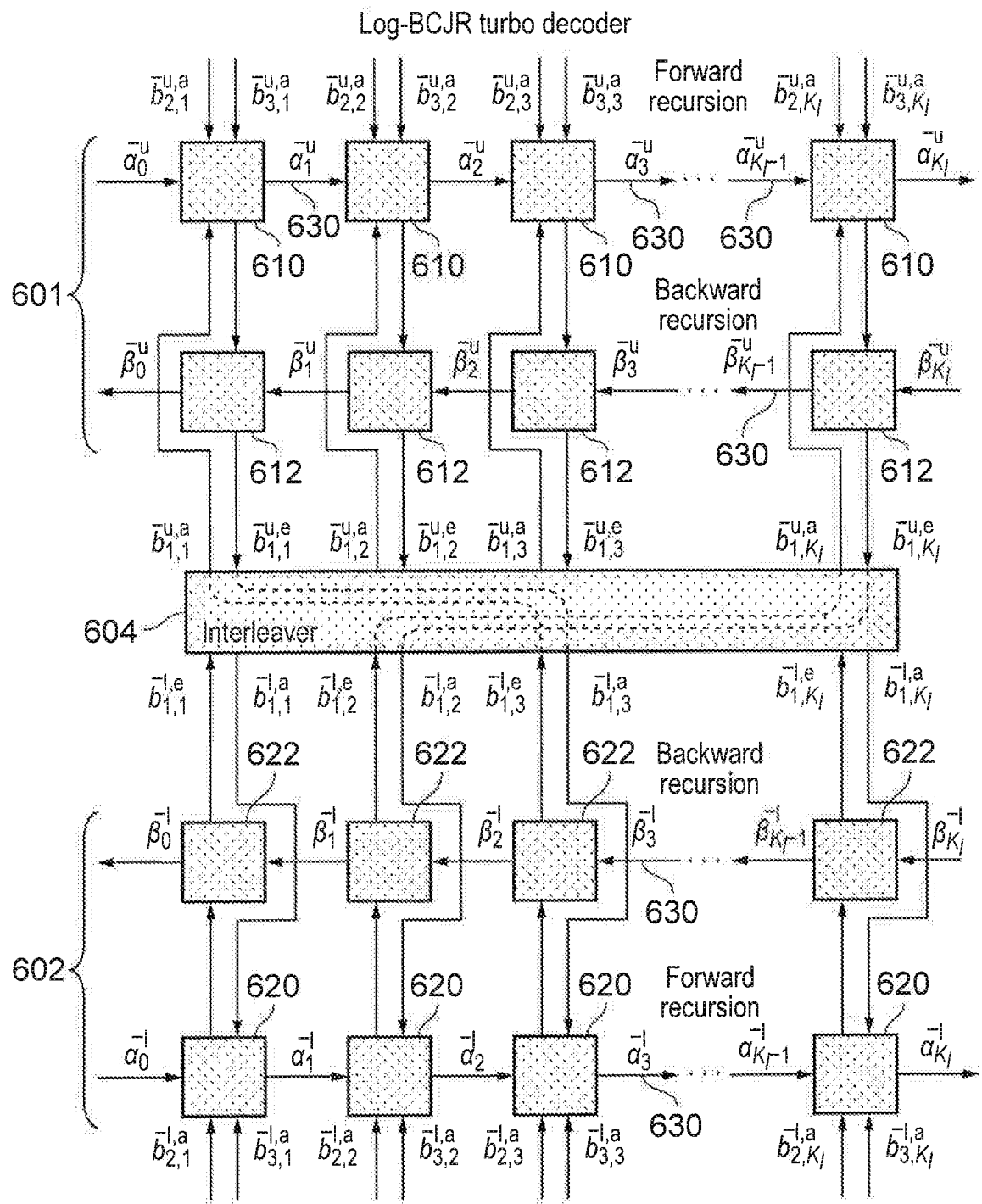
FIG. 7 is a schematic block diagram of an example turbo decoder according to a Log-BCJR algorithm.

Following their transmission over a wireless channel, the three encoded frames $b_2^u$, $b_3^u$ and $b_2^l$, generated by the turbo encoder as illustrated in FIG. 4, may be demodulated and provided to the turbo decoder of FIG. 7. However, owing to the effect of noise in the wireless channel, the demodulator will be uncertain of the bit values in these encoded frames. Therefore, instead of providing frames comprising $K_I$ hard-valued bits, the demodulator provides three frames each comprising $K_I$ soft-valued a priori Logarithmic Likelihood Ratios (LLRs) $\bar{b}_2^{u,a}=[\bar{b}_{2,k}^{u,a}]_{k=1}^{K_I}$, $\bar{b}_3^{u,a}=[\bar{b}_{3,k}^{u,a}]_{k=1}^{K_I}$, and $\bar{b}_2^{l,a}=[\bar{b}_{2,k}^{l,a}]_{k=1}^{K_I}$. Furthermore, a fourth frame $\bar{b}_3^{l,a}=[\bar{b}_{3,k}^{l,a}]_{k=1}^{K_I}$ may also be obtained by interleaving the LLRs of $\bar{b}_3^{u,a}$. Here, an LLR pertaining to bit $b_{j,k}$ is defined by $$\bar{b}_{j,k} = \ln \frac{Pr(b_{j,k}=1)}{Pr(b_{j,k}=0)},$$

where the superscripts 'a', 'e' or 'p' may be appended to indicate an a priori, extrinsic or a posteriori LLR, respectively.

The Log-BCJR algorithm generally forms a decoding or detection process which performs a forward recursion process and a backward recursion process through a trellis representing the connection of each of the states of a Markov process, such as a convolutional encoder. For the turbo encoded data, a decoder which performs a Log-BCJR decoding process comprises an upper decoder and a lower decoder. Each of the upper and lower decoders each perform a forward recursion process and a backward recursion process and generate for each iteration extrinsic LLRs which are fed to other of the upper and lower decoders.

FIG. 7 provides a schematic block diagram illustrating an example implementation of a simplified turbo decoder for the Log-BCJR algorithm, which corresponds to the simplified turbo encoder of FIG. 4. The Log-BCJR turbo decoder is operated iteratively, where each of the I iterations comprises the operation of all processing elements or algorithmic blocks shown.

Embodiments of the present technique can provide an arbitrary-parallel turbo decoder, which has an improved rate of decoding in comparison to conventional algorithms. Furthermore, in contrast to a fully-parallel turbo decoder such as that disclosed in our co-pending International patent application PCT/EP2015/067527 [26], an extent to which parallel processing of the turbo decoding is applied can be set in accordance with a number of processing elements (processing element) which are available rather than a number of stages in a trellis describing the encoder.

An LTE turbo decoder according to one example implementation for decoding a frame of data encoded by the encoder of FIG. 5 comprises an upper decoder and a lower decoder, together with an upper terminating element (TE) and a lower terminating element, as well as a CRC unit. The upper decoder is connected to the lower decoder using an interleaver, while the lower decoder is connected to the upper decoder using a deinterleaver. An LTE turbo decoder typically decodes one frame of bits at a time and typically supports all L=188 frame lengths $\{K_1,K_2,K_3,K,K_{188}\}=\{40, 48,56,K,6144\}$ and corresponding interleaver designs of the LTE standard [1]. In order to initiate the decoding of a frame having the length $K_I$ where $I \in [1,L]$, the upper decoder is provided with $K_I$ parity LLRs $[b_{2,k}^{u,a}]_{k=1}^{K_I}$ and $K_I$ systematic LLRs $[b_{3,k}^{u,a}]_{k=1}^{K_I}$. Meanwhile, the lower decoder is provided with $K_I$ parity LLRs $[b_{2,k}^{l,a}]_{k=1}^{K_I}$. Likewise, the upper terminating element is provided with six termination LLRs $$[b_{2,k}^{u,a}]_{k=K_I+1}^{K_I+3} \text{ and } [b_{3,k}^{u,a}]_{k=K_I+1}^{K_I+3},$$

while the lower terminating element is provided with six more termination LLRs $$[b_{2,k}^{l,a}]_{k=K_l+1}^{K_l+3} \text{ and } [b_{3,k}^{l,a}]_{k=K_l+1}^{K_l+3}.$$

The terminating elements are not shown in FIG. 7 for simplicity. An example of a conventional turbo decoder according to a BCJR algorithm as disclosed in our co-pending International patent application PCT/EP2015/067527 [26] is shown in FIG. 7. This will be only briefly described in the following paragraphs.

As shown in FIG. 7, a first set of $2K_l$ algorithmic blocks 601 are devoted to performing a first part of the turbo decoding algorithm on the turbo encoded data produced by an upper convolutional encoder 401. A first row of $K_l$ algorithmic blocks 610 of the upper decoder 601 are devoted to performing a forward recursion process through a trellis of possible states, whereas a second row of $K_l$ algorithmic blocks 612 are devoted to performing backward recursion through the trellis stages according to the Log-BCJR algorithm. Each algorithmic block corresponds to one of the $K_l$ stages in the trellis, which comprises a set of transitions between a set of previous states and a set of next states. A second set of $2K_l$ algorithmic blocks 602 are devoted to performing a second part of the turbo decoding algorithm on the turbo encoded data produced by the lower convolutional encoder 403. As for the upper decoder 601, the lower decoder includes a first row of $K_l$ algorithmic blocks 620 of the lower decoder 602, which are devoted to performing a forward recursion process through a trellis of possible states, whereas a second row of $K_l$ algorithmic blocks 622 are devoted to performing backward recursion through the trellis states according to the Log-BCJR algorithm.

The $k^{th}$ algorithmic block 610, of the $K_l$ algorithmic blocks 610 of the upper decoder 601 which are devoted to performing the forward recursion part of the Log-BCJR algorithm 610, is arranged to receive the $k^{th}$ LLR values $\bar{b}_{2,k}^{u,a}$, $\bar{b}_{3,k}^{u,a}$ from the demodulator which were estimated for the frames of encoded bits $b_2^u$, $b_3^u$, generated by the upper encoder 401. Correspondingly, the $k^{th}$ algorithmic block 620 of the $K_l$ algorithmic blocks 620 of the lower decoder 602, which are devoted to performing the forward recursion part of the Log-BCJR algorithm, is arranged to receive the $k^{th}$ LLR values $\bar{b}_{2,k}^{l,a}$, $\bar{b}_{3,k}^{l,a}$, from the demodulator which were estimated for the frames of encoded bits $b_2^l$, $b_3^l$, generated by the lower encoder 402. Here, the demodulator may obtain $b_3^l$ by interleaving $b_3^u$.

The $k^{th}$ algorithmic block 610, 620, which each in turn are arranged to perform the forward recursion, in the upper decoder 601 and the lower decoder 602, one after the other to combine the L=3 a priori LLRs $\bar{b}_{1,k}^a$, $\bar{b}_{2,k}^a$, and $\bar{b}_{3,k}^a$, in order to obtain an a priori metric $\bar{\gamma}_k(S_{k-1},S_k)$ for each transition in the state transition diagram (as illustrated for example in FIG. 6). Following this calculation, each of the $k^{th}$ algorithmic blocks 610, 620 performing the forward recursion, combines these a priori transition metrics with the a priori forward state metrics of $\bar{\alpha}_{k-1}(S_{k-1})$) in order to obtain the extrinsic forward state metrics of $\bar{\alpha}_k(S_k)$. These extrinsic state metrics are then passed to the $k+1^{th}$ algorithmic block 610, 620, to be employed as a priori state metrics in the next time period. However as will be appreciated by those familiar with the Log-BCJR algorithm the upper and lower decoders of the turbo decoder work alternately, so that when one is active the other is idle.

The $k^{th}$ algorithmic block 612, 622, which are performing the backward recursion, in the upper decoder 601 and the lower decoder 602 to combine the a priori metric $\bar{\gamma}_k(S_{k-1}, S_k)$ for each transition with the a priori backward state metrics $\bar{\beta}_k(S_k)$. This produces an extrinsic backward state metric $\bar{\beta}_{k-1}(S_{k-1})$, which may be passed to the k-1$^{th}$ algorithmic block, to be employed as a priori state metrics in the next time period. Furthermore, the $k^{th}$ algorithmic block 612, 622, which are performing the backward recursion, in the upper decoder 601 and the lower decoder 602 to obtain an a posteriori metric $\bar{\delta}_k(S_{k-1}, S_k)$ for each transition in the state transition diagram (as for example illustrated in FIG. 6). Finally, the $k^{th}$ algorithmic block 612, 622, which are performing the backward recursion, in the upper decoder 401 and the lower decoder combine the a posteriori metrics $\bar{\delta}_k(S_{k-1}, S_k)$ for the transitions in the state transition diagram to generate an extrinsic message LLR $\bar{b}_{j,k}^e$ for the $k^{th}$ bit. These LLR values are swapped between the upper and lower decoders 601, 602.

The upper decoder 601 and the lower decoder 602 exchange extrinsic LLRs for each of the data bits of the frame, which become an estimate of the systematic bits of the encoded data frame. More specifically, an interleaver 604 performs interleaving of the LLR values of data bits passed between an upper decoder 601 and the lower decoder 602, in accordance with the interleaving of the data bits which are used by the upper convolutional encoder 401 and the lower convolutional encoder 402 of a turbo encoder. Furthermore, the interleaver 604 performs deinterleaving of the LLR values of data bits passed between a lower decoder 602 and the upper decoder 601, to reverse the interleaving of the data bits which are used by the upper convolutional encoder 401 and the lower convolutional encoder 402 of a turbo encoder.

As will be appreciated from the above description, turbo decoding for turbo encoded data generally includes upper and lower decoders, which are operated throughout the decoding process. More specifically, the operation of the upper decoder updates the values of the $K_l$ a posteriori LLRs $[b_{1,k}^{u,p}]_{k=1}^{K_l}$ and the $K_l$ extrinsic LLRs $[b_{1,k}^{u,e}]_{k=1}^{K_l}$. These updates to the extrinsic LLRs are interleaved and provided to the lower decoder as the $K_l$ a priori LLRs $[b_{1,k}^{l,a}]_{k=1}^{K_l}$. More specifically, $b_{1,\Pi(k)}^{l,a}=k_{1,k}^{u,e}$, where the interleaving action is described by the vector $\Pi$, in which each of the $K_l$ elements $\Pi(k) \in [1,K_l]$ is unique. For example, the $K_l$=40-bit LTE interleaver may be described by the vector $\Pi$=[1, 38, 15, 12, 29, 26, 3, 40, 17, 14, 31, 28, 5, 2, 19, 16, 33, 30, 7, 4, 21, 18, 35, 32, 9, 6, 23, 20, 37, 34, 11, 8, 25, 22, 39, 36, 13, 10, 27, 24], where $b_{1,24}^{l,a}=b_{1,40}^{u,e}$. Likewise, the operation of the lower decoder updates the values of the $K_l$ extrinsic LLRs $[b_{1,k}^{l,e}]_{k=1}^{K_l}$, which are deinterleaved and provided to the upper decoder as the $K_l$ a priori LLRs $[b_{1,k}^{u,a}]_{k=1}^{K_l}$. More specifically, $b_{1,\Pi^{-1}(k)}^{u,a}=b_{1,k}^{l,e}$, where the deinterleaving action is described by the vector $\Pi^{-1}$, in which each of the $K_l$ elements $\Pi^{-1}(k) \in [1,K_l]$ is unique and obeys the relationship with the interleaver $\Pi^{-1}(\Pi(k))=k$. For example, the $K_l$=40-bit LTE deinterleaver may be described by the vector $\Pi^{-1}$=[1, 14, 7, 20, 13, 26, 19, 32, 25, 38, 31, 4, 37, 10, 3, 16, 9, 22, 15, 28, 21, 34, 27, 40, 33, 6, 39, 12, 5, 18, 11, 24, 17, 30, 23, 36, 29, 2, 35, 8], where $b_{1,40}^{u,a}=b_{1,24}^{l,e}$. Furthermore, the updates to the a posteriori LLRs $[b_{1,k}^{u,p}]_{k=1}^{K_l}$ are typically provided to a CRC unit. This halts the decoding process when the LTE CRC is satisfied by the decoded bits obtained using the hard decisions $b_{1,k}^{u,p}>0$. The decoded bits and the a posteriori LLRs are then output by the turbo decoder and the decoding of a next frame may commence.

Adaptation of Turbo Decoding Using Windows of Trellis Stages

In some implementations of the turbo decoder, which operate to perform the Log-BCJR algorithm, the parity, systematic, a priori, extrinsic and a posteriori LLRs can be grouped together during decoding into chains of consecutive windows, each comprising an equal number $W_I$ of LLRs of each type. Furthermore, the turbo decoding process is typically completed according to a periodic schedule, having a period of $C_I$ clock cycles. Typically, the value of $W_I$ and $C_I$ depends on the current frame length $K_I$. However, different turbo decoders adopt different windowing and different scheduling techniques, discussed in the following subsections.

First Example Windowing

In a first example [21], the LLRs are grouped into chains of P=8 consecutive windows, since this is the greatest common divisor of all L=188 supported values of the LTE frame length $K_I$. This ensures that all windows comprise an equal number $W_I=K_I/P$ of LLR of each type, regardless of the current frame length $K_I$. Accordingly, the design of [21] employs a chain of P=8 processing elements, each of which performs processing for a different one of the windows of the upper decoder, as well as for the corresponding window of the lower decoder. Thus each of the windows performs the processing for the calculations 610, 612, 620, 622 for the Log-BCJR algorithm. In this way, the LLRs having the index $k \in [1, K_I]$ are processed by the processing element having the index $p = \lceil k/W_I \rceil$. Note that the maximum window length is given by $W_{max} = \max_{I=1}^{L} W_I = K_{max}/P = 768$, where $K_{max} = \max_{I=1}^{L} K_I = 6144$ is the number of bits in the longest LTE frame length. The decoding process is completed according to a periodic schedule, where the period $C_I$ depends on the current frame length $K_I$, according to $C_I = 2W_I$. As the decoding process proceeds, a counter c repeatedly counts up to $C_I$.

The processing element having the index $p \in [1, P]$ operates on the basis of windows comprising $W_I$ parity, systematic, a priori, extrinsic and a posteriori LLRs. Here, the notation $k' \in [1, W_I]$ is used to index an LLR within the $p^{th}$ window, which may be converted to the index $k \in [1, K_I]$ within the frame according to $k = k' + (p-1)W_I$. At the start of the decoding process, the processing element having the index p is provided with the $W_I$ upper parity LLRs $[b_{2,k'}^{u,a}]_{k'=1}^{W_I}$, the $W_I$ lower parity LLRs $[b_{2,k'}^{l,a}]_{k'=1}^{W_I}$, and the $W_I$ upper systematic LLRs $[b_{3,k'}^{u,a}]_{k'=1}^{W_I}$. Throughout the decoding process, the $p^{th}$ processing element is continually provided with updates to the $W_I$ upper a priori LLRs $[b_{1,k'}^{u,a}]_{k'=1}^{W_I}$ and the $W_I$ lower a priori LLRs $[b_{1,k'}^{l,a}]_{k'=1}^{W_I}$. In response, this processing element continually updates the $W_I$ upper extrinsic LLRs $[b_{1,k'}^{u,e}]_{k'=1}^{W_I}$, the $W_I$ lower extrinsic LLRs $[b_{1,k'}^{l,e}]_{k'=1}^{W_I}$ and the $W_I$ upper a posteriori LLRs $[b_{1,k'}^{u,p}]_{k'=1}^{W_I}$, as discussed below.

Each of the processing elements performs the calculations for each window according to equations (1) to (4) below. Note that unlike the upper decoder, the lower decoder does not benefit from systematic LLRs, which is equivalent to having $b_{3,k}^a = 0$. This allows the corresponding terms to be omitted from (1)-(3) in the case of the lower decoder. Likewise, the lower decoder does not generate a posteriori LLRs, allowing (4) to be omitted entirely.

$$\beta_{k-1}(s_{k-1}) = \max_{\{s_k | c(s_{k-1}, s_k) = 1\}} [b_1(s_{k-1}, s_k) \cdot b_{1,k}^a + b_2(s_{k-1}, s_k) \cdot b_{2,k}^a + b_3(s_{k-1}, s_k) \cdot b_{3,k}^a + \beta_k(s_k)] \quad (1)$$

$$\alpha_k(s_k) = \max_{\{s_{k-1} | c(s_{k-1}, s_k) = 1\}} [b_1(s_{k-1}, s_k) \cdot b_{1,k}^a + b_2(s_{k-1}, s_k) \cdot b_{2,k}^a + b_3(s_{k-1}, s_k) \cdot b_{3,k}^a + \alpha_{k-1}(s_{k-1})] \quad (2)$$

$$b_{1,k}^e = 0.75 \left[ \max_{\{(s_{k-1}, s_k) | b_1(s_{k-1}, s_k) = 1\}} [\alpha_{k-1}(s_{k-1}) + \beta_k(s_k) + b_2(s_{k-1}, s_k) \cdot b_{2,k}^a] \right] - 0.75 \left[ \max_{\{(s_{k-1}, s_k) | b_1(s_{k-1}, s_k) = 0\}} [\alpha_{k-1}(s_{k-1}) + \beta_k(s_k) + b_2(s_{k-1}, s_k) \cdot b_{2,k}^a] \right] + b_{3,k}^a \quad (3)$$

$$b_{1,k}^p = 0.75 \left[ \max_{\{(s_{k-1}, s_k) | b_1(s_{k-1}, s_k) = 1\}} [\alpha_{k-1}(s_{k-1}) + \beta_k(s_k) + b_2(s_{k-1}, s_k) \cdot b_{2,k}^a] \right] - 0.75 \left[ \max_{\{(s_{k-1}, s_k) | b_1(s_{k-1}, s_k) = 0\}} [\alpha_{k-1}(s_{k-1}) + \beta_k(s_k) + b_2(s_{k-1}, s_k) \cdot b_{2,k}^a] \right] + b_{1,k}^a + b_{3,k}^a \quad (4)$$

Additionally, throughout the decoding process, the $(p-1)^{th}$ processing element in each decoder periodically provides the $p^{th}$ processing element with updates to the upper forward state metric vector $\alpha_{k'}^u = [\alpha_{k'}^u(s_{k'})]_{s_{k'}=1}^S$ and the lower forward state metric vector $\alpha_{k'}^l = [\alpha_{k'}^l(s_{k'})]_{s_{k'}=1}^S$ for the case where k'=0. However, an exception to this is made if p=1 and hence the $(p-1)^{th}$ processing element does not exist. In these cases, the $p^{th}$ processing element adopts $\alpha_0^u = \alpha_0^l = [0, -\infty, -\infty, -\infty, -\infty, -\infty, -\infty, -\infty]$. Likewise, the $(p+1)^{th}$ processing element in each decoder periodically provides the $p^{th}$ processing element with updates to the upper backward state metric vector $\beta_{k'}^u = [\beta_{k'}^u(s_{k'})]_{s_{k'}=1}^S$ and the lower backward state metric vector $\beta_{k'}^l = [\beta_{k'}^l(s_{k'})]_{s_{k'}=1}^S$ for the case where $k' = W_{I,p}$. However, an exception to this is made if p=P, in which case the backward state metric vector is provided by the corresponding terminating element. As described below, the $p^{th}$ processing element periodically updates the upper forward state metric vector $\alpha_{k'}^u$ and the lower forward state metric vector $\alpha_{k'}^l$ for $k' = W_{I,p}$, as well as the upper backward state metric vector $\beta_{k'}^u$ and the lower backward state metric vector $\beta_{k'}^l$ for k'=0, which are provided to the $(p+1)^{th}$ and $(p-1)^{th}$ processing element, respectively.

Figure 8:
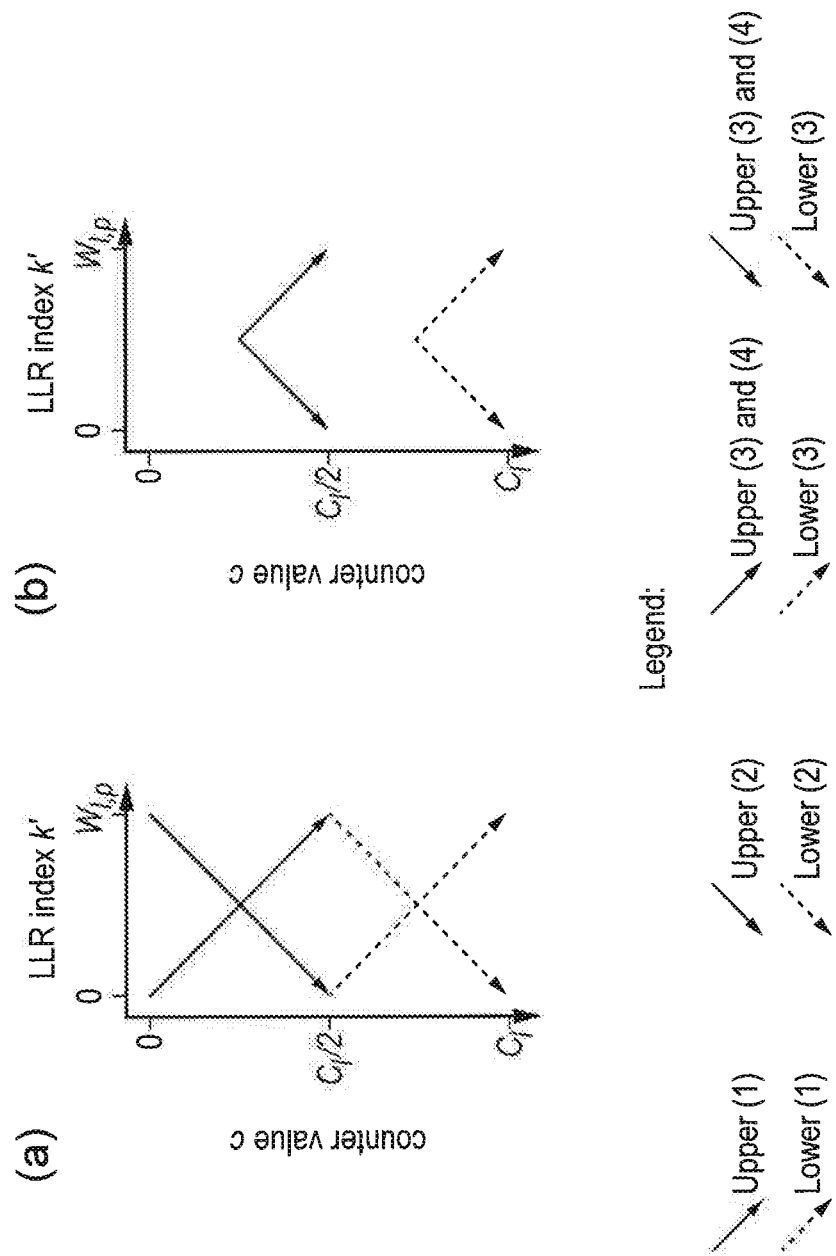
FIG. 8a is schematic representation illustrating graphically a scheduling of backward and forward recursions for a single processing element in each of the upper and lower decoder of a Log-BCJR turbo decoder and FIG. 8b is a corresponding diagram for the generation of log-likelihood ratios.

The processing elements are operated according to the schedule shown in FIG. 8. FIG. 8 provides a graphical representation showing how processing elements schedule (a) the backward and forward recursions of (1) and (2), as well as (b) the generation of the LLRs of (3) and (4) for a single processing element in the turbo decoder of the first windowing example. The processing element performs (1) to (4) for a window of the upper decoder, followed by (1) to (3) for the corresponding window of the lower decoder. Here, backward recursions are performed, in which decremental LLR indices k' are processed in successive clock cycles. Meanwhile, forward recursions are performed, in which incremental LLR indices k' are processed in successive clock cycles. During the first $C_I/2$ clock cycles in each period of $C_I$ clock cycles, the processing elements perform the forward and backward recursions of the upper decoder. Following this, the forward and backward recursions of the lower decoder are performed in the final $C_I/2$ clock cycles in each period of $C_I$ clock cycles, as shown in FIG. 8. Note that the following discussions apply equally to both the upper and lower decoder and so the superscripts 'u' and 'l' are removed from the notation.

The backward recursion operates on the basis of (1), in order to generate the backward state metric vector $\beta_{k'-1}$. This is stored in an internal memory in order to facilitate its use as $\beta_{k'}$ in the next step of the recursion, as well as for use in the calculation of the extrinsic and a posteriori LLR $b_{1,k'}^e$ and $b_{1,k'}^p$, as discussed below. Furthermore, the backward state metric vector $\beta_{k'-1}$ is stored in an output register in the case where k'=1, in order to provide $\beta_0$ to initialise the backward recursion in the neighbouring processing element. Likewise, the forward recursion operates on the basis of (2), in order to generate the forward state metric vector $\alpha_{k'}$. This is stored in an internal memory in order to facilitate its use as $\alpha_{k'-1}$ in the next step of the recursion, as well as for use in the calculation of the extrinsic and a posteriori LLR $b_{1,k'}^e$ and $b_{1,k'}^p$, as discussed below. Furthermore, the forward state metric vector $\alpha_{k'}$ is stored in an output register in the case where k'=$W_l$, in order to provide $\alpha_{W_l}$ to initialise the forward recursion in the neighbouring processing element.

As shown in FIG. 8, two a posteriori LLRs and two extrinsic LLRs are output by each processing element in each clock cycle of the second half of the recursions. More specifically, during each clock cycle of the second half of each recursion performed for the upper decoder, (4) is used to generate an a posteriori LLR $b_{1,k'}^{u,p}$, which is output by the processing element and provided to the CRC unit. Furthermore, during each clock cycle of the second half of each recursion performed for both the upper and lower decoders, (3) is used to generate an extrinsic LLR $b_{1,k'}^e$, which is output by the processing element and provided to the interleaver or deinterleaver, as appropriate. The interleaver and deinterleaver deliver the extrinsic LLRs to the appropriate processing elements, where they are stored in memory, ready to be used as a priori LLRs, as described above. Note that the LTE interleaver is specifically designed to be contention free when P is an integer divisor of $K_l$, which is true for all 188 possible values of $K_l$ when P=8. Owing to this, exactly two LLR are delivered to each processing element in each clock cycle of the second half of the recursions.

Second Example Windowing

A second example provided from [22] operates in a similar manner to that of the first example, but exploits the observation that different consecutive subsets of the supported LTE frame lengths have different greatest common divisors of 8, 16, 32 and 64. More specifically, depending on the frame length $K_l$, this design employs 8, 16, 32 or 64 windows, each comprising the same number $W_l$ of LLRs of each type, according to $$W_l = \begin{cases} K_l/8 & \text{if } K_l \in \{40, 48, 56, K, 504\} \\ K_l/16 & \text{if } K_l \in \{512, 528, 544, K, 1008\} \\ K_l/32 & \text{if } K_l \in \{1024, 1058, 1088, K, 2016\} \\ K_l/64 & \text{if } K_l \in \{2048, 2112, 2176, K, 6144\} \end{cases} \quad (5)$$

This design employs a chain of P=64 processing elements, although some of these are deactivated when decoding the shorter frame lengths. More specifically, the number of activated processing elements is equal to the number of windows employed, such that each processing element can perform processing for a different one of the windows of the upper decoder, as well as for the corresponding window of the lower decoder.

The processing of each window by a processing element is completed according to (6)-(9). Note that unlike the upper decoder, the lower decoder does not benefit from systematic LLRs, which is equivalent to having $b_{3,k}^a=0$. This allows the corresponding terms to be omitted from (6)-(8) in the case of the lower decoder. Likewise, the lower decoder does not generate a posteriori LLRs, allowing (9) to be omitted entirely.

$$\beta_{k-1}(s_{k-1}) = \max_{\{s_k | c(s_{k-1}, s_k)=1\}} [b_1(s_{k-1}, s_k) \cdot b_{1,k}^a + b_2(s_{k-1}, s_k) \cdot b_{2,k}^a + b_3(s_{k-1}, s_k) \cdot b_{3,k}^a + \beta_k(s_k)] - \max_{s_{k-1}=1}^S [\max_{\{s_k | c(s_{k-1}, s_k)=1\}} [b_1(s_{k-1}, s_k) \cdot b_{1,k}^a + b_2(s_{k-1}, s_k) \cdot b_{2,k}^a + b_3(s_{k-1}, s_k) \cdot b_{3,k}^a + \beta_k(s_k)]] \quad (6)$$

$$\alpha_k(s_k) = \max_{\{s_{k-1} | c(s_{k-1}, s_k)=1\}} [b_1(s_{k-1}, s_k) \cdot b_{1,k}^a + b_2(s_{k-1}, s_k) \cdot b_{2,k}^a + b_3(s_{k-1}, s_k) \cdot b_{3,k}^a + \alpha_{k-1}(s_{k-1})] - \max_{s_{k-1}=1}^S [\max_{\{s_{k-1} | c(s_{k-1}, s_k)=1\}} [b_1(s_{k-1}, s_k) \cdot b_{1,k}^a + b_2(s_{k-1}, s_k) \cdot b_{2,k}^a + b_3(s_{k-1}, s_k) \cdot b_{3,k}^a + \alpha_{k-1}(s_{k-1})]] \quad (7)$$

$$b_{1,k}^e = \quad (8)$$
$$0.75 \left[ \max_{\{(s_{k-1}, s_k) | b_1(s_{k-1}, s_k)=1\}} [\alpha_{k-1}(s_{k-1}) + \beta_k(s_k) + b_2(s_{k-1}, s_k) \cdot b_{2,k}^a] \right] - 0.75 \left[ \max_{\{(s_{k-1}, s_k) | b_1(s_{k-1}, s_k)=1\}} [\alpha_{k-1}(s_{k-1}) + \beta_k(s_k) + b_2(s_{k-1}, s_k) \cdot b_{2,k}^a] \right] + b_{3,k}^a$$

$$b_{1,k}^p = \quad (9)$$
$$0.75 \left[ \max_{\{(s_{k-1}, s_k) | b_1(s_{k-1}, s_k)=1\}} [\alpha_{k-1}(s_{k-1}) + \beta_k(s_k) + b_2(s_{k-1}, s_k) \cdot b_{2,k}^a] \right] - 0.75 \left[ \max_{\{(s_{k-1}, s_k) | b_1(s_{k-1}, s_k)=0\}} [\alpha_{k-1}(s_{k-1}) + \beta_k(s_k) + b_2(s_{k-1}, s_k) \cdot b_{2,k}^a] \right] + b_{1,k}^a + b_{3,k}^a$$

Another difference to the turbo decoder design of the first example is the computation of the backward and forward state metric vectors $\beta_{k'-1}$ and $\alpha_{k'}$ of (6) and (7), respectively. In successive clock cycles of the backward and forward recursions, these state metrics can grow without bound, which may cause overflow in fixed point implementations. The modulo normalisation approach of [23] exploits that observation that the absolute values of the state metrics in each vector are not important and that instead it is the differences between these state metrics that are important. This motivates the normalisation of the state metrics within each vector during its generation. In order to minimise the occurrence of overflow, normalisation is achieved by subtracting the maximum of the state metrics in each vector, as shown in (6) and (7).

Third Example Windowing

A third example is what is referred to as a "shuffled" turbo decoder [24] which operates in a similar manner to the turbo decoders of Examples 1 and 2, but employs one chain of P processing elements dedicated to performing the decoding of the upper decoder, as well as a second chain of P processing elements dedicated to performing the decoding of the lower decoder, where P is an integer divisor of $K_l$. Each processing element performs the processing for a different one of the windows in the corresponding decoder, where each window has the length $W_l=K_l/P$. In contrast to the turbo decoders of the first and second examples, the decoding process is completed according to a periodic schedule, where the period is given by $C_l=W_l$, rather than $C_l=2W_l$. More specifically, the backward and forward recursions of the upper decoder are performed concurrently with those of the lower decoder. The extrinsic LLRs generated by one decoder in a particular clock cycle of the schedule are immediately passed through the interleaver or deinterleaver to the other decoder, where they may be used as a priori LLRs in the next clock cycle of the schedule.

Fourth Example Fully-Parallel Turbo Decoder

A fully parallel turbo decoder (FPTD), such as that disclosed in our co-pending International patent application PCT/EP2015/067527 operates in a similar manner to the turbo decoder of first example, but employs $K_l$ number of windows, each having a length of $W_l=1$. Accordingly, the FPTD employs a chain of $P=K_l$ processing elements, each of which performs processing for a different one of the windows of the upper decoder, as well as for the corresponding window of the lower decoder. The FPTD decoding process is completed according to a periodic schedule, where the period is given by $C_l=2$. The processing of each window is completed according to (10)-(15) below. Note that (15) may be omitted entirely in the case of the lower decoder, since it does not generate a posteriori LLRs. Here, the superscript 'c' in (10) and (13) represents the clock cycle index, while the superscript 'c−1' in (11), (12), (14) and (15) represents the index of the previous clock cycle. This notation is included in order to emphasise that the transition metric vectors of (10) and the bit metric vectors of (13) are pipelined.

$$\gamma_k^c(s_{k-1}, s_k) = \qquad (10)$$
$$0.75 \cdot b_1(s_{k-1}, s_k) \cdot b_{1,k}^a + b_2(s_{k-1}, s_k) \cdot b_{2,k}^a + b_3(s_{k-1}, s_k) \cdot b_{3,k}^a$$

$$\beta_{k-1}(s_{k-1}) = \max_{\{s_k | c(s_{k-1},s_k)=1\}} [\gamma_k^{c-1}(s_{k-1}, s_k) + \beta_k(s_k)] - \qquad (11)$$
$$\max_{\{s_k | c(1,s_k)=1\}} [\gamma_k^{c-1}(1, s_k) + \beta_k(s_k)]$$

$$\alpha_k(s_k) = \max_{\{s_{k-1} | c(s_{k-1},s_k)=1\}} [\gamma_k^{c-1}(s_{k-1}, s_k) + \alpha_{k-1}(s_{k-1})] - \qquad (12)$$
$$\max_{\{s_{k-1} | c(s_{k-1},1)=1\}} [\gamma_k^{c-1}(s_{k-1}, 1) + \alpha_{k-1}(s_{k-1})]$$

$$\varepsilon_k^c(b'_{1,k}, b'_{2,k}) = \left[\max_{\substack{(s_{k-1},s_k) \\ b_1(s_{k-1},s_k)=b'_{1,k} \\ b_2(s_{k-1},s_k)=b'_{2,k}}} [\alpha_{k-1}(s_{k-1}) + \beta_k(s_k)] \right] \qquad (13)$$

$$b_{1,k}^e \left[ \max_{b'_{2,k} \in \{0,1\}} [\varepsilon_k^{c-1}(1, b'_{2,k}) + \qquad (14)\right.$$
$$\left. b'_{2,k} \cdot b_{2,k}^a] \right] - \left[ \max_{b'_{2,k} \in \{0,1\}} [\varepsilon_k^{c-1}(0, b'_{2,k}) + b'_{2,k} \cdot b_{2,k}^a] \right]$$

$$b_{1,k}^p \left[ \max_{b'_{2,k} \in \{0,1\}} [\varepsilon_k^{c-1}(1, b'_{2,k}) + b'_{2,k} \cdot b_{2,k}^a] \right] - \left[ \max_{b'_{2,k} \in \{0,1\}} [\varepsilon_k^{c-1}(0, b'_{2,k}) + \qquad (15)\right.$$
$$\left. b'_{2,k} \cdot b_{2,k}^a] \right] + b_{1,k}^a + b_{3,k}^a$$

Rather than performing all processing for the upper decoder in the first clock cycle of each period, before performing the processing for the lower decoder in the second clock cycle, the FPTD employs an odd-even schedule, which is motivated by the odd-even nature of the LTE interleaver. Furthermore, the FPTD employs a pipelining technique, in order to maximise the achievable clock frequency. More specifically, during the first clock cycle of each period, the processing elements having odd indices perform the processing of (10), (14) and (15) for the corresponding windows of the upper decoder, as well as the processing of (11), (12) and (13) for the corresponding windows of the lower decoder. Meanwhile, the processing elements having even indices perform the processing of (10) and (14) for the corresponding windows of the lower decoder, as well as the processing of (11), (12) and (13) for the corresponding windows of the upper decoder. In the second clock cycle of each period, the processing elements having even indices perform the processing of (10), (14) and (15) for the corresponding windows of the upper decoder, as well as the processing of (11), (12) and (13) for the corresponding windows of the lower decoder. Meanwhile, the processing elements having odd indices perform the processing of (10) and (14) for the corresponding windows of the lower decoder, as well as the processing of (11), (12) and (13) for the corresponding windows of the upper decoder. Note that the normalization technique used in the FPTD for (11) and (12) is different to that of the second example. More specifically, in order to remove the requirement to determine the maximum state metric in each vector, the approach of (11) and (12) is to always subtract the first state metric. Note also that the FPTD benefits from providing the lower decoder with the systematic LLRs $[b_{3,k}^{l,a}]_{k=1}^{K_l}$, which may be obtained by interleaving those of the upper decoder $[b_{3,k}^{u,a}]_{k=1}^{K_l}$.

Figure 9:
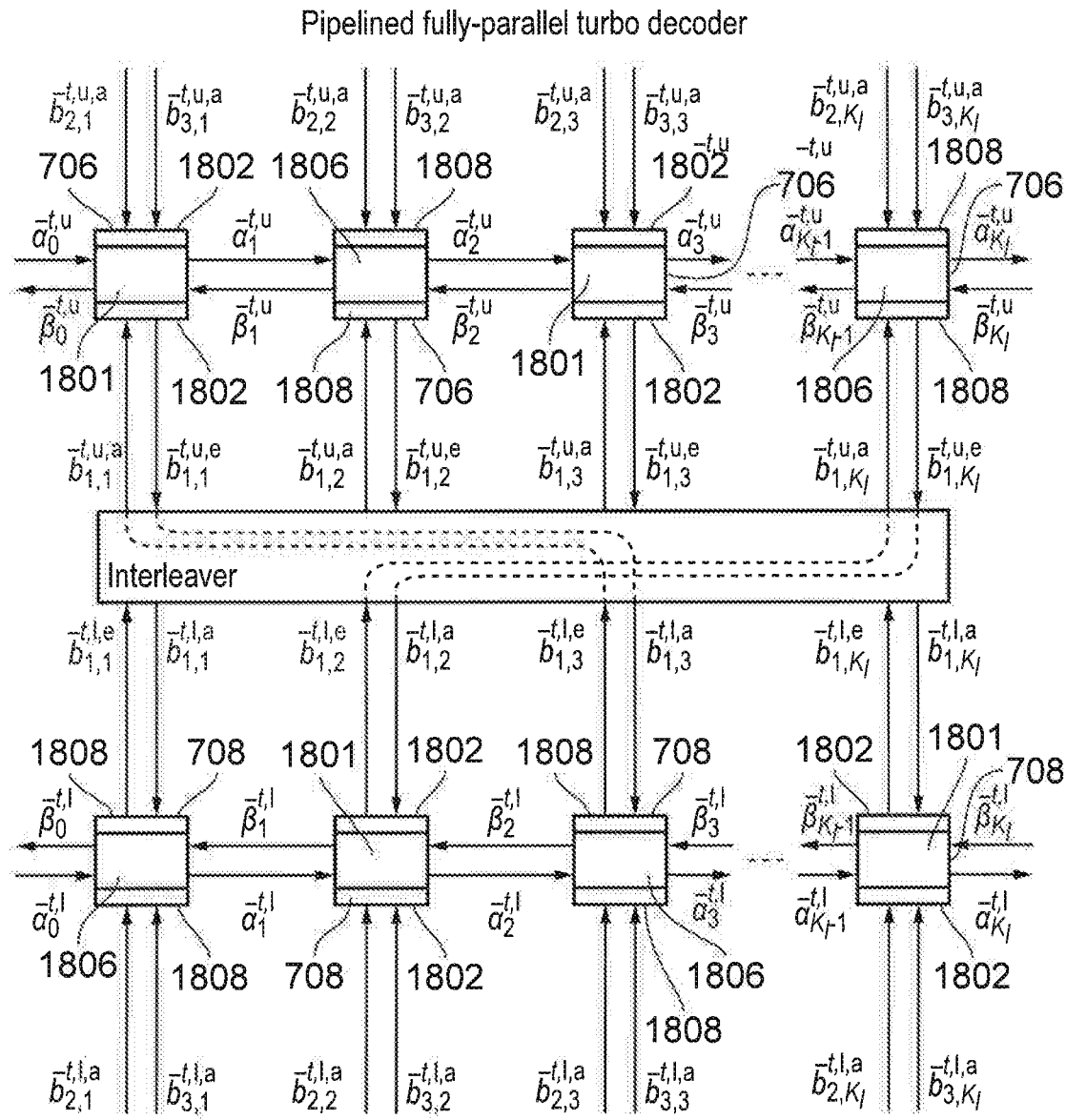
FIG. 9 is a schematic block diagram of a fully-parallel turbo decoder.

FIG. 9 provides an illustration of an FPTD as disclosed in PCT/EP2015/067527. In FIG. 9, the respective upper and lower turbo decoding parts 701, 702 correspond to the upper and lower turbo decoding parts of the Log-BCJR algorithm 601, 602, but are replaced with $K_l$ parallel algorithmic blocks 706, 708. Thus the upper decoder 701 is comprised of $K_l$ algorithmic blocks 706 whereas the lower decoder 702 is comprised of $K_l$ algorithmic blocks 708. As shown in FIG. 9 and in correspondence with the operation of the Log-BCJR algorithm, the demodulator in the receiver of FIG. 3, provides the a priori LLRs to the turbo decoder's $2K_l$ algorithmic blocks 708, 706, which as shown in FIG. 9 are arranged in two rows. More specifically, following their transmission over a wireless channel, the three encoded frames $b_2^u$, $b_3^u$ and $b_2^l$ are demodulated and provided to the turbo decoder of FIG. 9. The demodulator provides three frames each comprising $K_l$ soft-valued a priori Logarithmic Likelihood Ratios (LLRs) $\bar{b}_2^{u,a}=[\bar{b}_{2,k}^{u,a}]_{k=1}^{K_l}$, $\bar{b}_3^{u,a}=[\bar{b}_{3,k}^{u,a}]_{k=1}^{K_l}$, and $\bar{b}_2^{l,a}=[\bar{b}_{2,k}^{l,a}]_{k=1}^{K_l}$, while a fourth frame $\bar{b}_3^{l,a}=[\bar{b}_{3,k}^{l,a}]_{k=1}^{K_l}$ is obtained by interleaving $\bar{b}_3^{u,a}$. These are provided to the fully-parallel turbo decoder's $2K_l$ algorithmic blocks, with the a priori parity LLR $\bar{b}_{2,k}^{u,a}$ and the a priori systematic LLR $\bar{b}_{3,k}^{u,a}$ being provided to the $k^{th}$ algorithmic block 706 in the upper decoder 701 shown in FIG. 9. Furthermore, the interleaver 704 provides the $k^{th}$ algorithmic block in the upper decoder 701 with the a priori message LLR $\bar{b}_{1,k}^{u,a}$, as will be detailed below. Meanwhile, the $k^{th}$ algorithmic block in the lower decoder 702 is correspondingly provided with the a priori LLR values $\bar{b}_{1,k}^{l,a}$, $\bar{b}_{2,k}^{l,a}$ and $\bar{b}_{3,k}^{l,a}$. In addition to this, the $k^{th}$ algorithmic block 706, 708 in each of the upper and lower decoders 701, 702 is also provided with a vector of a priori forward state metrics $\bar{\alpha}_{k-1}=[\bar{\alpha}_{k-1}(S_{k-1})]_{S_{k-1}=1}^M$ and a vector of a priori backward state metrics $\bar{\beta}_k=[\bar{\beta}_k(S_k)]_{S_k=1}^M$, as will be detailed below. Unlike a conventional turbo decoder operating in accordance with the Log-BCJR algorithm described above with reference to FIG. 7, each of the algorithmic blocks 706, 708 of the upper and lower decoders 701, 702 operates in an identical manner to receive the soft decision a priori LLR values of $\bar{b}_2^{u,a}=[\bar{b}_{2,k}^{u,a}]_{k=1}^{K_l}$ and $\bar{b}_3^{u,a}=[\bar{b}_{3,k}^{u,a}]_{k=1}^{K_l}$ for the upper decoder 701, or $\bar{b}_2^{l,a}=[\bar{b}_{2,k}^{l,a}]_{k=1}^{K_l}$ and $\bar{b}_3^{l,a}=[\bar{b}_{3,k}^{l,a}]_{k=1}^{K_l}$ for the lower decoder 702, corresponding to one or more data symbols associated with the trellis stage and to receive a priori forward state metrics $\bar{\alpha}_{k-1}$ from one neighbouring algorithmic block, to receive a priori backward state metrics $\bar{\beta}_k$ from a second neighbouring algorithmic block and to receive a priori LLR value $\bar{b}_{1,k}^a$ for the data symbol being detected for the trellis stage associated with the $k^{th}$ algorithmic block from the second detection processor. Each algorithmic block performs calculations associated with one trellis stage, comprising a set of transitions between a set of previous states and a set of next states. Each algorithmic block is configured to combine the a priori forward state metrics $\overline{\alpha}_{k-1}=[\alpha_{k-1}(S_{k-1})]_{S_{k-1}=1}^{M}$, the a priori backward state metrics $\overline{\beta}_{k}=[\beta_{k}(S_{k})]_{S_{k}=1}^{M}$ and the a priori LLR value $\overline{b}_{1,k}^{a}$ relating to the data symbol, according to equations (10) to (15).

Example Embodiment of an Arbitrarily Parallel Turbo Decoder

As explained above, the FPTD as disclosed in PCT/EP2015/067527 provides an arrangement for performing parallel processing for turbo decoding which removes the dependency between processing elements which allows each processing element to perform the calculations corresponding to each trellis stage in parallel, with increased throughput. Effectively therefore the window size is one as explained above. However the FPTD suffers a perceived disadvantage in that the algorithm and calculations for performing the turbo decoding using the FPTD require that each of the symbols in the frame providing an LLR value at the decoder is represented by a processing element. For the example of an LTE frame, the number of required processors would be $K_{188}=6144$, since this is the longest supported frame length. This can be perceived as a disadvantage because only a limited subset of these processors can be exploited for shorter frame lengths, leading to reduced hardware utility. Accordingly it would be desirable to find an arrangement in which turbo decoding can be achieved with an arbitrary number of processing elements, allowing a desirable tradeoff between throughput and hardware utility to be struck. Such an arrangement is referred to in the following paragraphs as an arbitrarily parallel turbo decoder. According to embodiments of the present technique therefore an arbitrary parallel turbo decoder (APTD) is arranged to perform further decoding using parallel processing using an arbitrary number of processing elements. To this end each processing element represents the calculation of the variables used in the processing algorithm for a plurality of LLR values corresponding to the plurality of the symbols in the transmitted frame so that the number of processing elements can be reduced. However in order to provide the arbitrary parallel turbo decoder, it is necessary to adapt the interleaving of the symbols between the upper and lower decoders because each of the processing elements is performing calculations for a plurality of frame lengths. As a result, a configurable network is referred to as a Benes network is provided which is scheduled in order to provide an optimum switching of symbols between the upper and lower decoders which as far as possible prevents conflict or wait cycles in which one or more of the processing elements is idle. A better appreciation of embodiments of the present technique will be described in the following paragraphs. Embodiments of the present technique can provide a turbo decoder circuit for performing a turbo decoding process to recover a frame of data symbols from a received signal comprising either parity and systematic soft decision values (LLR values) for each data symbols of the frame, for an example in which the data symbols of the frame have been encoded with a turbo encoder using a systematic code or parity soft decision values for each data symbol of the frame for an example in which the data symbols of the frame have been encoded with a turbo encoder using a non-systematic code. The frame represented by the received signal may therefore have been encoded with a systematic or non-systematic code. The turbo decoder circuit recovers data symbols of the frame, which have been encoded with a turbo encoder comprising upper and lower convolutional encoders which can each be represented by a trellis, and an interleaver which interleaves the encoded data between the upper and lower convolutional encoders. The turbo decoder circuit comprises a clock, configurable network circuitry configured to interleave soft decision values, an upper decoder and a lower decoder.

The upper decoder comprises a plurality of upper processing elements associated with the upper convolutional encoder, each of the processing elements of the upper decoder being configured, during a series of consecutive clock cycles, iteratively to receive, from the configurable network circuitry, a priori soft decision values (a priori LLRs) pertaining to data symbols associated with a window of an integer number of consecutive trellis stages representing possible paths between states of the upper convolutional encoder, to perform parallel calculations associated with the window using the a priori soft decision values in order to generate corresponding extrinsic soft decision values pertaining to the data symbols. The series of consecutive clock cycles is a number of clock cycles required to perform the entire decoding process to recover the data symbols of the frame for a number of iterations of the turbo decoding process. The processing elements of the upper decoder then provide the extrinsic soft decision values to the configurable network circuitry. At least one of the processing elements of the upper decoder is configured to perform the calculations for a window associated with a different number of the trellis stages to at least one other of the processing elements of the upper decoder. This is because, for example, the number of trellis stages corresponding to possible paths between states of the upper convolutional encoder may not be an integer factor of the number of processing elements.

The lower decoder comprises a plurality of lower processing elements associated with the lower convolutional encoder, each of the processing elements of the lower decoder being configured, during the series of the consecutive clock cycles, iteratively to receive, from the configurable network circuitry, a priori soft decision values pertaining to data symbols associated with a window of an integer number of consecutive trellis stages representing possible paths between states of the lower convolutional encoder, to perform parallel calculations associated with the window using the a priori soft decision values in order to generate corresponding extrinsic soft decision values pertaining to the data symbols. Each of the processing elements then provide the extrinsic soft decision values to the configurable network circuitry. At least one of the processing elements of the lower decoder is configured to perform the calculations for a window associated with a different number of the trellis stages to at least one other of the processing elements of the lower decoder.

The configurable network circuitry includes network controller circuitry which controls a configuration of the configurable network circuitry iteratively, during the consecutive clock cycles, to provide the a priori soft decision values for the upper decoder by interleaving the extrinsic soft decision values provided by the lower decoder, and to provide the a priori soft decision values for the lower decoder by interleaving the extrinsic soft decision values provided by the upper decoder. The interleaving performed by the configurable network circuitry controlled by the network controller is in accordance with a predetermined schedule, which provides the a priori soft decision values at different cycles of the one or more consecutive clock cycles to avoid contention between different a priori soft decision values being provided to the same processing element of the upper or the lower decoder during the same clock cycle.

According to example embodiments of the present technique therefore, each of the processing elements of the upper decoder and the lower decoder perform calculations associated with its window of the trellis. This means that each of the processing elements is performing the calculations associated with the forward and backward recursions of the turbo decoding for a section of the trellis associated with and corresponding to a section of the data symbols of the frame. As a result of the arbitrarily parallel processing of the turbo decoder, the processing elements can divide up the trellis of the upper decoder without restriction on the mapping of the window size to the processing elements although a greater decoding rate can be achieved by sharing the window sizes of the trellis stages between the available processing elements as much as possible. This also means that the size of the frame can vary independently of the number of processing elements available to perform the turbo decoding, so that the window sizes formed by partitioning the trellis can be configured dynamically.

Embodiments of the present technique can achieve this arbitrarily parallel decoding by arranging the configurable network to provide the a priori soft decision values for the upper decoder to the lower decoder and from the lower decoder to the upper decoder in a way which both matches the interleaving performed at the encoder, but also avoids contention between different a priori soft decision values being provided to the same processing element of the upper or the lower decoder during the same clock cycle, because the processing element is performing calculations for a widow comprising more than one stage of the trellis. This is achieved by the predetermined schedule which arranges for one or more of the a priori soft decision values from the upper decoder or the lower decoder in at least one of the clock cycles to be, for example, delayed by one or more clock cycles or skipped in that the a priori soft decision value is not delivered. The processing element which would have received the a priori soft decision value without delaying or skipping continues with the forward and backward recursion of the calculation performed by that processing element using a previous version of this a priori soft decision value received in a previous iteration.

In some example embodiments, in order to communicate the extrinsic soft decision values from the upper decoder to become the a priori soft decision values for the lower decoder and the extrinsic soft decision values from the lower decoder to become the a priori soft decision values for the upper decoder, the configurable network circuitry may include a memory or a plurality of memories which are used to store the extrinsic soft decision values before communication via the configurable network circuitry or the a priori soft decision values after communication. The memory can therefore also combine with the configuration of the configurable network circuitry according to the predetermined schedule to maintain a priori soft decision values which are not updated (over written) if these are skipped to avoid contention. Thus a memory location which stores the a priori soft decision values for an iteration of the turbo decoding process over one or more clock cycles to perform calculations for the window of the trellis may reuse the same a priori soft decision value which is maintained at a particular memory location for that processing element may be re-used to avoid contention. As for the example of FPTD [26] this compromise may result in a reduction in accuracy but overall the processing of the turbo decoder may produce a faster result of an estimate of the frame of data symbols.

Each of the processing elements may be performing calculations according to forward and backward scheduling for an integer number of trellis stages, which output extrinsic soft decision values which become a priori soft decision values for the other of the lower or upper decoders. The scheduling of the interleaver is therefore determined with respect to the calculations and therefore the extrinsic soft decision values produced and delivered to the other of the upper and lower decoders, which is scheduled to avoid any contention at the expense of introducing delay in the delivery through the interleaver or deleting some of the soft decision values and the schedule is designed to reduce these contentions. The design of the predetermined schedule is to reduce the delay and the deletions. The effect of delay may be for the processing element to continue calculation of the forward and backward recursions without the most up to date/most current extrinsic/a priori soft decision values, because the most update version cannot be delivered as a result of the contention. In some examples the soft decision values may be delivered earlier than required, but with the aim of reducing a number of missed opportunities for using the extrinsic soft decision values. The processing elements use the a priori soft decision value it had in the previous iteration, or if it's the first iteration it sets this to zero.

In some example embodiments the calculations performed by one or more of the processing elements according to the window of the trellis may be formed from different sub-periods comprising one or more of the clock cycles in which the calculations and processing is performed according to sub-windows, for example two sub-windows which comprise the trellis states of the window. In some examples, the processing of each window is constrained to a sub-window comprising the either the first half rounding up of the trellis stages or the last half rounding up of the trellis stages. Within these sub-periods and sub-windows, a forward and backward recursion is completed and then the beginning of a forward and backward recursion is performed if the number of clock cycles in the sub-period is greater than the number of trellis stages in the sub-window.

In some examples, as part of the calculations performed by the processing elements to perform the turbo decoding process the extrinsic soft decision values are generated from one of the forward or backward state metrics the other being loaded from memory.

Figure 10:
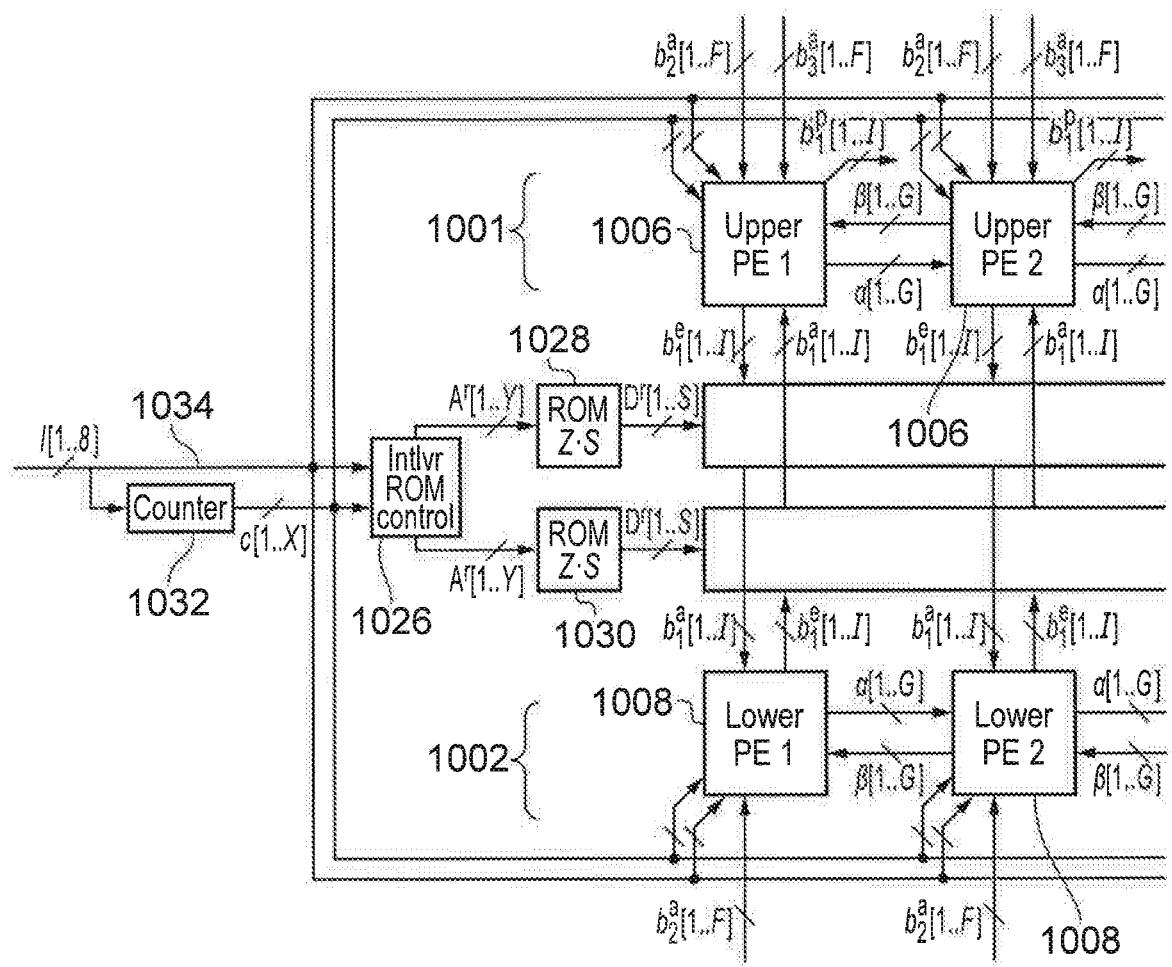
FIG. 10 is a schematic block diagram of an arbitrarily parallel turbo decoder in accordance with an example embodiment of the present technique.
Figure 10:
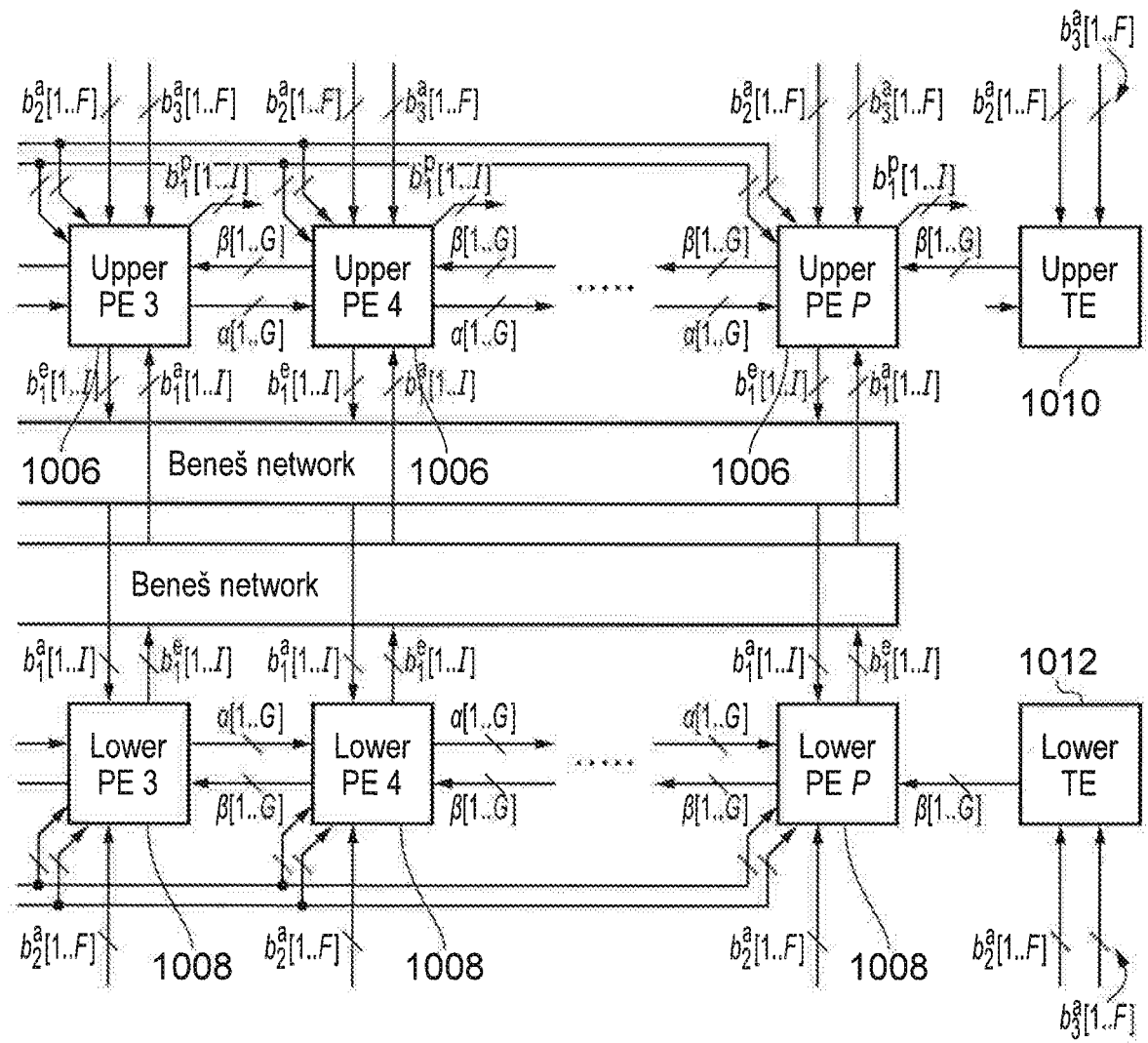

FIG. 10 provides a schematic block diagram of an arbitrarily parallel turbo decoder (APTD). As shown in FIG. 10 and in correspondence with the reference numerals shown in FIGS. 7 and 9, the APTD employs an upper 1001 and a lower decoder 1002, each comprising a chain of P processing elements, where the number P may be chosen arbitrarily, such as P=64. Each of the upper and lower decoders includes upper processing elements 1006 and lower processing elements 1008 which respectively perform calculation of the forward and backward recursions corresponding to the upper convolutional encoder and the lower convolutional decoder. A final element in each of the processing sets for the upper and lower decoders 1001, 1002 is a terminating element 1010, 1012.

As will be explained in the following paragraphs, each of the upper and lower processing elements 1006, 1008 performs calculations to implement the APTD. However in order to accommodate an arrangement in which each of the upper and lower processing elements 1006, 1008 performs calculations for a plurality of frame lengths, the APTD includes a configurable interleaver 1020 to connect the processing elements 1006 in the upper decoder 1001 to the processing elements 1008 in the lower decoder 1002, as well as a deinterleaver to connect each processing element 1008 in the lower decoder 1002 to each of the processing elements 1006 in the upper decoder 1001. The interleaver and deinterleaver are each formed of a Beneš network comprising $S=S(P)=2\lfloor P/2\rfloor+S(\lceil P/2\rceil)+S(\lfloor P/2\rfloor)$ crossbar switches, where $S(1)=0$ and $S(2)=1$ [25]. For example, $S=352$ when $P=64$.

The configurable interleaver is formed from two Beneš networks 1022, 1024 which are controlled by an interleaver ROM controller 1026 in combination with two read only memories 1028, 1030. The interleaver ROM controller 1026 is driven by a counter 1032 and a control line to control the Beneš network switching of the soft decision values produced by the upper and lower sets of processing elements 1001, 1002 so that these are made available to each of the processing elements at a time which can optimise the decoding of the frame in accordance with the present decoding technique. Finally, the APTD includes a CRC unit, as well as an upper and a lower terminating element, as shown in FIG. 10.

The APTD may be used to decode one frame of bits at a time, supporting all $L=188$ frame lengths $\{K_1,K_2,K_3,K,K_{188}\}=\{40,48,56,K,6144\}$ and corresponding interleaver designs of the LTE turbo code [1]. In order to initiate the decoding of a frame, the index $l\in[1,L]$ of its length $K_l$ is input to the APTD using $\lceil\log_2(L)\rceil=8$ bits, as shown by 1034 in FIG. 10. At the same time, the upper decoder is provided with $K_l$ parity LLRs $[b_{2,k}^{u,a}]_{k=1}^{K_l}$ and $K_l$ systematic LLRs $[b_{3,k}^{u,a}]_{k=1}^{K_l}$. Meanwhile, the lower decoder is provided with $K_l$ parity LLRs $[b_{2,k}^{l,a}]_{k=1}^{K_l}$. Likewise, the upper terminating element is provided with six termination LLRs $$[b_{2,k}^{u,a}]_{k=K_l+1}^{K_l+3} \text{ and } [b_{3,k}^{u,a}]_{k=K_l+1}^{K_l+3},$$

while the lower terminating element is provided with six more termination LLRs $$[b_{2,k}^{l,a}]_{k=K_l+1}^{K_l+3} \text{ and } [b_{3,k}^{l,a}]_{k=K_l+1}^{K_l+3}.$$

The terminating elements are operated only once at the start of the decoding process. By contrast, the processing elements of the upper and lower decoders are operated continually throughout the decoding process. More specifically, the upper decoder continually updates the values of the $K_l$ a posteriori LLRs $[b_{1,k}^{u,p}]_{k=1}^{K_l}$, and the $K_l$ extrinsic LLRs $[b_{1,k}^{u,e}]_{k=1}^{K_l}$. These updates to the extrinsic LLRs are continually interleaved by the first Beneš network and provided to the lower decoder as the $K_l$ a priori LLRs $[b_{1,k}^{l,a}]_{k=1}^{K_l}$, as shown in FIG. 10. More specifically, $b_{1,\Pi(k)}^{l,a}=b_{1,k}^{u,e}$, where the interleaving action is described by the vector $\Pi$, in which each of the $K_l$ elements $\Pi(k)\in[1,K_l]$ is unique, as exemplified in the above explanation for the $K_l=40$-bit LTE interleaver, which may be described by the vector $\Pi=[1, 38, 15, 12, 29, 26, 3, 40, 17, 14, 31, 28, 5, 2, 19, 16, 33, 30, 7, 4, 21, 18, 35, 32, 9, 6, 23, 20, 37, 34, 11, 8, 25, 22, 39, 36, 13, 10, 27, 24]$, where $b_{1,24}^{l,a}=b_{1,40}^{u,e}$. At the same time, the lower decoder continually updates the values of the $K_l$ extrinsic LLRs $[b_{1,k}^{l,e}]_{k=1}^{K_l}$, which are deinterleaved by the second Beneš network and provided to the upper decoder as the $K_l$ a priori LLRs $[b_{1,k}^{u,a}]_{k=1}^{K_l}$. More specifically, $b_{1,\Pi^{-1}(k)}^{u,a}=b_{1,k}^{l,e}$, where the deinterleaving action is described by the vector $\Pi^{-1}$, in which each of the $K_l$ elements $\Pi^{-1}(k)\in[1,K_l]$ is unique and obeys the relationship with the interleaver $\Pi^{-1}(\Pi(k))=k$. Meanwhile, the updates to the a posteriori LLRs $[b_{1,k}^{u,p}]_{k=1}^{K_l}$ are continually provided to the CRC unit. This halts the decoding process as soon as the LTE CRC is satisfied by the decoded bits obtained using the hard decisions $b_{1,k}^{u,p}>0$. The decoded bits and the a posteriori LLRs are then output by the APTD and the decoding of a next frame may commence.

During the decoding process, the parity, systematic, a priori, extrinsic and a posteriori LLRs are grouped into chains of consecutive windows, each of which is processed by a consecutive processing element in the corresponding upper or lower decoder. More specifically, for short frames having lengths of $K_l\leq 2P$, the first $(P-K_l/2)$ processing elements in each decoder are deactivated, while the remaining $K_l/2$ consecutive processing elements process consecutive windows, each comprising two LLRs of each type. Accordingly, the number of LLRs of each type processed by the processing element having the index $p\in[1,P]$ is given by $$W_{l,p} = \begin{cases} 0 & \text{if } p \leq P - K_l/2 \\ 2 & \text{otherwise} \end{cases} \quad (16)$$

Equivalently, the LLRs having the index $k\in[1,K_l]$ are processed by the processing element in the corresponding decoder having the index $p=\lceil k/2\rceil+P-K_l/2$. By contrast, for longer frames having lengths of $K_l>2P$, the number of LLRs of each type processed by the processing element having the index $p\in[1,P]$ is given by $$W_{l,p} = \begin{cases} \lfloor K_l/P\rfloor & \text{if } p \leq P - \text{mod}(K_l, P) \\ \lceil K_l/P\rceil & \text{otherwise} \end{cases} \quad (17)$$

Accordingly, the LLRs having the index $k\in[1,K_l]$ are processed by the processing element in the corresponding decoder having the index $$p = \begin{cases} \lceil k/\lfloor K_l/P\rfloor\rceil & \text{if } k \leq k_{edge} \\ \lceil(k-k_{edge})/\lceil K_l/P\rceil\rceil + k_{edge}/\lfloor K_l/P\rfloor & \text{otherwise} \end{cases}, \quad (18)$$

where $k_{edge}=[P-\text{mod}(K_l,P)]\cdot\lfloor K_l/P\rfloor$ is the index of the last LLR that belongs to a window having the length $\lfloor K_l/P\rfloor$. In this way, all $[P-\text{mod}(K_l,P)]\cdot\lfloor K_l/P\rfloor+\text{mod}(K_l,P)\cdot\lceil K_l/P\rceil=K_l$ LLRs of each type are processed by the P processing elements in the corresponding decoder. Note that the maximum window length is given by $W_{max}=\max_{l=1}^L\max_{p=1}^P W_{l,p}=\lceil K_{max}/P\rceil$, which occurs when decoding a frame having the longest LTE frame length of $K_{max}=\max_{l=1}^L K_l=6144$ bits. For example $W_{max}=96$ when $P=64$.

The APTD decoding process is completed according to a periodic schedule, where the period $C_l$ depends on the current frame length $K_l$, according to $$C_l = \begin{cases} 2 & \text{if } K_l \leq 2P \\ K_l/P & \text{if mod}(K_l, P) = 0 \\ \lceil K_l/P\rceil + D_l & \text{otherwise} \end{cases} \quad (19)$$

where $D_l$ is a non-negative integer that may be separately chosen for each frame length $K_l$, in order to control the trade off between error correction capability and the throughput of the APTD. For example, $D_l=2$ may be chosen for $K_l=2016$, which is the longest LTE frame length that does not satisfy $\text{mod}(K_l,P)=0$ when $P=64$. In successive clock cycles, the counter 1026 of FIG. 10 repeatedly counts up to $C_l$, where the counter value c is signalled using $X=\lceil\log_2(C_{max})\rceil$ bits, where $C_{max}=\max_{l=1}^{L}C_l$. For example, $C_{max}=96$ and hence $X=7$, when $P=64$ and $D_l=2\forall l$.

Throughout the APTD decoding process, the index l of the current frame length $K_l$ and the value of the counter c are provided to each processing element, as well as to the interleaver ROM controller 1026 of FIG. 10. The interleaver ROM controller converts l and c into an address, which may be used to read crossbar switching patterns for the Beneš networks to use in the current clock cycle. The interleaver ROM comprises $Z=\Sigma_{l=1}^{188}C_l$ memory addresses, which may be addressed using $Y=\lceil\log_2(Z)\rceil$ bits, as shown in FIG. 10. For example, $Z=5,952$ and hence $Y=13$, when $P=64$ and $D_l=2\forall l$. Each memory address in each interleaver ROM stores S bits, which select switching positions for each of the S crossbar switches in the corresponding Beneš network.

Each terminating element of FIG. 10 is provided with the six input LLRs of $$[b_{2,k}^a]_{k=K_l+1}^{K_l+3} \text{ and } [b_{3,k}^a]_{k=K_l+1}^{K_l+3}.$$

Here, the superscripts 'u' and 'l' have been removed from the notation, since the discussion of this section applies equally to both the upper and lower terminating element. As shown in FIG. 10, each terminating element outputs a backward state metric vector $$\beta_{K_l} = [\beta_{K_l}(s_{K_l})]_{s_{K_l}=1}^{S},$$

where $S=8$ in the LTE turbo code. A fixed-point binary representation is employed for each backward state metric $\beta_{K_l}(s_{K_l})$, where a value of $\beta_{K_l}(s_{K_l})=0$ is adopted until the computations of the terminating element are completed. More specifically, updated values for $\beta_{K_l}$ may be obtained according to (20).

$$\beta_{k-1}(s_{k-1}) = \max_{\{s_k|c(s_{k-1},s_k)=1\}}[b_2(s_{k-1},s_k)\cdot b_{2,k}^a + b_3(s_{k-1},s_k)\cdot b_{3,k}^a + \beta_k(s_k) - \beta_k(1)] \quad (20)$$

This equation is computed using a backward recursion, which is initialised using $\beta_{K_l+3}=[0,-\infty,-\infty,-\infty,-\infty,-\infty,-\infty,-\infty]$, where $-\infty$ may be represented using the most negative value supported by the fixed point number representation. More specifically, the backward recursion successively computes $\beta_{K_l+2}$, $\beta_{K_l+1}$ and then finally the output $\beta_{K_l}$. Note that the notation $b_1(s_{k-1},s_k)$, $b_2(s_{k-1},s_k)$, $b_3(s_{k-1},s_k)$ and $c(s_{k-1},s_k)$ is illustrated by the example trellis shown in FIG. 6, as discussed above.

Figure 11:
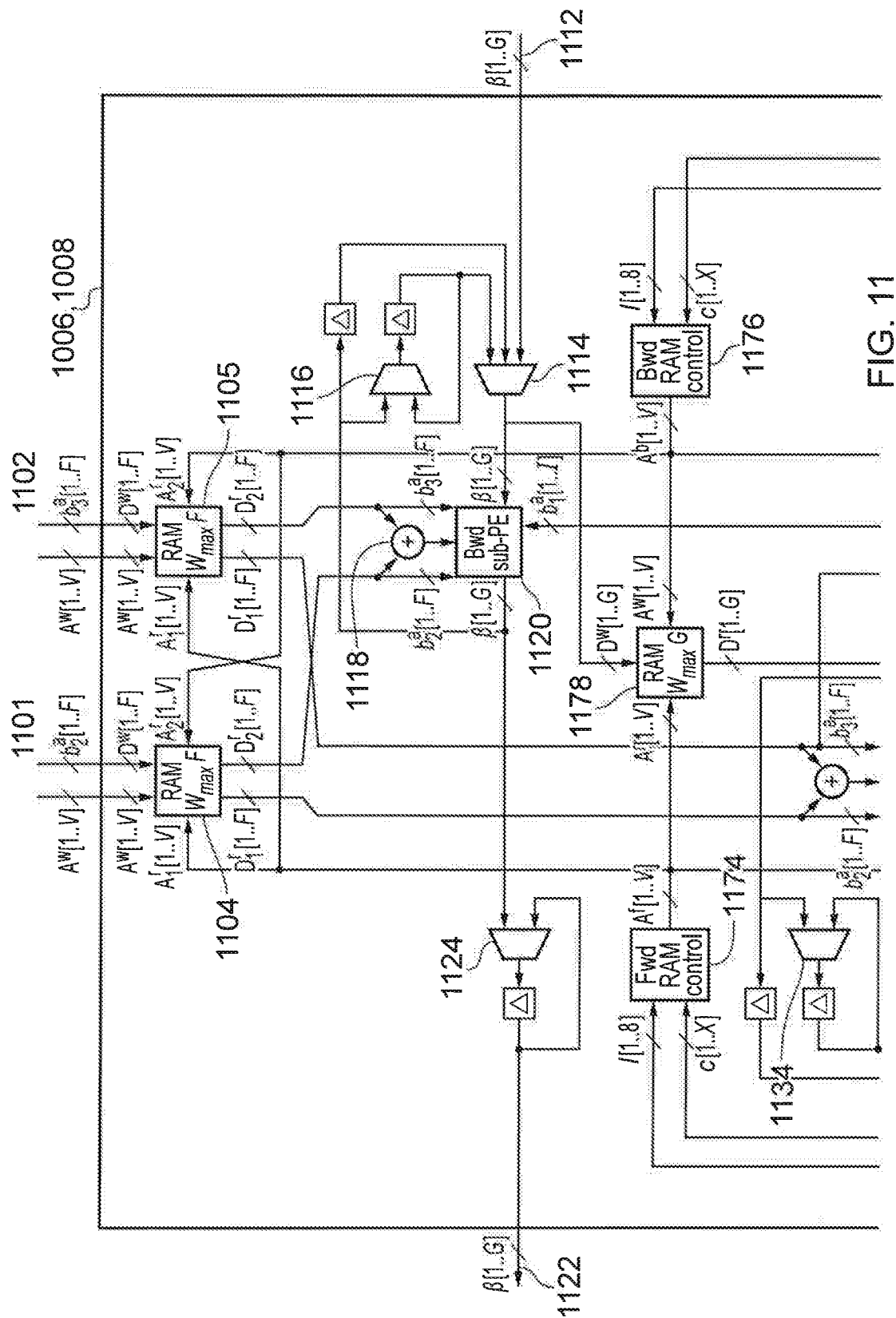
FIG. 11 is a schematic block diagram of an example of one of the processing elements of the upper or the lower decoders according to an embodiment of the present technique.
Figure 11:
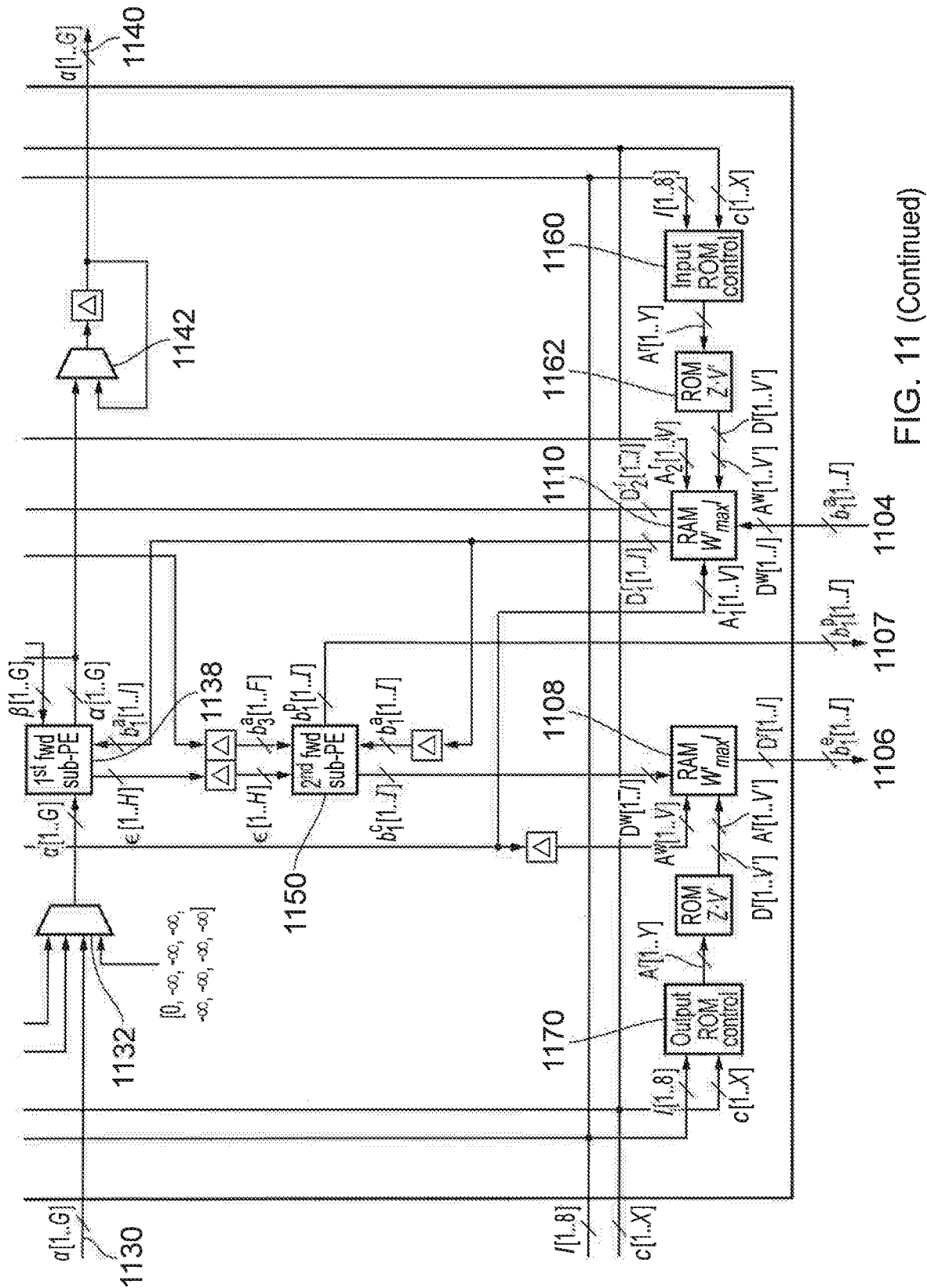

FIG. 11 provides a schematic block diagram showing parts which form one example implementation of a processing element shown in FIG. 10 for the upper decoder 1001 and the lower decoder 1002. As mentioned above, the processing element may be given the index $p\in[1,P]$ so that each decoder operates on the basis of windows comprising $W_{l,p}$ parity, systematic, a priori, extrinsic and a posteriori LLRs. In this section, the notation $k'\in[1,W_{l,p}]$ is used to index an LLR within the $p^{th}$ window, which may be converted to the index $k\in[1,K_l]$ within the frame according to $k=k'+\Sigma_{p'=1}^{p-1}W_{l,p'}$. Furthermore, the superscripts 'u' and 'l' are removed from the notation, wherever the discussion of this section applies equally to the processing elements of both the upper and lower decoder.

As shown in FIG. 11, the processing elements include components which are required to perform the calculations to implement the APTD. As shown in FIG. 11, the processing elements receive on an upper side the current LLR values on conductors 1101, 1102, which are stored in RAMs 1104, 1105. Correspondingly, on the lower side of the processing element, a priori LLR values are passed from the Beneš network on conductor 1104 and placed in the storage RAM 1110. The backward state metric values are received on a conductor 1112 and fed to a multiplexer 1114 which with a multiplexer 1116 an adder 1118 and a backward sub-processor element 1120 performs the processing calculations for the backward recursion to output corresponding backward state metric values from a conductor 1122 via a multiplexer 1124. Correspondingly, forward state metric values are received on a conductor 1130 and fed to a multiplexer 1132 which in combination with a multiplexer 1134, an adder 1136 and a first forward sub-processing element 1138 perform the calculation of the forward state metrics values which are fed to an output conductor 1140 via a multiplexer 1142. A second forward sub-processing element 1150 receives partial calculations from the first forward sub-processing element 1138 and calculates the extrinsic LLR output value fed on the output conductor 1106 via the storage RAM 1108. Input and output controllers 1160, 1170 combined with ROMs 1172, 1162 are used to control the RAMs 1108, 1110 to both receive a priori LLR values from a Benes network on a conductor 1164, as well as to output the extrinsic LLR values from the conductor 1106. Similarly, RAM controllers for the forward and backward recursion processes 1174, 1176 operate with a random access memory 1178 to feed backward state metric values to the first forward sub-processing element 1138.

As will be appreciated from the circuit diagram shown in FIG. 11 unlike the upper decoder, the lower decoder does not benefit from systematic LLRs, which is equivalent to having $b_{3,k}^a=0$. Likewise, the lower decoder does not generate a posteriori LLRs $b_{1,k}^p$. These differences allow the RAM for storing $b_{3,k}^a$, as well as all circuitry associated with $b_{3,k}^a$ and $b_{1,k}^p$ to be omitted from the processing elements of the lower decoder.

At the start of the decoding process, the processing element in each decoder having the index p is provided with the $W_{l,p}$ parity LLRs $[b_{2,k'}^a]_{k'=1}^{W_{l,p}}$. Furthermore, the $p^{th}$ processing element in the upper decoder is provided with the $W_{l,p}$ systematic LLRs $[b_{3,k'}^{u,a}]_{k'=1}^{W_{l,p}}$ at the start of the decoding process. Throughout the decoding process, the $p^{th}$ processing element of each decoder is continually provided with updates to the a priori LLRs in the window $[b_{1,k'}^a]_{k'=1}^{W_{l,p}}$. In response, this processing element continually updates the extrinsic LLRs in the window $[b_{1,k'}^e]_{k'=1}^{W_{l,p}}$, as discussed below. Furthermore, in the case of the $p^{th}$ processing element in the upper decoder, the a posteriori LLRs in the window $[b_{1,k'}^{u,p}]_{k'=1}^{W_{l,p}}$ are also updated as the decoding process proceeds.

Additionally, throughout the decoding process, the $(p-1)^{th}$ processing element in each decoder periodically provides the $p^{th}$ processing element with updates to the forward state metric vector $\alpha_k=[\alpha_k(s_{k'})]_{s_{k'}=1}^{S}$ for the case where $k'=0$, as shown in FIG. 10. However, an exception to this is made if the $(p-1)^{th}$ processing element is deactivated because $K_l \leq 2P$ or if p=1 and hence the (p−1)$^{th}$ processing element does not exist. In these cases, the p$^{th}$ processing element adopts $\alpha_0 = [0, -\infty, -\infty, -\infty, -\infty, -\infty, -\infty, -\infty]$ using the multiplexer 1132 shown in FIG. 11. Here, −∞ may be represented using the most negative value supported by the fixed point number representation. Likewise, the (p+1)$^{th}$ processing element in each decoder periodically provides the p$^{th}$ processing element with updates to the backward state metric vector $\beta_{k'} = [\beta_{k'}(s_{k'})]_{s_{k'}=1}^{S}$ for the case where k'=$W_{l,p}$, as shown in FIG. 10. However, an exception to this is made if p=P, in which case the backward state metric vector is provided by the corresponding terminating element, as shown in FIG. 10 and described above. As described below, the p$^{th}$ processing element periodically updates the forward state metric vector $\alpha_{k'}$ for k'=$W_{l,p}$ and the backward state metric vector $\beta_{k'}$ for k'=0, which are provided to the (p+1)$^{th}$ and (p−1)$^{th}$ processing element, respectively.

During each clock cycle of the decoding process, each processing element accepts the above-described inputs, reads from RAM, performs processing within backward, first forward and second forward sub-processing element, writes into RAM and generates the above-described outputs, as shown in FIG. 11. Each upper processing element employs five RAMs, for storing the F-bit parity LLRs $[b_{2,k'}^{a}]_{k'=1}^{W_{l,p}}$, the F-bit systematic LLRs $[b_{3,k'}^{a}]_{k'=1}^{W_{l,p}}$, the G-bit backward state metric vectors $[\beta_{k'}]_{k'=1}^{W_{l,p}}$, the I-bit a priori LLRs $[b_{1,k'}^{a}]_{k'=1}^{W_{l,p}}$ and the I-bit extrinsic LLRs $[b_{1,k'}^{e}]_{k'=1}^{W_{l,p}}$. By contrast, each lower processing element employs only four RAMs, since the lower decoder does not benefit from systematic LLRs. Each of these RAMs comprises $W_{max}$ memory addresses, corresponding to the length of the longest windows supported by the APTD, as described above. The RAMs may be addressed using $V = \lceil \log_2(W_{max}) \rceil$ bits, as shown in FIG. 11. For example, V=7, when P=64.

The RAM storing the a priori LLRs $[b_{1,k'}^{a}]_{k'=1}^{W_{l,p}}$, the parity LLRs $[b_{2,k'}^{a}]_{k'=1}^{W_{l,p}}$ and the systematic LLRs $[b_{3,k'}^{a}]_{k'=1}^{W_{l,p}}$ have two read ports, labelled $D_1^r$ and $D_2^r$ in FIG. 11. The second port of each of these RAMs is addressed $A_2^r$ by the output of the backward RAM controller $A^b \in [1, W_{l,p}]$, in order to provide the backward sub-processing element with the LLRs $b_{1,A^b}^a$, $b_{2,A^b}^a$ and $b_{3,A^b}^a$, as shown in FIG. 11. Note that an adder is used to also provide the backward sub-processing element with the LLR given by $(b_{2,A^b}^a + b_{3,A^b}^a)$. Meanwhile, the first port of each RAM is addressed $A_1^r$ by the output of the forward RAM controller $A^f \in [1, W_{l,p}]$, in order to provide the first forward sub-processing element with the LLRs $b_{1,A^f}^a$, $b_{2,A^f}^a$, $b_{3,A^f}^a$ and $(b_{2,A^f}^a + b_{3,A^f}^a)$. This sub-processing element is also provided with a backward state metric vector $\beta_{A^f}$ by the read port of the corresponding RAM $D^r$, which is also addressed $A^r$ by the output of the forward RAM controller $A^f$. At the same time, the write port $D^w$ of this RAM is addressed $A^w$ by the output of the backward RAM controller $A^b$, in order to store a backward state metric vector $\beta_{A^b}$ that had been generated during the previous clock cycle. More specifically, a multiplexer 1114 is used to select the backward state metric vector $\beta_{W_{l,p}}$ provided by the neighbouring processing element or terminating element when $A^b = W_{l,p}$, or to select that provided by the backward sub-processing element otherwise.

Figure 12:
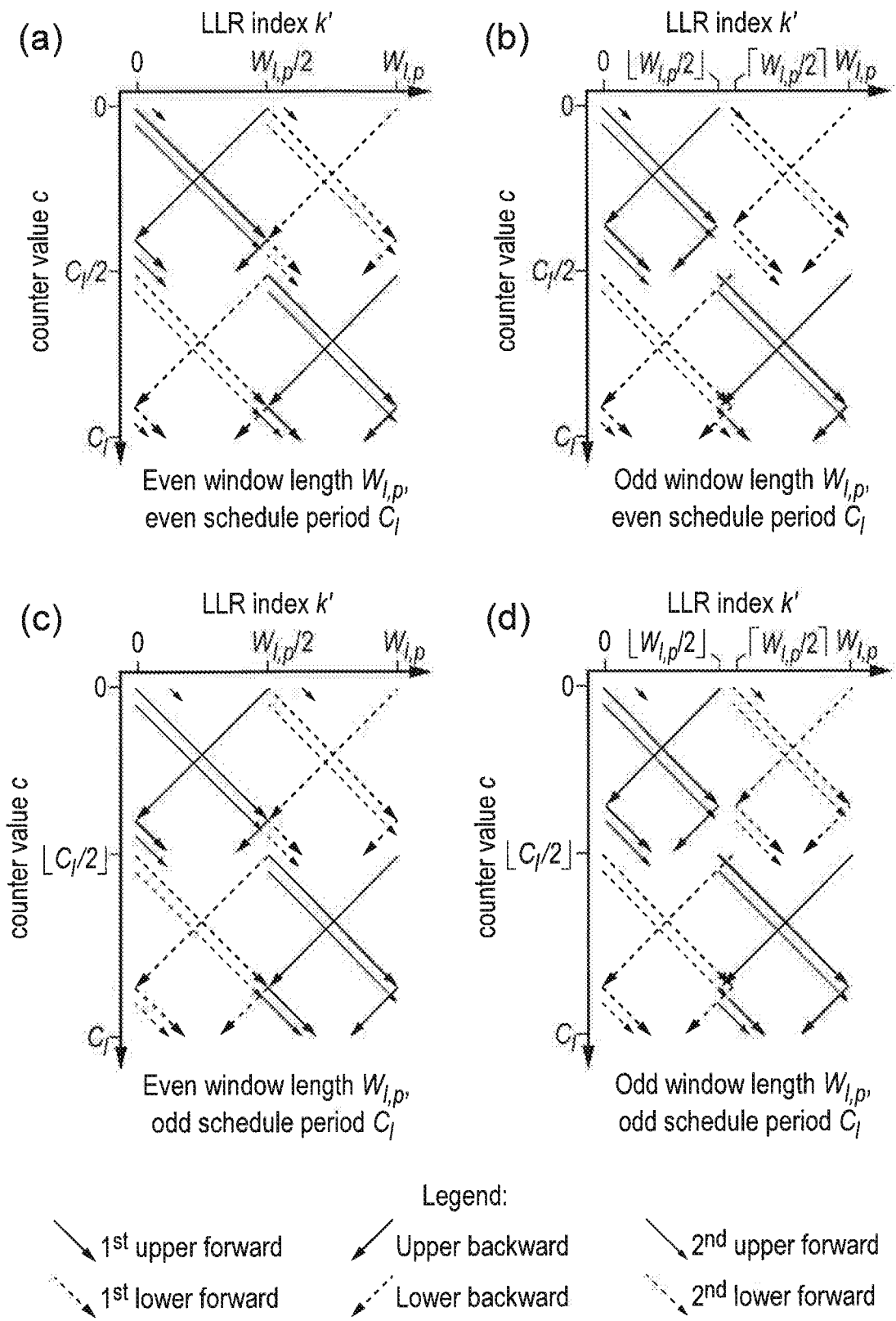
FIG. 12a, 12b, 12c, 12d are schematic representations illustrating graphically a scheduling of backward and forward recursions performed within a processing element (referred to as a sub-processing element) to generate a log-likelihood ratio for a single processing element in each of the upper and lower decoder of an arbitrarily parallel turbo decoder including a second forward sub-processing element, which operates one clock cycle delayed relative to a first forward sub-processing element.

The backward and forward RAM controllers are driven by l and c, which they use to produce the addresses $A^b \in [1, W_{l,p}]$ and $A^f \in [1, W_{l,p}]$, respectively. Here, the addresses $A^b$ and $A^f$ are generated such that the backward sub-processing element and the first forward sub-processing element are operated according to the schedule shown in FIG. 12. Here, the backward sub-processing element performs backward recursions, in which decremental LLR indices k' are processed in successive clock cycles. Meanwhile, the first forward sub-processing element performs forward recursions, in which incremental LLR indices k' are processed in successive clock cycles. During the first $\lfloor C_l/2 \rfloor$ clock cycles in each period of $C_l$ cycles, these sub-processing elements of the upper decoder process the first $\lfloor W_{l,p}/2 \rfloor$ LLR indices, while the corresponding sub-processing elements of the lower decoder process the last $\lfloor W_{l,p}/2 \rfloor$ LLR indices. Note that $\lfloor C_l/2 \rfloor$ may be greater than $\lfloor W_{l,p}/2 \rfloor$ in cases where $D_l > 0$ is chosen for the sake of improving the APTD's error correction capability. In these cases, the beginning of the forward and backward recursions are repeated after they have been completed a first time, as shown in FIG. 12. During the last $\lceil C_l/2 \rceil$ clock cycles in each period, the backward sub-processing elements and the first forward sub-processing elements of the lower decoder process the first $\lceil W_{l,p}/2 \rceil$ LLR indices, while the corresponding sub-processing elements of the upper decoder process the last $\lceil W_{l,p}/2 \rceil$ LLR indices. Again, the beginning of the recursions are repeated after they have been completed a first time, when $D_l > 0$.

FIG. 12 provides a graphical representation showing a sequence of processing performed by the first and second forward sub-processing elements as well as the backwards sub-processing elements of the processing elements of the upper decoder corresponding to those shown in FIG. 11. FIG. 12 illustrates a schedule for operating the first and second forward sub-processing elements, as well as the backward sub-processing element within a processing element of the upper decoder, as well as within a processing element of the lower decoder. Note that as will be described below, the operation of the second forward sub-processing element is delayed by one clock cycle relative to that of the first forward sub-processing element, since they are separated by a pipeline register in FIG. 11.

Note that the schedule for the operation of the sub-processing element may be described by matrices. In the case where each of the upper and lower decoders employ P=9 processing elements to perform the processing for the shortest LTE frame length of $K_l = 40$ bits, we obtain window lengths of $[W_{l,p}]_{p=1}^{P} = [4,4,4,4,4,5,5,5,5]$, according to (17). Supposing that $D_l = 2$ is selected in order to strike a trade-off between error correction capability and throughput, we obtain a period of $C_l = \lceil 40/9 \rceil + 1 = 7$ clock cycles, according to (19). In this case, the schedule for the first forward sub-processing element of the upper decoder may be described by the matrix $$K_l^{uf1} = \begin{bmatrix} 1 & 5 & 9 & 13 & 17 & 21 & 26 & 31 & 36 \\ 2 & 6 & 10 & 14 & 18 & 22 & 27 & 32 & 37 \\ 1 & 5 & 9 & 13 & 17 & 21 & 26 & 31 & 36 \\ 3 & 7 & 11 & 15 & 19 & 23 & 28 & 33 & 38 \\ 4 & 8 & 12 & 16 & 20 & 24 & 29 & 34 & 39 \\ 3 & 7 & 11 & 15 & 19 & 25 & 30 & 35 & 40 \\ 4 & 8 & 12 & 16 & 20 & 23 & 28 & 33 & 38 \end{bmatrix} \quad (21)$$

which comprises one column for each of the P=9 processing elements and one row for each of the $C_l = 6$ clock cycles in each schedule period. Here, the element in the p$^{th}$ column and the c$^{th}$ row identifies the index $k \in [1, K_l]$ of the LLRs that are processed by the p$^{th}$ processing element in the c$^{th}$ clock cycle within each schedule period, as generalized in FIG. 12. Likewise, the schedules for the backward sub-processing element of the upper decoder, the first forward sub-processing element of the lower decoder and the backward sub-processing element of the lower decoder may be described by the following three matrices, respectively.

$$K_l^{ub} = \begin{bmatrix} 2 & 6 & 10 & 14 & 18 & 22 & 27 & 32 & 37 \\ 1 & 5 & 9 & 13 & 17 & 21 & 26 & 31 & 36 \\ 2 & 6 & 10 & 14 & 18 & 22 & 27 & 32 & 37 \\ 4 & 8 & 12 & 16 & 20 & 25 & 30 & 35 & 40 \\ 3 & 7 & 11 & 15 & 19 & 24 & 29 & 34 & 39 \\ 4 & 8 & 12 & 16 & 20 & 23 & 28 & 33 & 38 \\ 3 & 7 & 11 & 15 & 19 & 25 & 30 & 35 & 40 \end{bmatrix} \quad (22)$$

$$K_l^{lf1} = \begin{bmatrix} 3 & 7 & 11 & 15 & 19 & 24 & 29 & 34 & 39 \\ 4 & 8 & 12 & 16 & 20 & 25 & 30 & 35 & 40 \\ 3 & 7 & 11 & 15 & 19 & 24 & 29 & 34 & 39 \\ 1 & 5 & 9 & 13 & 17 & 21 & 26 & 31 & 36 \\ 2 & 6 & 10 & 14 & 18 & 22 & 27 & 32 & 37 \\ 1 & 5 & 9 & 13 & 17 & 23 & 28 & 33 & 38 \\ 2 & 6 & 10 & 14 & 18 & 21 & 26 & 31 & 36 \end{bmatrix} \quad (23)$$

$$K_l^{lb} = \begin{bmatrix} 4 & 8 & 12 & 16 & 20 & 25 & 30 & 35 & 40 \\ 3 & 7 & 11 & 15 & 19 & 24 & 29 & 34 & 39 \\ 4 & 8 & 12 & 16 & 20 & 25 & 30 & 35 & 40 \\ 2 & 6 & 10 & 14 & 18 & 23 & 28 & 33 & 38 \\ 1 & 5 & 9 & 13 & 17 & 22 & 27 & 32 & 37 \\ 2 & 6 & 10 & 14 & 18 & 21 & 26 & 31 & 36 \\ 1 & 5 & 9 & 13 & 17 & 23 & 28 & 33 & 38 \end{bmatrix} \quad (24)$$

In addition to the LLRs $b_{1,A^b}{}^a$, $b_{2,A^b}{}^a$, $b_{3,A^b}{}^a$ and $(b_{2,A^b}{}^a + b_{3,A^b}{}^a)$, the backward sub-processing element is provided with the same backward state metric vector $\beta_{A^b}$ that is provided by the multiplexer 1114 described above, as shown in FIG. 11. The backward sub-processing element operates on the basis of (20) using the schematic of FIG. 13(a), in order to generate the backward state metric vector $\beta_{A^b-1}$.

$$\beta_{k-1}(s_{k-1}) = \max_{\{s_k | c(s_{k-1}, s_k) = 1\}} [b_1(s_{k-1}, s_k) \cdot b_{1,k}{}^a + b_2(s_{k-1}, s_k) \cdot b_{2,k}{}^a + b_3(s_{k-1}, s_k) \cdot b_{3,k}{}^a + \beta_k(s_k) - \beta_k(1)] \quad (25)$$

Note that unlike the upper decoder, the lower decoder does not benefit from systematic LLRs, which is equivalent to having $b_{3,k}{}^a = 0$. This allows the corresponding term to be omitted from (25) in the case of the lower decoder.

Figure 13:
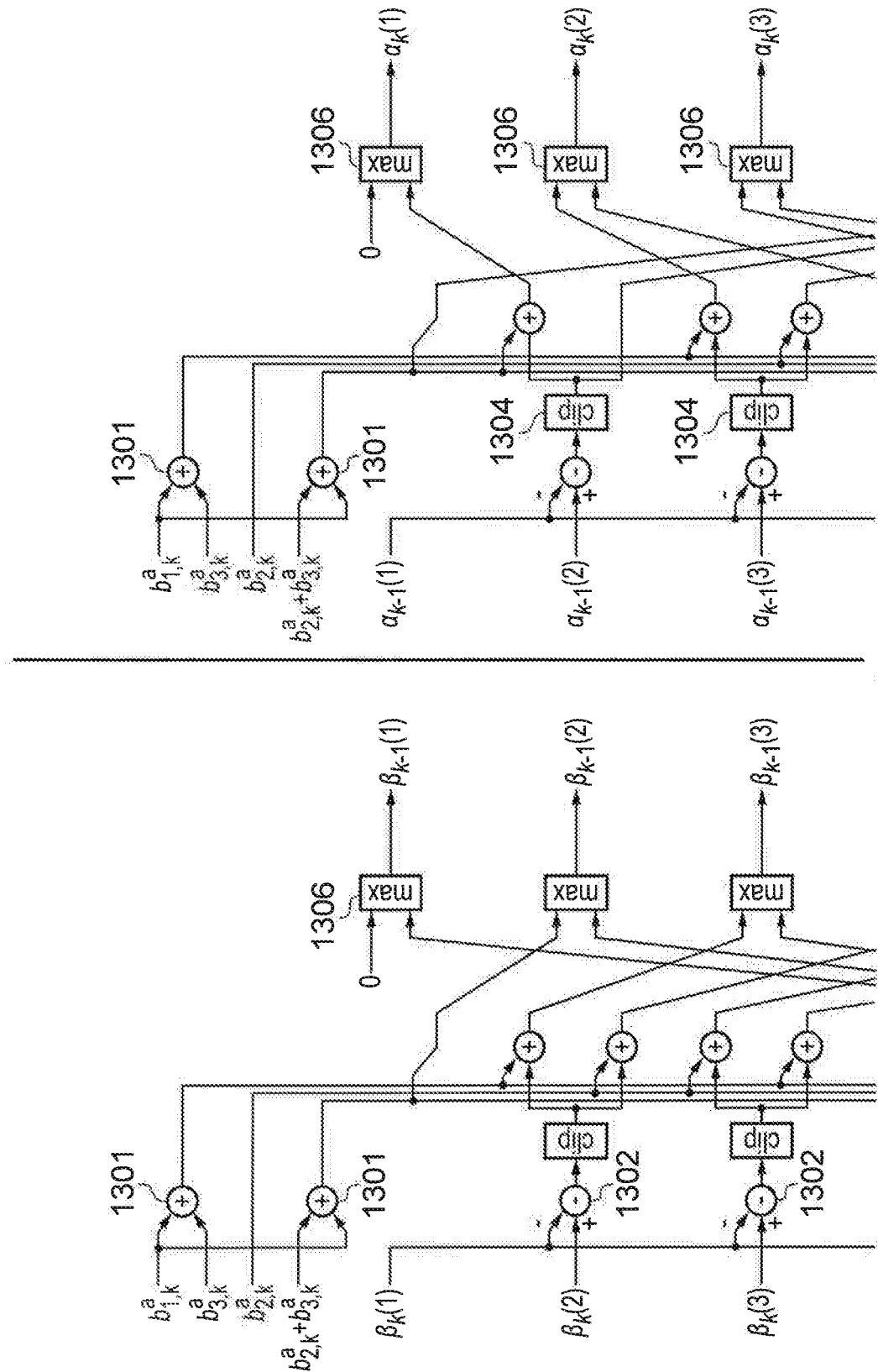
FIG. 13a is a schematic circuit diagram of part of a processing element shown in FIG. 11 configured to calculate the backward state metric vector in the backward sub-processing element and FIG. 13b is a schematic block diagram of part of the processing element shown in FIG. 11 configured to calculate the forward state metric vector in the first forward sub-processing element.
Figure 13:
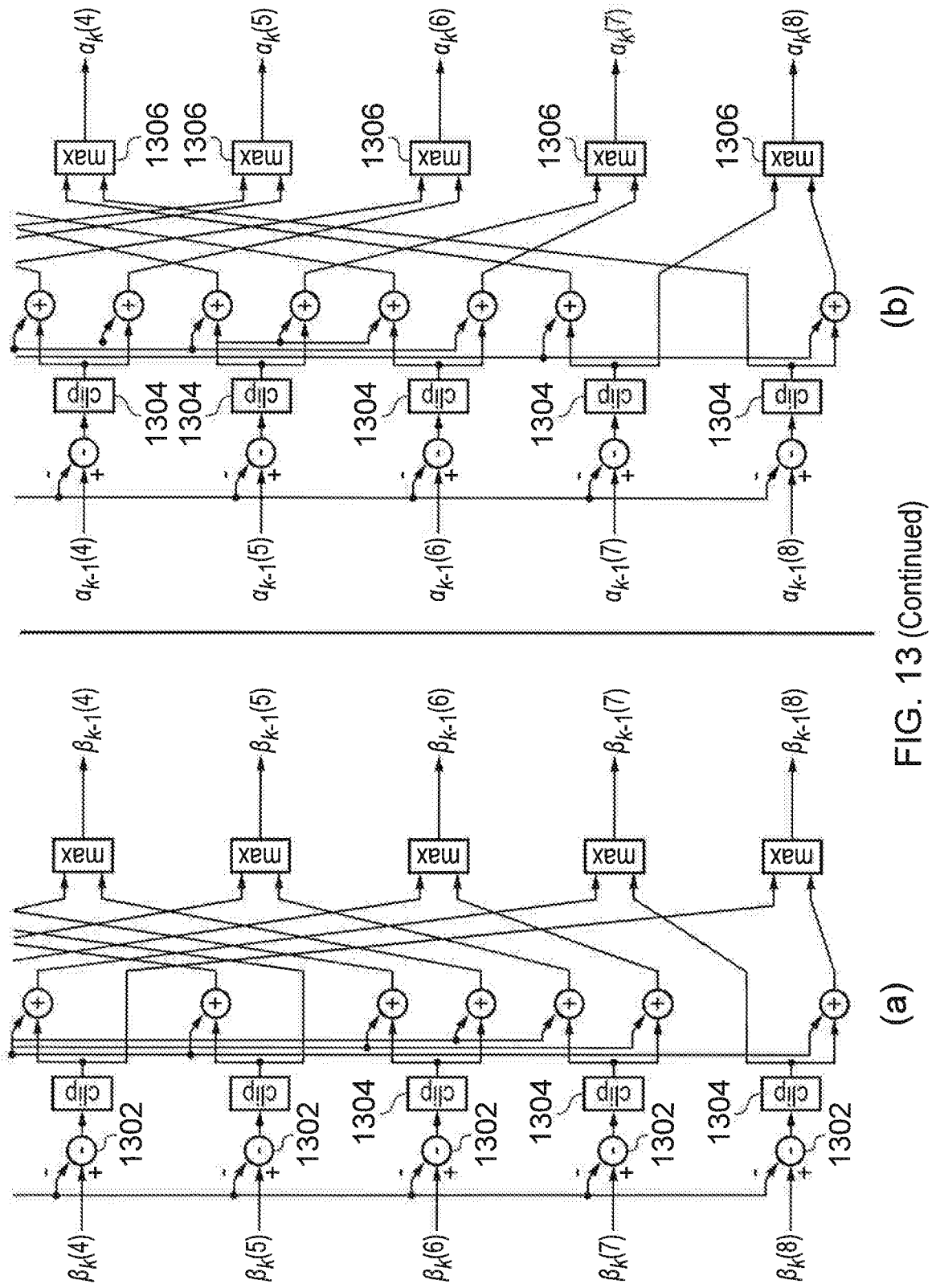

FIG. 13(a) shows a schematic representation of processing circuits which perform calculation of the backward state metric vector $\beta_{k-1} = [\beta_{k-1}(s_{k-1})]_{s_{k-1}=1}^M$ of (20) in the backward sub-processing element. Note that unlike the upper decoder, the lower decoder does not benefit from systematic LLRs. This is equivalent to having $b_{3,k}{}^a = 0$, which allows one of the adders shown in FIG. 13(a) to be omitted from the processing elements of the lower decoder. As shown in FIG. 13(a) the calculations are implemented using elements typically formed on integrated circuits such as adders 1301, subtracting circuits 1302, clipping circuits 1304 and maximum output circuits 1306. As will be appreciated from the layout of the circuits in accordance with the understanding of the conventional operation of these circuits, the respective circuits implement the calculations performed by the backward sub-processing elements shown in the processing element of FIG. 11.

Following its computation by the backward sub-processing element, the backward state metric vector $\beta_{A^b-1}$ is stored in an internal register in order to facilitate its use as $\beta_{A^b}$ in the next clock cycle, as shown in FIG. 11. Furthermore, the backward state metric vector $\beta_{A^b-1}$ is stored in an output register in the case where $A^b = 1$ or $A^b = \frac{W_{l,p}}{2} + 1$, in order to provide $\beta_0$ and $\beta_{W_{l,p}/2}$ to initialise the backward recursion in the neighbouring processing element or the backward recursion in the other half of the window processed by the same processing element, respectively.

Similarly, the first forward sub-processing element of FIG. 11 is provided with the LLRs $b_{1,A^f}{}^a$, $b_{2,A^f}{}^a$, $b_{3,A^f}{}^a$ and $(b_{2,A^f}{}^a + b_{3,A^f}{}^a)$, as well as the backward state metric vector $\beta_{A^f}$, as described above. Furthermore, a multiplexer 1132 is used to provide the first forward sub-processing element with the forward state metric vector $\alpha_{A^f-1}$, in analogy with the provision of $\beta_{A^b}$ to the backward sub-processing element, but with the additional option of providing the vector $\alpha_0 = [0, -\infty, -\infty, -\infty, -\infty, -\infty, -\infty, -\infty]$, as described above. The first forward sub-processing element performs the calculations of (26) using the schematic of FIG. 13(b), in order to generate the forward state metric vector $\alpha_{A^f}$.

$$\alpha_k(s_k) = \max_{\{s_{k-1} | c(s_{k-1}, s_k) = 1\}} [b_1(s_{k-1}, s_k) \cdot b_{1,k}{}^a + b_2(s_{k-1}, s_k) \cdot b_{2,k}{}^a + b_3(s_{k-1}, s_k) \cdot b_{3,k}{}^a + \alpha_{k-1}(s_{k-1}) - \alpha_{k-1}(1)] \quad (25)$$

Note that unlike the upper decoder, the lower decoder does not benefit from systematic LLRs, which is equivalent to having $b_{3,k}{}^a = 0$. This allows the corresponding terms to be omitted from (26) in the case of the lower decoder.

FIG. 13(b) shows a schematic representation of processing circuits which perform the calculation of the forward state metric vector $\alpha_k = [\alpha_k(s_k)]_{s_k=1}^M$ of (26) in the first forward sub-processing element. Note that unlike the upper decoder, the lower decoder does not benefit from systematic LLRs. This is equivalent to having $b_{3,k}{}^a = 0$, which allows one of the adders shown in FIG. 13(b) to be omitted from the processing elements of the lower decoder. As shown in FIG. 13(b) the calculations are implemented using elements typically formed on integrated circuits such as adders 1301, subtracting circuits 1302, clipping circuits 1304 and maximum output circuits 1306. As will be appreciated from the layout of the circuits in accordance with the understanding of the conventional operation of these circuits, the respective circuits implement the calculations performed by the first forward sub-processing elements shown in the processing element of FIG. 11.

Following its computation by the first forward sub-processing element, the forward state metric vector $\alpha_{A^f}$ is stored in an internal register in order to facilitate its use as $\alpha_{A^f-1}$ in the next clock cycle, as shown in FIG. 11. Furthermore, the forward state metric vector $\alpha_{A^f}$ is stored in an output register in the case where $A^f = W_{l,p}$ or $A^f = W_{l,p}/2$, in order to provide $\alpha_{W_{l,p}}$ and $\alpha_{W_{l,p}/2}$ to initialise the forward recursion in the neighbouring processing eleement or the forward recursion in the other half of the window processed by the same processing element, respectively.

Figure 14:
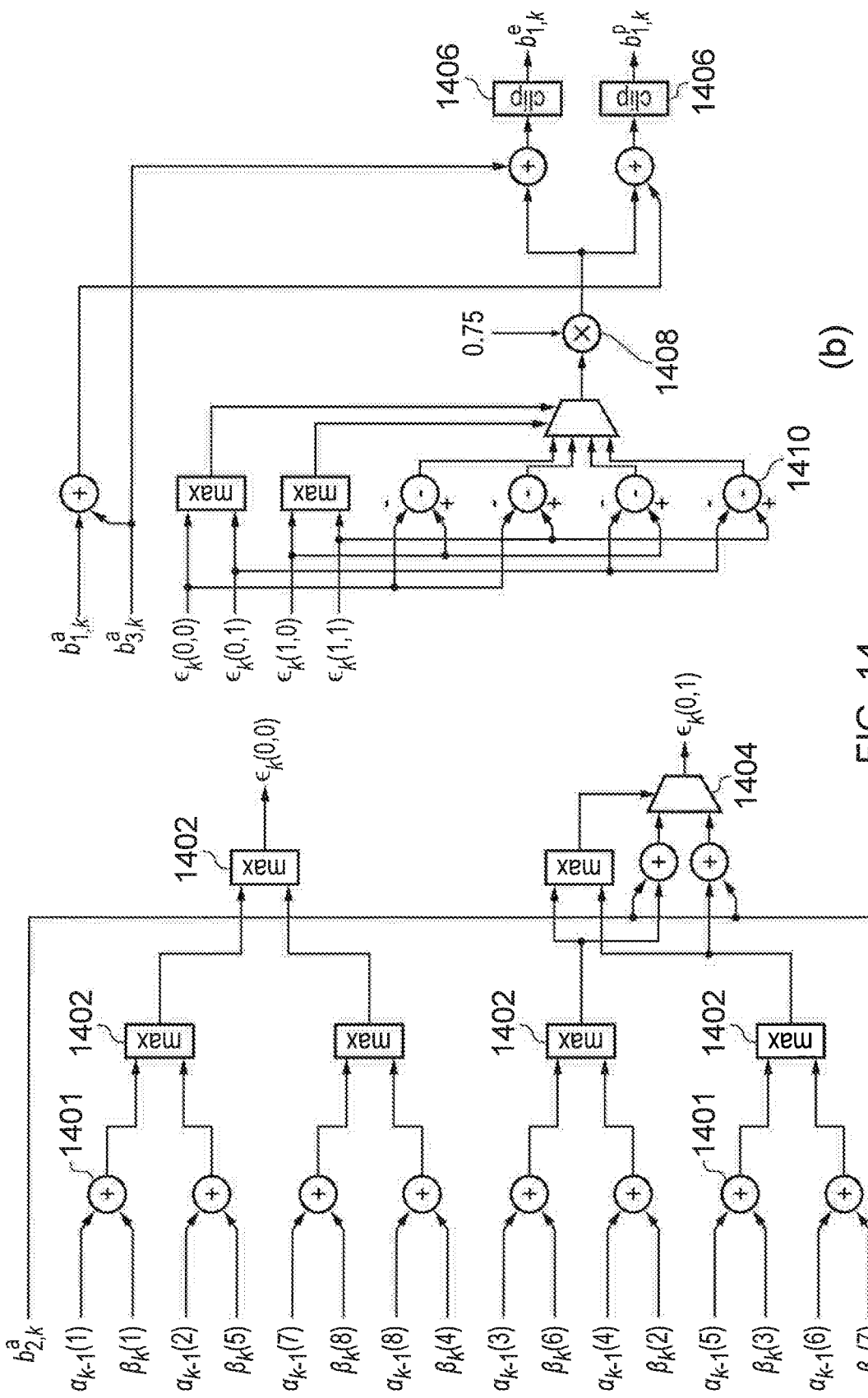
Figure 14:
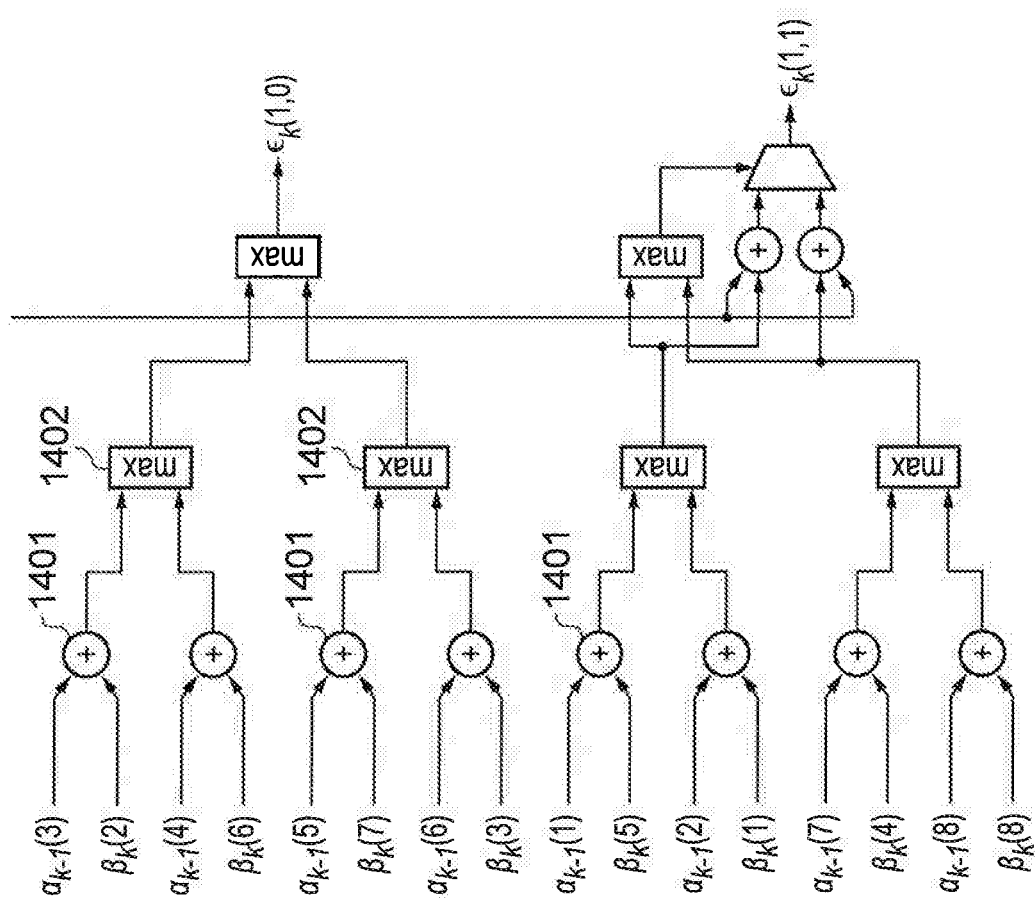

At the same time, the first forward sub-processing element performs the calculations of (27) using the schematic of FIG. 14a, in order to generate the bit metric vector $$\epsilon_{A^f}^c = [\epsilon_{A^f}^c(b'_{1,A^f}, b'_{2,A^f})]_{b'_{2,A^f} \in \{0,1\}}^{b'_{1,A^f} \in \{0,1\}}$$

$$\epsilon_{A^f}^c(b'_{1,A^f}, b'_{2,A^f}) \begin{bmatrix} \max_{\{(s_{k-1}, s_k) \mid b_1(s_{k-1}, s_k) = b'_{1,k}, b_2(s_{k-1}, s_k) = b'_{2,k}\}} [\alpha_{k-1}(s_{k-1}) + \beta_k(s_k)] + \\ b'_{2,k} \cdot b^a_{2,k} \end{bmatrix} \quad (27)$$

Here, the superscript 'c' in (27) represents the clock cycle index, which is included in order to emphasise the action of the pipelining in (28) and (29), as will be discussed below.

FIG. 14(a) provides a schematic circuit diagram providing a circuit for the calculation of the bit metric vector $$\epsilon_{A^f}^c = [\epsilon_{A^f}^c(b'_{1,A^f}, b'_{2,A^f})]_{b'_{2,A^f} \in \{0,1\}}^{b'_{1,A^f} \in \{0,1\}}$$

of (27) in the first forward sub-processing element. Again, the circuits shown in FIG. 14a perform conventional functions of integrated circuit elements, such as adders 1401, maximum value formers 1402 and multiplexers 1404.

As shown in FIG. 11, pipelining registers are employed to supply the second forward sub-processing element with the bit metric vector $\epsilon_{A^f}^c$, as well as the LLRs $b_{1,A^f}^a$ and $b_{3,A^f}^a$, albeit delayed by one clock cycle relative to the first forward sub-processing element. The second forward sub-processing element operates on the basis of the schematic shown in FIG. 14(b). In the upper decoder, this is used to generate the a posteriori LLR $b_{1,A^f}^p$ of (29), which is output by the processing element and provided to the CRC unit, as described above In both the upper and lower decoder, the second forward sub-processing element computes the extrinsic LLR of (28), which is provided to the write port $D^w$ of the corresponding RAM and placed in the address $A^w$, which is driven by a pipeline register that supplies a delayed copy of $A^f$ as shown in FIG. 11.

$$b_{1,k}^c = \qquad (28)$$
$$0.75\left[\max_{b'_{2,k} \in \{0,1\}} [\epsilon_k^{c-1}(1, b'_{2,k})]\right] - 0.75\left[\max_{b'_{2,k} \in \{0,1\}} [\epsilon_k^{c-1}(0, b'_{2,k})]\right] + b_{3,k}^a$$

$$b_{1,k}^p = 0.75\left[\max_{b'_{2,k} \in \{0,1\}} [\epsilon_k^{c-1}(1, b'_{2,k})]\right] - \qquad (29)$$
$$0.75\left[\max_{b'_{2,k} \in \{0,1\}} [\epsilon_k^{c-1}(0, b'_{2,k})]\right] + b_{1,k}^a + b_{3,k}^a$$

Note that unlike the upper decoder, the lower decoder does not benefit from systematic LLRs, which is equivalent to having $b_{3,k}^a=0$. This allows the corresponding term to be omitted from (28) in the case of the lower decoder. Likewise, the lower decoder does not generate a posteriori LLR, allowing (29) to be omitted entirely. Here, the superscript 'c−1' in (28) and (29) represents the index of the previous clock cycle, in order to emphasise that the bit metric vectors of (27b) have been pipelined.

FIG. 14b provides a schematic circuit diagram providing a circuit for the calculation of the extrinsic and a posteriori LLRs $b_{1,k}^e$ and $b_{1,k}^p$ of (28) and (29) in the second forward sub-processing element. Note that unlike the upper decoder, the lower decoder does not benefit from systematic LLRs, which is equivalent to having $b_{3,k}^a=0$. Likewise, the lower decoder does not generate a posteriori LLRs $b_{1,k}^p$. These differences allow three of the adders shown in FIG. 14b to be omitted from the processing elements of the lower decoder. Again, the circuits shown in FIG. 14b perform conventional functions of integrated circuit elements, such as subtractions 1410, multiplications 1408 and clipping circuits 1406.

Note that the schedule for the second forward sub-processing element may be described by the same matrices exemplified above in (21) and (23) for the first forward sub-processing element, but rotated downwards by one row, owing to the pipelining delay. In this example, the schedules for the second forward sub-processing element in the upper and lower decoder may be described by the following two matrices, respectively.

$$K_l^{uf2} = \begin{bmatrix} 4 & 8 & 12 & 16 & 20 & 23 & 28 & 33 & 38 \\ 1 & 5 & 9 & 13 & 17 & 21 & 26 & 31 & 36 \\ 2 & 6 & 10 & 14 & 18 & 22 & 27 & 32 & 37 \\ 1 & 5 & 9 & 13 & 17 & 21 & 26 & 31 & 36 \\ 3 & 7 & 11 & 15 & 19 & 23 & 28 & 33 & 38 \\ 4 & 8 & 12 & 16 & 20 & 24 & 29 & 34 & 39 \\ 3 & 7 & 11 & 15 & 19 & 25 & 30 & 35 & 40 \end{bmatrix} \qquad (30)$$

$$K_l^{lf2} = \begin{bmatrix} 2 & 6 & 10 & 14 & 18 & 21 & 26 & 31 & 36 \\ 3 & 7 & 11 & 15 & 19 & 24 & 29 & 34 & 39 \\ 4 & 8 & 12 & 16 & 20 & 25 & 30 & 35 & 40 \\ 3 & 7 & 11 & 15 & 19 & 24 & 29 & 34 & 39 \\ 1 & 5 & 9 & 13 & 17 & 21 & 26 & 31 & 36 \\ 2 & 6 & 10 & 14 & 18 & 22 & 27 & 32 & 37 \\ 1 & 5 & 9 & 13 & 17 & 23 & 28 & 33 & 38 \end{bmatrix} \qquad (31)$$

In an approach where the exchange of LLRs through the interleaver and deinterleaver was scheduled together with the forward recursions, the RAM storing the extrinsic LLRs $[b_{1,k'}^e]_{k'=1}^{W_{l,p}}$ would behave like an additional pipeline register. More specifically, the LLR written into this RAM by the second forward sub-processing element in a particular clock cycle, would be read and exchanged through the interleaver or deinterleaver in the next clock cycle. In this case, the schedules for interleaving and deinterleaving schedules could be described by the matrices exemplified above in (30) and (31) for the first forward sub-processing element, but rotated downwards by two rows, owing to the pipelining delay. In this example, the schedules for the provision of the extrinsic LLRs to the interleaver by the upper decoder and to the deinterleaver by the lower decoder may be described by the following two matrices, respectively.

$$K_l^{u\pi} = \begin{bmatrix} 3 & 7 & 11 & 15 & 19 & 25 & 30 & 35 & 40 \\ 4 & 8 & 12 & 16 & 20 & 23 & 28 & 33 & 38 \\ 1 & 5 & 9 & 13 & 17 & 21 & 26 & 31 & 36 \\ 2 & 6 & 10 & 14 & 18 & 22 & 27 & 32 & 37 \\ 1 & 5 & 9 & 13 & 17 & 21 & 26 & 31 & 36 \\ 3 & 7 & 11 & 15 & 19 & 23 & 28 & 33 & 38 \\ 4 & 8 & 12 & 16 & 20 & 24 & 29 & 34 & 39 \end{bmatrix} \qquad (32)$$

$$K_l^{l\pi} = \begin{bmatrix} 1 & 5 & 9 & 13 & 17 & 23 & 28 & 33 & 38 \\ 2 & 6 & 10 & 14 & 18 & 21 & 26 & 31 & 36 \\ 3 & 7 & 11 & 15 & 19 & 24 & 29 & 34 & 39 \\ 4 & 8 & 12 & 16 & 20 & 25 & 30 & 35 & 40 \\ 3 & 7 & 11 & 15 & 19 & 24 & 29 & 34 & 39 \\ 1 & 5 & 9 & 13 & 17 & 21 & 26 & 31 & 36 \\ 2 & 6 & 10 & 14 & 18 & 22 & 27 & 32 & 37 \end{bmatrix} \qquad (33)$$

As described above the $K_f$=40-bit LTE interleaver and deinterleaver may be described by the vectors Π=[1, 38, 15, 12, 29, 26, 3, 40, 17, 14, 31, 28, 5, 2, 19, 16, 33, 30, 7, 4, 21, 18, 35, 32, 9, 6, 23, 20, 37, 34, 11, 8, 25, 22, 39, 36, 13, 10, 27, 24] and $\Pi^{-1}$=[1, 14, 7, 20, 13, 26, 19, 32, 25, 38, 31, 4, 37, 10, 3, 16, 9, 22, 15, 28, 21, 34, 27, 40, 33, 6, 39, 12, 5, 18, 11, 24, 17, 30, 23, 36, 29, 2, 35, 8], respectively. Therefore, in our example, the schedules for the provision of the a priori LLRs to the lower decoder by the interleaver and to the upper decoder by the deinterleaver may be described by the following two matrices, respectively.

$$\Pi(K_I^{u\pi}) = \begin{bmatrix} 15 & 3 & 31 & 19 & 7 & 9 & 34 & 39 & 24 \\ 12 & 40 & 28 & 16 & 4 & 35 & 20 & 25 & 10 \\ 1 & 29 & 17 & 5 & 33 & 21 & 6 & 11 & 36 \\ 38 & 26 & 14 & 2 & 30 & 18 & 23 & 8 & 13 \\ 1 & 29 & 17 & 5 & 33 & 21 & 6 & 11 & 36 \\ 15 & 3 & 31 & 19 & 7 & 35 & 20 & 25 & 10 \\ 12 & 40 & 28 & 16 & 4 & 32 & 37 & 22 & 27 \end{bmatrix} \quad (34)$$

$$\Pi^{-1}(K_I^{l\pi}) = \begin{bmatrix} 1 & 13 & 25 & 37 & 9 & 27 & 12 & 17 & 2 \\ 14 & 26 & 38 & 10 & 22 & 21 & 6 & 11 & 36 \\ 7 & 19 & 31 & 3 & 15 & 40 & 5 & 30 & 35 \\ 20 & 32 & 4 & 16 & 28 & 33 & 18 & 23 & 8 \\ 7 & 19 & 31 & 3 & 15 & 40 & 5 & 30 & 35 \\ 1 & 13 & 25 & 37 & 9 & 21 & 6 & 11 & 36 \\ 14 & 26 & 38 & 10 & 22 & 34 & 39 & 24 & 29 \end{bmatrix} \quad (35)$$

The particular processing element within the lower and upper decoders that the a priori LLRs are delivered to may be described by the matrices $P_I^{u\pi}$ and $P_I^{l\pi}$, which may be obtained by applying (18) to $\Pi(K_I^{u\pi})$ and $\Pi^{-1}(K_I^{l\pi})$, respectively. In our example, we obtain the following matrices.

$$P_I^{u\pi} = \begin{bmatrix} 4 & 1 & 8 & 5 & 2 & 3 & 8 & 9 & 6 \\ 3 & 9 & 7 & 4 & 1 & 8 & 5 & 6 & 3 \\ 1 & 7 & 5 & 2 & 8 & 6 & 2 & 3 & 9 \\ 9 & 7 & 4 & 1 & 7 & 5 & 6 & 2 & 4 \\ 1 & 7 & 5 & 2 & 8 & 6 & 2 & 3 & 9 \\ 4 & 1 & 8 & 5 & 2 & 8 & 5 & 6 & 3 \\ 3 & 9 & 7 & 4 & 1 & 8 & 9 & 6 & 7 \end{bmatrix} \quad (36)$$

$$P_I^{l\pi} = \begin{bmatrix} 1 & 4 & 6 & 9 & 3 & 7 & 3 & 5 & 1 \\ 4 & 7 & 9 & 3 & 6 & 6 & 2 & 3 & 9 \\ 2 & 5 & 8 & 1 & 4 & 9 & 2 & 7 & 8 \\ 5 & 8 & 1 & 4 & 7 & 8 & 5 & 6 & 2 \\ 2 & 5 & 8 & 1 & 4 & 9 & 2 & 7 & 8 \\ 1 & 4 & 6 & 9 & 3 & 6 & 2 & 3 & 9 \\ 4 & 7 & 9 & 3 & 6 & 8 & 9 & 6 & 7 \end{bmatrix} \quad (37)$$

However, these matrices reveal that the approach where the exchange of LLRs through the interleaver and deinterleaver are scheduled together with the forward recursions leads to a contention problem. More specifically, in the example matrices $P_I^{u\pi}$ and $P_I^{l\pi}$ provided above, some rows contain duplicate processing element indices, as highlighted in bold. However, the Beneš networks used to implement the interleaver and deinterleaver are not capable of delivering more than one LLR to a processing element at the same time, in this way.

In order to solve this contention problem, we schedule the interleaving and deinterleaving independently of the forward and backward recursions. More specifically, the forward and backward recursions of FIG. 11 are implemented by scheduling the read and write operations of most RAMs using the forward and backward RAM controllers, as described above. By contrast, independent scheduling is used for the write port $D^w$ of the RAM storing the a priori LLRs $[b_{1,k'}^a]_{k'=1}^{W_{l,p}}$ and the read port $D^r$ of the RAM storing the extrinsic LLRs $[b_{1,k'}^e]_{k'=1}^{W_{l,p}}$. This allows the exchange of LLRs through the interleaver and deinterleaver to be rescheduled, in order to avoid the Beneš network contention that would be caused whenever two or more LLRs were destined for the same processing element in the same clock cycle. This rescheduling may still deliver a particular extrinsic LLR through the interleaver or deinterleaver in the third clock cycle that immediately follows the two clock cycles in which it was generated by the first and second forward sub-processing element. This would potentially allow the LLR to be used in a fourth clock cycle by the first forward or the backward sub-processing element in the connected processing element of the other decoder. However, it may take several clock cycles for the forward and backward recursions of that connected processing element to reach this updated LLR, during which time it would go unused. This observation reveals that delaying the delivery of some LLRs through the interleaver or deinterleaver can have no detrimental impact upon the operation of the APTD. Motivated by this, the interleaving or deinterleaving of particular LLRs may be delayed in order to mitigate contention. However, in order to eliminate contention, it may also be necessary to disable the interleaving or deinterleaving of extrinsic LLRs generated by particular processing elements in particular clock cycles within the schedule period. It is this that motivates the employment of the $D_l$ additional clock cycles within the schedule period employed for particular frame lengths $K_l$. As described above, these additional clock cycles allow the start of each forward recursion to be repeated after its completion, granting a second opportunity to interleave or deinterleave an extrinsic LLR that may have been disabled on the first opportunity. By carefully designing the interleaver schedule, it can be ensured that every extrinsic LLR is interleaved or deinterleaved at least once per schedule period, while minimising the detrimental impact of delaying their delivery and minimising the number $D_l$ of additional clock cycles employed per schedule period.

A particular algorithm for designing an interleaving or deinterleaving schedule is provided below.

$K_I^\pi \leftarrow K_I^{fl}$
$P_I^\pi \leftarrow P_I^{fl}$
for col = 1 to P do
    for row = 1 to $C_l$ do
        if $K_I^\pi$ (row, col) duplicates the value of an element higher up in the same column then
            disable $K_I^\pi$ (row, col) and $P_I^\pi$ (row, col) by setting their values to '–'
        end if
    end for
end for
for row = 1 to $C_l$ do

```
        for col = 1 to P do
            if P_l^π (row, col) duplicates the value of an element further to the right in the same row
            then
                using an order that wraps from the bottom to the top of the matrix, search the
                successive rows for the first one in which the value of P_l^π (row, col) is not duplicated
                in any columns and in which the element in the column col is set to '−'
                if a suitable row can be identified then
                    delay K_l^π (row, col) and P_l^π (row, col) by swapping their values with the '−' in
                    the same column of the identified row
                else
                    return 'unsuccessful'
                end if
            end if
        end for
    end for
    rotate K_l^π downwards by two rows
    return 'successful'
```

In order to maximise the throughput of the APTD, the algorithm above may be employed with successively higher values of $D_l$, until it is successful for both the interleaver and deinterleaver. In our example, the resultant interleaving and deinterleaving schedules $K_l^{u\pi}$ and $K_l^{l\pi}$ are given by (38) and (39), respectively. Here, the corresponding values of $P_l^{u\pi}$ and $P_l^{l\pi}$ are provided in brackets, showing that all contention has been eliminated.

$$K_k^{u\pi} = \begin{bmatrix} - & - & 12(7) & 15(5) & - & 25(3) & 30(8) & 35(9) & 40(6) \\ - & 8(9) & 11(8) & - & - & - & - & - & - \\ 1(1) & 5(7) & 9(5) & - & 17(8) & 21(6) & 26(2) & 31(3) & 36(9) \\ 2(9) & - & - & 14(1) & 18(7) & 22(5) & 27(6) & 32(2) & 37(4) \\ - & 6(7) & 10(4) & 13(2) & - & - & - & - & - \\ 3(4) & 7(1) & - & - & 19(2) & 23(8) & 28(5) & 33(6) & 38(3) \\ 4(3) & - & - & 16(4) & 20(1) & 24(8) & 29(9) & 34(6) & 39(7) \end{bmatrix} \quad (38)$$

$$K_k^{l\pi} = \begin{bmatrix} - & 8(8) & 9(6) & 13(9) & - & 23(7) & 28(3) & 33(5) & 38(1) \\ 4(5) & 6(7) & 10(9) & - & 17(3) & - & - & - & - \\ - & 7(5) & - & 15(1) & 19(4) & 24(9) & 29(2) & 34(7) & 39(8) \\ - & - & 12(1) & 16(4) & 20(7) & 25(8) & 30(5) & 35(6) & 40(2) \\ 3(2) & - & 11(8) & - & 18(6) & - & - & - & - \\ 1(1) & 5(4) & - & - & - & 21(6) & 26(6) & 31(3) & 36(9) \\ 2(4) & - & - & 14(3) & - & 22(8) & 27(9) & 32(6) & 37(7) \end{bmatrix} \quad (39)$$

As shown in FIG. 10, the interleaver and deinterleaver schedules are stored in ROMs. These ROMs are controlled by output and input ROM controllers, which convert l and c into addresses $A^r$, which may be used to read a RAM address from the read port $D^r$ of the corresponding ROM. Each ROM comprises $Z = \Sigma_{i=1}^{188} C_l$ memory addresses, which may be addressed using $Y = \lceil \log_2(Z) \rceil$ bits. Each ROM memory address comprises $V' = \lceil \log_2(W_{max}) + 1 \rceil$ bits, which may store a value in the range 1 to $W'_{max}$. Here, $W'_{max} = W_{max} + 1$ represents a dummy value that is used to represent the disabled entries in the interleaver or deinterleaver schedule, which are indicated using '−' in (38) and (39). Note that the schedule used to read extrinsic LLRs from one processing element must correspond to the schedule used to write a priori LLRs into the processing element connected through the interleaver or deinterleaver. Note that in order to maximise the clock frequency of the APTD it may be beneficial to include pipelining registers within the Beneš networks. In this case, the schedule used to write the a priori LLR should be rotated downwards by one position for each pipelining stage.

Summary of Advantages

Embodiments of the present technique as explained above can provide an APTD, which has the following advantages:

Conventional turbo decoders are restricted to employing a number P of processing element that is an integer factor of the frame length $K_l$. This ensures that all windows have the same length $W_l = K_l / P$ and that the interleaving can be completed without contention. By contrast, the APTD supports any number P of processing elements and employs windows that may have different lengths. The APTD avoids contention by scheduling the interleaving and deinterleaving of the extrinsic LLRs independently of their generation. More specifically, the interleaving or deinterleaving of some extrinsic LLRs is delayed relative to their generation, or disabled altogether.

The turbo decoder of Example 2 disables some of its P=64 processing elements, when the frame length $K_l$ is shorter than 2048 bits. By contrast, the APTD only disables some of its P processing elements in each decoder when the frame length $K_l$ is shorter than 2P. In this case, $K_l / 2$ of the processing elements in each decoder process windows of length $W_{l,p} = 2$, while the remaining processing elements are disabled. When $K_l$ is greater than 2P, some of the windows have a length of $W_{l,p} = \lfloor K_l / P \rfloor$, while the remainder have a length of $W_{l,p} = \lceil K_l / P \rceil$.

Like the shuffled turbo decoder of Example 3, the APTD employs one processing element for each window of the upper decoder, as well as a separate processing element for each window of the lower decoder, where all windows are processed concurrently throughout the decoding process. However, while the shuffled turbo decoder performs a single forward recursion and a single backward recursion within each window, the APTD divides each window into two sub-windows. The APTD performs a forward and backward recursion for one sub-window, before performing a forward and backward recursion for the other sub-window. This is performed according to an odd-even arrangement, such that the first sub-window in each window of the upper decoder is processed concurrently with the second sub-window in each window of the lower decoder, and vice versa. Note that in the case where all windows have an even length $W_{l,p}$, this arrangement is equivalent to having twice as many windows and using each processing element to alternate between the processing of two neighbouring windows within the same decoder. This is in contrast to the turbo decoders of Examples 1, 2 and 4, which use each processing element to alternate between the processing of a particular window in the upper decoder and the corresponding window in the lower decoder. Note that the approach adopted by the APTD has the advantage of eliminating the requirement for processing elements to be able to interleave or deinterleave extrinsic LLRs back to themselves, allowing a simpler interleaver and deinterleaver to be employed.

In the special case where the windows of the APTD have the minimum length of $W_{l,p}=2$, the odd-even arrangement described above becomes equivalent to that of the FPTD and benefits from the odd-even nature of the LTE interleaver in the same way. In cases where the window length $W_{l,p}$ is odd, the recursions performed during the first $\lfloor C_f/2 \rfloor$ clock cycles have a length of $\lfloor W_{l,p}/2 \rfloor$, while those performed in the remaining $\lceil C_f/2 \rceil$ clock cycles have a length of $\lceil W_{l,p}/2 \rceil$, causing a slight overlap between the recursions performed for the upper and lower decoders. This is in contrast to the recursions of previously proposed turbo decoders, which do not have overlapping recursions.

The known turbo decoders of Examples 1 to 3 generate extrinsic LLRs during the second halves of both the forward and backward recursions. This approach generates no extrinsic LLRs during the first halves of the recursions and generates two LLRs during each step of the second halves. Therefore, this approach requires two interleavers and two deinterleavers during the second halves and this hardware goes unused during the first halves of the recursions. By contrast, the APTD generates extrinsic LLRs only during the forward recursion, based on the backward state metrics that have been most recently generated, either during the end of the recursion performed during the previous decoding iteration, or during start of the current recursion. This allows only a single interleaver and a single deinterleaver to be used, although this is achieved at the cost of requiring more decoding iterations in order to achieve the same BER, as characterized in FIGS. 15 and 16.

In contrast to the turbo decoders of Examples 1 to 3, the APTD may repeat the beginning of a recursion following its completion. This provides a second opportunity to generate the associated extrinsic LLRs, allowing the interleaving or deinterleaving of one or other of these regenerated LLRs to be disabled, without eliminating the interleaving or deinterleaving of these LLRs altogether. When the window length $W_{l,p}$ is short, this also allows more recent backward state metric vectors to be generated, ready for use to generate extrinsic LLRs during the next iteration.

Like the FPTD of Example 4, the APTD employs pipelining to increase the maximum clock frequency, but at the cost of requiring more decoding iterations to achieve the same BER. While the pipeline through each of the upper and lower decoder of the FPTD has three stages, the APTD reduces this to two stages, improving the BER. This is achieved by performing the normalisation and clipping of the state metrics at the input to each sub-processing element, rather than at the output as in the FPTD.

Illustrative Results

Figure 15:
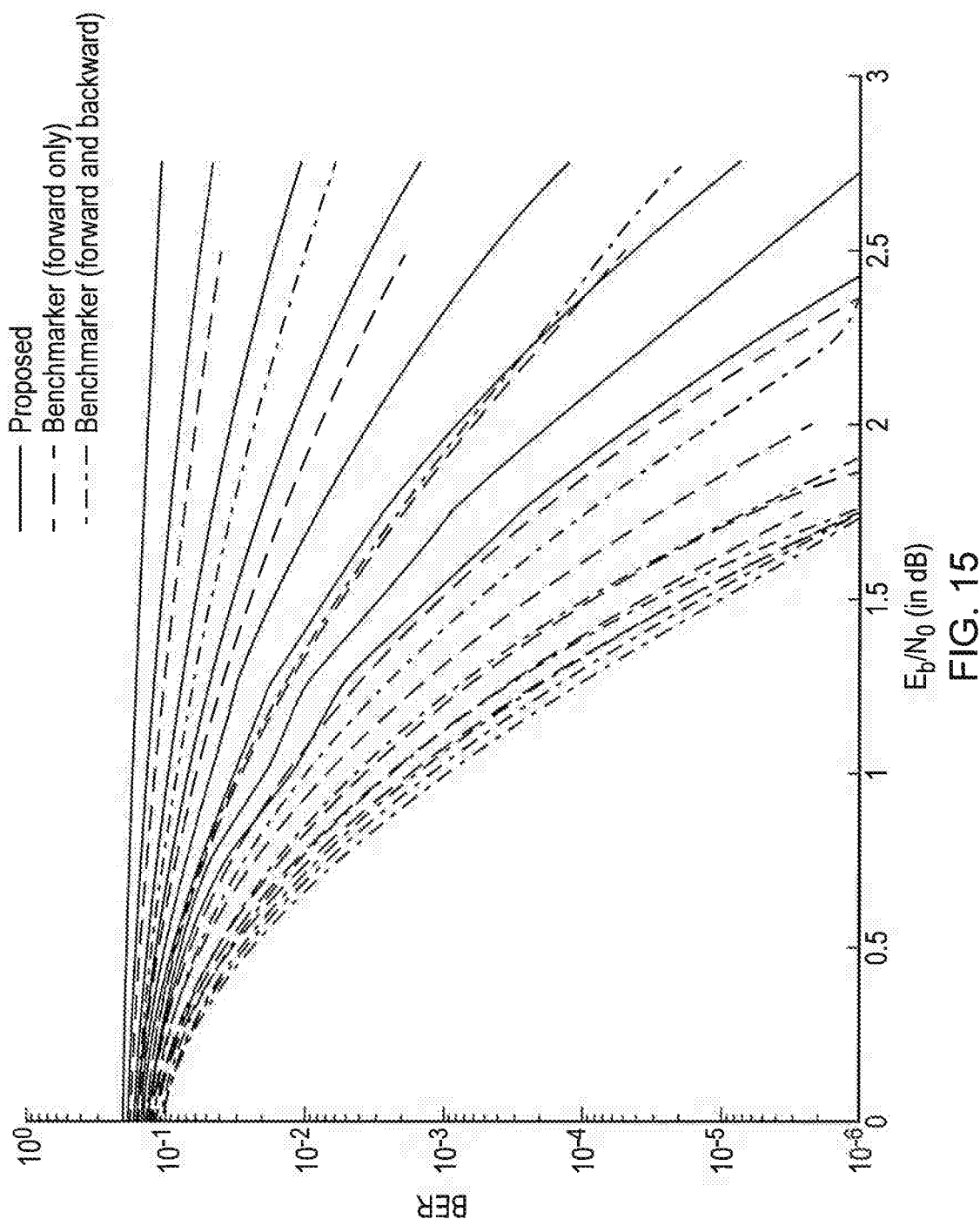
FIG. 15 is a graphical plot of bit error rate with respect to signal to noise ratio illustrating the performance of an arbitrarily parallel turbo decoder for different numbers of clock cycles using 128 processing elements and a frame length of 512 symbols according to an embodiment of the present technique.

FIG. 15 provides a graphical plot of Bit Error Ratio (BER) performance of the proposed APTD "Proposed", when employing a total of 2P=128 processing elements, as well as maximums of 8, 16, 24, 32, 40, 48, 56 and 64 clock cycles to decode frames having the length $K_f=512$. Note that pipelining is disabled in these results and that a slight BER degradation may be expected when it is enabled. These results are compared with a corresponding version of the turbo decoder of Example 1 "Benchmarker (forward only)", which calculates extrinsic LLRs on only the forward recursion, as in the proposed scheme. It employs 8 parallel processors of similar hardware complexity to each of the proposed processing element, as well as maximums of 246, 466, 686, 909, 1126, 1346, 1566 and 1786 clock cycles to decode frames having the same length of $K_f=512$. Results are also provided for a second version of the turbo decoder of Example 1 "Benchmarker (forward and backward)" which calculates extrinsic LLRs on both the forward and backwared recursions, at the cost of having 42% higher hardware complexity than each of the proposed processing elements. This scheme employs 8 parallel processors, as well as maximums of 246, 466, 686, 909, 1126, 1346, 1566 and 1786 clock cycles to decode frames having the same length of $K_f=512$.

Figure 16:
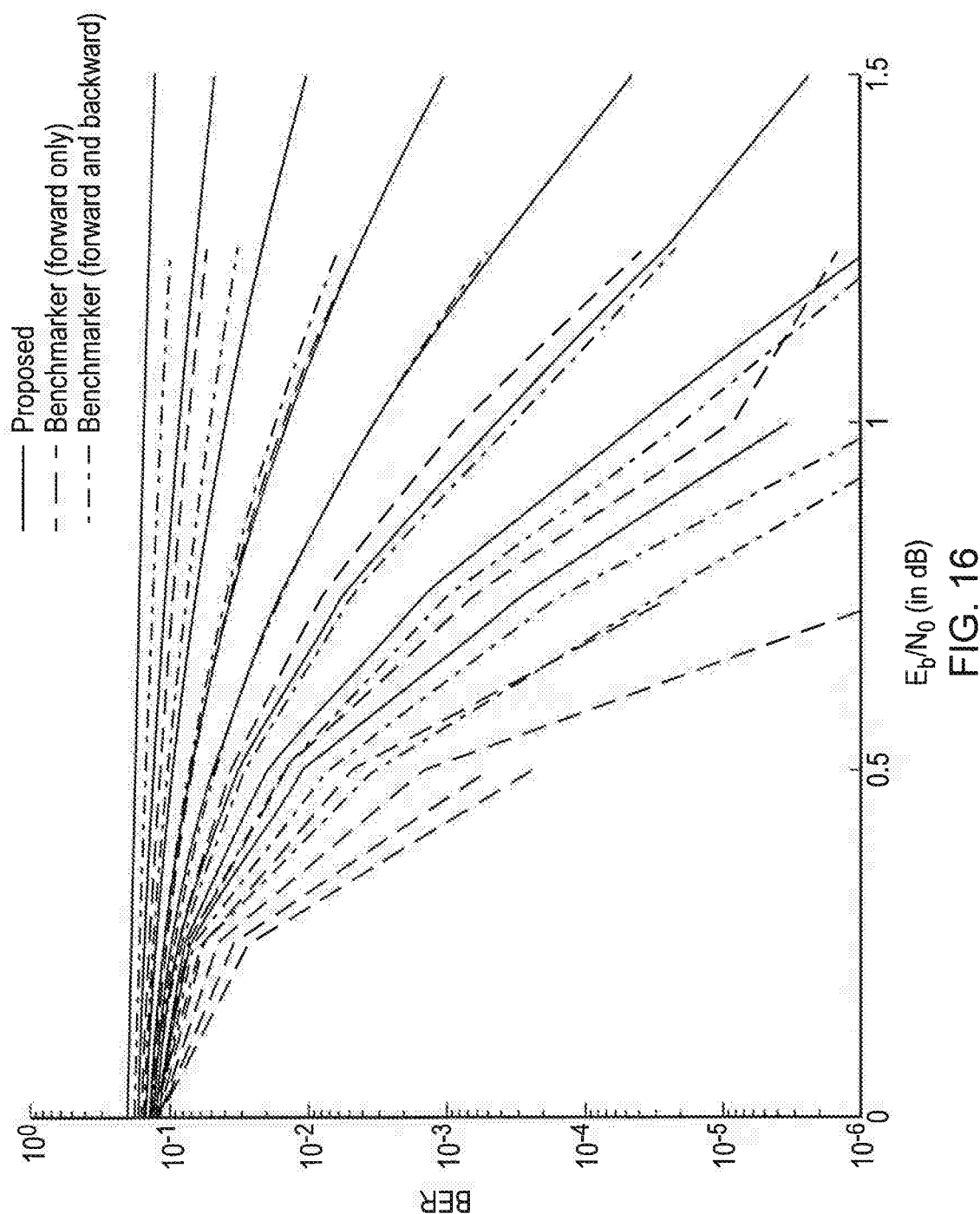
FIG. 16 is a graphical plot of bit error rate with respect to signal to noise ratio illustrating the performance of an arbitrarily parallel turbo decoder for different numbers of clock cycles using 128 processing elements and a frame length of 6144 symbols according to an embodiment of the present technique.

FIG. 16 provides a graphical plot of Bit Error Ratio (BER) performance of the proposed APTD "Proposed", when employing a total of 2P=128 processing elements, as well as maximums of 96, 192, 288, 384, 480, 576, 672 and 768 clock cycles to decode frames having the length $K_f=6144$. Note that pipelining is disabled in these results and that a slight BER degradation may be expected when it is enabled. These results are compared with a corresponding version of the turbo decoder of Example 1 "Benchmarker (forward only)", which calculates extrinsic LLRs on only the forward recursion, as in the proposed scheme. It employs 8 parallel processors of similar hardware complexity to each of the proposed processing element, as well as maximums of 1654, 3282, 4910, 6538, 8166, 9794, 11422, 13050 clock cycles to decode frames having the same length of $K_f=6144$. Results are also provided for a second version of the turbo decoder of Example 1 "Benchmarker (forward and backward)" which calculates extrinsic LLRs on both the forward and backward recursions, at the cost of having 42% higher hardware complexity than each of the proposed processing elements. This scheme employs 8 parallel processors, as well as maximums of 1654, 3282, 4910, 6538, 8166, 9794, 11422, 13050 clock cycles to decode frames having the same length of $K_f=6144$.

The following paragraphs provide further aspects and features of the present technique:

A turbo decoder circuit for performing a turbo decoding process to recover a frame of data symbols from a received signal comprising one or more parity and/or systematic soft decision values for each data symbol of the frame. The data symbols of the frame have been encoded with a turbo encoder comprising upper and lower convolutional encoders which can each be represented by a trellis, and an interleaver to interleave the data symbols between the upper and lower convolutional encoders. The turbo decoder circuit comprises a clock, configurable network circuitry which is configured to interleave soft decision values, and upper decoder and a lower decoder. The upper decoder comprises a plurality of upper processing elements associated with the upper convolutional encoder, each of the processing elements of the upper decoder being configured, during a series of consecutive clock cycles, iteratively to receive, from the configurable network circuitry, a priori soft decision values pertaining to data symbols associated with a window of an integer number of consecutive trellis stages representing possible paths between states of the upper convolutional encoder, to perform parallel calculations associated with the window using the a priori soft decision values in order to generate corresponding extrinsic soft decision values pertaining to the data symbols by performing forward and backward recursions for turbo decoding, and to provide the extrinsic soft decision values to the configurable network circuitry, at least one of the processing elements of the upper decoder being configured to perform the calculations for a window associated with a different number of the trellis stages to at least one other of the processing elements of the upper decoder. The lower decoder comprises a plurality of lower processing elements associated with the lower convolutional encoder, each of the processing elements of the lower decoder being configured, during the series of the consecutive clock cycles, iteratively to receive, from the configurable network circuitry, a priori soft decision values pertaining to data symbols associated with a window of an integer number of consecutive trellis stages representing possible paths between states of the lower convolutional encoder, to perform parallel calculations associated with the window using the a priori soft decision values in order to generate corresponding extrinsic soft decision values pertaining to the data symbols by performing forward and backward recursions for turbo decoding, and to provide the extrinsic soft decision values to the configurable network circuitry, at least one of the processing elements of the lower decoder being configured to perform the calculations for a window associated with a different number of the trellis stages to at least one other of the processing elements of the lower decoder. The configurable network circuitry includes network controller circuitry which controls a configuration of the configurable network circuitry iteratively, during the consecutive clock cycles, to provide the a priori soft decision values for the upper decoder by interleaving the extrinsic soft decision values provided by the lower decoder, and to provide the a priori soft decision values for the lower decoder by interleaving the extrinsic soft decision values provided by the upper decoder, the interleaving performed by the configurable network circuitry controlled by the network controller being in accordance with a predetermined schedule, which provides the a priori soft decision values at different cycles of the one or more consecutive clock cycles to avoid contention between different a priori soft decision values being provided to the same processing element of the upper or the lower decoder during the same clock cycle.

A turbo decoder circuit for performing a turbo decoding process to recover a frame of data symbols from a received signal comprising soft decision values for each data symbol of the frame. The data symbols of the frame have been encoded with a turbo encoder comprising upper and lower convolutional encoders which can each be represented by a trellis, and an interleaver to interleave the data symbols between the upper and lower convolutional encoders. The turbo decoder circuit comprises a clock, configurable network circuitry which is configured to interleave soft decision values, and upper decoder and a lower decoder. The upper decoder comprises a plurality of upper processing elements associated with the upper convolutional encoder, each of the processing elements of the upper decoder being configured, during a series of consecutive clock cycles, iteratively to receive, from the configurable network circuitry, a priori soft decision values pertaining to data symbols associated with a window of an integer number of consecutive trellis stages representing possible paths between states of the upper convolutional encoder, to perform parallel calculations to generate corresponding extrinsic soft decision values pertaining to the data symbols, and to provide the extrinsic soft decision values to the configurable network circuitry. The lower decoder comprises a plurality of lower processing elements associated with the lower convolutional encoder, each of the processing elements of the lower decoder being configured, during the series of the consecutive clock cycles, iteratively to receive, from the configurable network circuitry, a priori soft decision values pertaining to data symbols associated with a window of an integer number of consecutive trellis stages representing possible paths between states of the lower convolutional encoder, to perform parallel calculations to generate corresponding extrinsic soft decision values pertaining to the data symbols, and to provide the extrinsic soft decision values to the configurable network circuitry. The configurable network circuitry is configured in accordance with a predetermined schedule to provide the a priori soft decision values at different cycles of the one or more consecutive clock cycles to between the upper and lower decoders to avoid contention between different a priori soft decision values.

According to the embodiments recited in the above paragraphs the calculations performed by the processing elements according to the forward and the backward recursion comprise receiving the forward or backward state metrics pertaining to a neighbouring trellis stage, combining the forward or backward state metrics with the a priori, parity and systematic soft decision values for the data symbols and generating the forward or backward state metrics pertaining to another neighbouring trellis stage, wherein the received forward or backward state metrics are normalized before being combined with the a priori, parity and systematic soft decision values.

The following numbered paragraphs provide further example aspects and features of example embodiments:

Paragraph 1. A turbo decoder circuit for performing a turbo decoding process to recover a frame of data symbols from a received signal comprising one or more parity and/or systematic soft decision values for each data symbol of the frame, the data symbols of the frame having been encoded with a turbo encoder comprising upper and lower convolutional encoders which can each be represented by a trellis, and an interleaver to interleave the data symbols between the upper and lower convolutional encoders, the turbo decoder circuit comprising a clock, configurable network circuitry which is configured to interleave soft decision values, an upper decoder comprising a plurality of upper processing elements associated with the upper convolutional encoder, each of the processing elements of the upper decoder being configured, during a series of consecutive clock cycles, iteratively to receive, from the configurable network circuitry, a priori soft decision values pertaining to data symbols associated with a window of an integer number of consecutive trellis stages representing possible paths between states of the upper convolutional encoder, to perform parallel calculations associated with the window using the a priori soft decision values in order to generate corresponding extrinsic soft decision values pertaining to the data symbols, and to provide the extrinsic soft decision values to the configurable network circuitry, at least one of the processing elements of the upper decoder being configured to perform the calculations for a window associated with a different number of the trellis stages to at least one other of the processing elements of the upper decoder, and a lower decoder comprising a plurality of lower processing elements associated with the lower convolutional encoder, each of the processing elements of the lower decoder being configured, during the series of the consecutive clock cycles, iteratively to receive, from the configurable network circuitry, a priori soft decision values pertaining to data symbols associated with a window of an integer number of consecutive trellis stages representing possible paths between states of the lower convolutional encoder, to perform parallel calculations associated with the window using the a priori soft decision values in order to generate corresponding extrinsic soft decision values pertaining to the data symbols, and to provide the extrinsic soft decision values to the configurable network circuitry, at least one of the processing elements of the lower decoder being configured to perform the calculations for a window associated with a different number of the trellis stages to at least one other of the processing elements of the lower decoder, wherein the configurable network circuitry includes network controller circuitry which controls a configuration of the configurable network circuitry iteratively, during the consecutive clock cycles, to provide the a priori soft decision values for the upper decoder by interleaving the extrinsic soft decision values provided by the lower decoder, and to provide the a priori soft decision values for the lower decoder by interleaving the extrinsic soft decision values provided by the upper decoder, the interleaving performed by the configurable network circuitry controlled by the network controller being in accordance with a predetermined schedule, which provides the a priori soft decision values at different cycles of the one or more consecutive clock cycles to avoid contention between different a priori soft decision values being provided to the same processing element of the upper or the lower decoder during the same clock cycle.

Paragraph 2. A turbo decoder circuit according to paragraph 1, wherein the processing elements for each of the upper decoder and the lower decoder are configured to read the a priori soft decision values from memory and to write extrinsic soft decision values to memory after the calculations are performed, and the configurable network circuitry is configured to read the extrinsic soft decision values from memory and to write a priori soft decision values to memory, and the reading of one or more of the extrinsic soft decision values by the configurable network in accordance with the predetermined schedule is delayed by one or more clock cycles relative to the writing of the one or more extrinsic soft decision values by the processing elements.

Paragraph 3. A turbo decoder circuit according to paragraph 1 or 2, wherein the processing elements for each of the upper decoder and the lower decoder are configured to read the a priori soft decision values from memory and to write extrinsic soft decision values to memory after the calculations are performed, and the configurable network circuitry is configured to read the extrinsic soft decision values from memory and to write a priori soft decision values to memory, and at least one of the reading of one or more of the extrinsic soft decision values by the configurable network in accordance with the predetermined schedule or the writing of the one or more extrinsic soft decision values by the processing elements is skipped.

Paragraph 4. A turbo decoder circuit according to any of paragraphs 1, 2 or 3, wherein the number of processing elements in the upper decoder or the lower decoder is not an integer factor of the number of trellis stages.

Paragraph 5. A turbo decoder according to any of paragraphs 1 to 4, wherein a difference between the minimum and the maximum number of the trellis stages within each window processed by the processing elements is one in either of the upper and lower decoders.

Paragraph 6. A turbo decoder circuit according to any of paragraphs 1 to 5 wherein each of the windows comprising the same number of trellis stages which are processed by the processing elements which are adjacent to each other.

Paragraph 7. A turbo decoder circuit according to any of paragraphs 1 to 6, wherein the upper and lower decoder comprise the same number of processing elements and each processing element of the upper decoder performs calculations for a window comprising corresponding trellis stages as the corresponding processing element of the lower decoder.

Paragraph 8. A turbo decoder according to any of paragraphs 1 to 7, wherein a processing schedule of the processing elements and the interleaving is periodic according to the same number of clock cycles, each iteration representing a period of the same schedule.

Paragraph 9. A turbo decoder according to paragraph 8, wherein the period is given by a maximum of trellis stages in any one window in either the upper or lower decoder plus a non-negative integer required to reduce a requirement for skipping in accordance with the predetermined schedule to avoid contention.

Paragraph 10. A turbo decoder circuit according to any of paragraphs 1 to 9, wherein each of the processing elements is configured to perform the parallel calculations according to a periodic schedule, and each period includes a first sub-period comprising one or more of first clock cycles in the period, and a second sub-period comprising the remaining cycles in the period, during a first sub-period the processing of each window comprises forward and backward recursions within either a first sub-window comprising a first one or more of the trellis stages in the window, or a second sub-window comprising the last one or more of the trellis stages in the window, during a second sub-period, each of the processing elements is configured to perform forward and backward recursions within the other of the first and second sub-window, which comprises the remaining trellis stages in the window.

Paragraph 11. A turbo decoder circuit according to paragraph 10, wherein one of the first and second sub-periods comprises a half rounding down of the clock cycles in the period and the other of the first and second sub-period comprise the remaining half rounding up of the clock cycles of the period, and during one of the first and second sub-periods comprising a half-rounding down of the clock cycles each processing element performs the parallel calculations for the first or the second sub-window comprising a half rounding down of the trellis stages in the window, and during the other of the first and second sub-periods comprising a half-rounding up of the clock cycles the processing element performs calculations for the first or the second sub-window comprising a half rounding up of the trellis stages in the window.

Paragraph 12. A turbo decoder circuit according to paragraph 11, wherein the processing elements are configured to perform calculations for a sub-window within a sub-period associated with a complete forward recursion within the sub-window and a complete backward recursion within the sub-window, and after performing the complete forward recursion and the complete backward recursion any remaining clock cycles are used by the processing elements to perform calculations associated with at least part of a subsequent forward and a subsequent backward recursion.

Paragraph 13. A turbo decoder circuit according to paragraph 12, wherein during the first sub-period the processing elements of the upper decoder are configured to perform calculations associated with the same one of a first or a second sub-window, and the processing elements of the lower decoder are configured to perform calculations associated with the other of the first or the second sub-window, and during the second sub-period the processing elements of the upper decoder are configured to perform calculations associated with the first or the second sub-window which was not processed by the processing element during the first sub-period, and the processing elements of the lower decoder are configured to perform calculations associated with the other of the first or the second sub-window which was not processed by the processing element during the first sub-period.

Paragraph 14. A turbo decoder circuit according to any of paragraphs 10 to 13, wherein the forward recursion generates a plurality of forward state metrics corresponding to the plurality of trellis states according to a schedule which performs calculations associated with each successive trellis stage in a forward direction and the backward recursion generates a plurality of backward state metrics corresponding to the plurality of trellis states according to a schedule which performs calculations associated with each successive trellis stage in a backward direction, and either the forward recursion stores the forward state metrics in a memory according to the schedule for the forward recursion or the backward recursion stores the backward state metrics in the memory according to the schedule for the backward recursion, and the other of the forward or the backward recursions loads the stored forward or backward state metrics from the memory and combines the forward and the backward state metrics to calculate the extrinsic soft decision values according to the schedule for the forward or the backward recursion.

Paragraph 15. A turbo decoder circuit according to any of paragraphs 10 to 14, wherein the calculations performed by the processing elements according to the forward and the backward recursion comprise receiving the forward or backward state metrics pertaining to a neighbouring trellis stage, combining the forward or backward state metrics with the a priori, parity and systematic soft decision values for the data symbols and generating the forward or backward state metrics pertaining to another neighbouring trellis stage, wherein the received forward or backward state metrics are normalized before being combined with the a priori, parity and systematic soft decision values.

Paragraph 16. A turbo decoder circuit according to paragraph 15, wherein the processing elements are configured to generate the extrinsic soft decision values according to a two step pipeline comprising a first step which combines the forward and backward state metrics with each other and with the parity soft decision values to form intermediate variables, and a second step which combines the intermediate variables with each other, scales the combination of intermediate variables and combines the scaled combination of intermediate variables with the systematic soft decision values, and the two steps of the pipeline are performed during the two consecutive clock cycles, and the delay imposed by the steps of the pipeline are accommodated in the delay imposed by the predetermined schedule of the configurable network to avoid contention.

Paragraph 17. A turbo decoder circuit according to any of paragraphs 1 to 16, wherein the number of data symbols in the frame is variable, and the number of trellis stages of each window for calculations performed by the upper and lower decoders is determined with respect to the frame length and the number of the processing elements of the upper and lower decoders.

Paragraph 18. A method of turbo decoding to recover a frame of data symbols from a received signal comprising one or more parity and/or systematic soft decision values for each data symbol of the frame, the data symbols of the frame having been encoded with a turbo encoder comprising upper and lower convolutional encoders which can each be represented by a trellis, and an interleaver to interleave the encoded data have been interleaved between the upper and lower convolutional encoders, the method comprising performing a forward and a backward iterative recursion processes using an upper decoder comprising a plurality of upper processing elements associated with the upper convolutional encoder, by iteratively receiving at each of the processing elements of the upper decoder, during a series of consecutive clock cycles, from a configurable network circuitry, a priori soft decision values pertaining to data symbols associated with a window of an integer number of consecutive trellis stages representing possible paths between states of the upper convolutional encoder, performing parallel calculations by each of the processing elements associated with the window using the a priori soft decision values in order to generate corresponding extrinsic soft decision values pertaining to the data symbols, at least one of the processing elements of the upper decoder performing the calculations for a window associated with a different number of the trellis stages to at least one other of the processing elements of the upper decoder, providing the extrinsic soft decision values to the configurable network circuitry, and performing a forward and a backward iterative recursion processes using a lower decoder comprising a plurality of lower processing elements associated with the lower convolutional encoder, by iteratively receiving at each of the processing elements of the lower decoder, during the series of the consecutive clock cycles, from the configurable network circuitry, a priori soft decision values pertaining to data symbols associated with a window of an integer number of consecutive trellis stages representing possible paths between states of the lower convolutional encoder, performing parallel calculations by each of the processing elements associated with the window using the a priori soft decision values in order to generate corresponding extrinsic soft decision values pertaining to the data symbols, at least one of the processing elements of the lower decoder performing the calculations for a window associated with a different number of the trellis stages to at least one other of the processing elements of the lower decoder, providing the extrinsic soft decision values to the configurable network circuitry, controlling a configuration of the configurable network circuitry iteratively, during the consecutive clock cycles, to provide the a priori soft decision values for the upper decoder by interleaving the extrinsic soft decision values provided by the lower decoder, and to provide the a priori soft decision values for the lower decoder by interleaving the extrinsic soft decision values provided by the upper decoder, the interleaving performed by the configurable network circuitry controlled by the network controller being in accordance with a predetermined schedule, which provides the a priori soft decision values at different cycles of the one or more consecutive clock cycles to avoid contention between different a priori soft decision value being provided to the same processing element of the upper or the lower decoder during the same clock cycle.

Paragraph 19. A receiver for detecting and recovering frames of data symbols which have been encoded with a turbo code, the receiver including detecting circuitry for detecting a received signal carrying the frames of data symbols, each of the frames of data symbols comprising one or more parity and/or systematic soft decision values for each data symbol of the frame, the data symbols of each frame having been encoded with a turbo encoder comprising upper and lower convolutional encoders which can each be represented by a trellis, and an interleaver to interleave the encoded data have been interleaved between the upper and lower convolutional encoders, and a turbo decoder circuit for performing a turbo decoding process to recover each of the frame of data symbols from the received signal, the turbo decoder circuit comprising
a clock,
configurable network circuitry which is configured to interleave soft decision values,
an upper decoder comprising a plurality of upper processing elements associated with the upper convolutional encoder, each of the processing elements of the upper decoder being configured, during a series of consecutive clock cycles, iteratively to receive, from the configurable network circuitry, a priori soft decision values pertaining to data symbols associated with a window of an integer number of consecutive trellis stages representing possible paths between states of the upper convolutional encoder, to perform parallel calculations associated with the window using the a priori soft decision values in order to generate corresponding extrinsic soft decision values pertaining to the data symbols, and to provide the extrinsic soft decision values to the configurable network circuitry, at least one of the processing elements of the upper decoder being configured to perform the calculations for a window associated with a different number of the trellis stages to at least one other of the processing elements of the upper decoder, and a lower decoder comprising a plurality of lower processing elements associated with the lower convolutional encoder, each of the processing elements of the lower decoder being configured, during the series of the consecutive clock cycles, iteratively to receive, from the configurable network circuitry, a priori soft decision values pertaining to data symbols associated with a window of an integer number of consecutive trellis stages representing possible paths between states of the lower convolutional encoder, to perform parallel calculations associated with the window using the a priori soft decision values in order to generate corresponding extrinsic soft decision values pertaining to the data symbols, and to provide the extrinsic soft decision values to the configurable network circuitry, at least one of the processing elements of the lower decoder being configured to perform the calculations for a window associated with a different number of the trellis stages to at least one other of the processing elements of the lower decoder, wherein the configurable network circuitry includes network controller circuitry which controls a configuration of the configurable network circuitry iteratively, during the consecutive clock cycles, to provide the a priori soft decision values for the upper decoder by interleaving the extrinsic soft decision values provided by the lower decoder, and to provide the a priori soft decision values for the lower decoder by interleaving the extrinsic soft decision values provided by the upper decoder, the interleaving performed by the configurable network circuitry controlled by the network controller being in accordance with a predetermined schedule, which provides the a priori soft decision values at different cycles of the one or more consecutive clock cycles to avoid contention between different a priori soft decision value being provided to the same processing element of the upper or the lower decoder during the same clock cycle.

Paragraph 20. A receiver according to paragraph 19, wherein a number of data symbols in each of the frames varies dynamically from one from to another.

Paragraph 21. An infrastructure equipment forming part of a radio access network of a wireless communications network, the infrastructure equipment including a receiver according to paragraph 19 or 20.

Paragraph 22. A communications device for transmitting or receiving data with a wireless communications network, the communications device including a receiver according to paragraph 19 or 20.

REFERENCES

[1] ETSI TS36.212 v 10.8.0 (2013-06)LTE; Evolved Universal Terrestrial Radio Access (E-UTRA); Multiplexing and Channel Coding, V10.2.0 ed., 2011.

[2] IEEE 802.16-2012 Standard for Local and Metropolitan Area Networks—Part 16: Air Interface for Broadband Wireless Access Systems, 2012.

[3] C. Berrou, A. Glavieux, and P. Thitimajshima, "Near Shannon limit error-correcting coding and decoding: Turbo-codes (1)," in Proc. IEEE Int. Conf. on Communications, vol. 2, Geneva, Switzerland, May 1993, pp. 1064-1070.

[4] P. Robertson, E. Villebrun, and P. Hoeher, "A comparison of optimal and sub-optimal MAP decoding algorithms operating in the log domain," in Proc. IEEE Int. Conf. on Communications, vol. 2, Seattle, Wash., USA, June 1995, pp. 1009-1013.

[5] IEEE 802.11n-2009 Standard for Information Technology—Telecommunications and Information Exchange between Systems—Local and Metropolitan Area Networks—Specific Requirements—Part 11: Wireless LAN Medium Access Control (MAC) and Physical Layer (PHY), 2009.

[6] D. J. C. MacKay and R. M. Neal, "Near Shannon limit performance of low density parity check codes," Electron. Lett., vol. 32, no. 18, pp. 457-458, August 1996.

[7] M. Fossorier, "Reduced complexity decoding of low-density parity check codes based on belief propagation," IEEE Trans. Commun., vol. 47, no. 5, pp. 673-680, May 1999.

[8] 5G Radio Access. Ericsson White Paper, June 2013.

[9] V. A. Chandrasetty and S. M. Aziz, "FPGA implementation of a LDPC decoder using a reduced complexity message passing algorithm," Journal of Networks, vol. 6, no. 1, pp. 36-45, January 2011.

[10] T. Ilnseher, F. Kienle, C. Weis, and N. Wehn, "A 2.15 GBit/s turbo code decoder for LTE Advanced base station applications," in Proc. Int. Symp. on Turbo Codes and Iterative Information Processing, Gothenburg, Sweden, August 2012, pp. 21-25.

[11] L. Fanucci, P. Ciao, and G. Colavolpe, "VLSI design of a fully-parallel high-throughput decoder for turbo gallager codes," IEICE Trans. Fundamentals, vol. E89-A, no. 7, pp. 1976-1986, July 2006.

[12] D. Vogrig, A. Gerosa, A. Neviani, A. Graell I Amat, G. Montorsi, and S. Benedetto, "A 0.35-µm CMOS analog turbo decoder for the 40-bit rate 1/3 UMTS channel code," IEEE J. Solid-State Circuits, vol. 40, no. 3, pp. 753-762, 2005.

[13] Q. T. Dong, M. Arzel, C. J. Jego, and W. J. Gross, "Stochastic decoding of turbo codes." IEEE Trans. Signal Processing, vol. 58, no. 12, pp. 6421-6425, December 2010.

[14] A. Nimbalker, Y. Blankenship, B. Classon, and T. K. Blankenship, "ARP and QPP interleavers for LTE turbo coding," in Proc. IEEE Wireless Commun Networking Conf., Las Vegas, Nev., USA, March 2008, pp. 1032-1037.

[15] L. Li, R. G. Maunder, B. M. Al-Hashimi, and L Hanzo, "A low-complexity turbo decoder architecture for energy-efficient wireless sensor networks," IEEE Trans. VLSI Syst., vol. 21, no. 1, pp. 14-22, January 2013. [Online]. Available: http://eprints.soton.ac.uk/271820/[16]
[16] P. Radosavljevic, A. de Baynast, and J. R. Cavallaro, "Optimized message passing schedules for LDPC decoding," in Asilomar Conf. Signals Systems and Computers, no. 1, Pacific Grove, Calif., USA, October 2005, pp. 591-595.
[17] CN 102611464
[18] CN 102723958
[19] WO 2011/082509
[20] "A 122 Mb/s Turbo decoder using a mid-range GPU" by Xianjun J., et al, published at Wireless Communications and Mobile Computing Conference (IWCMC), 2013 9th International, pages 1090-1094, 1-5 Jul. 2013.
[21] "Turbo IP Core User Guide", UG-Turbo, 2015.11.11 Altera.
[22] L. F. Gonzalez-Perez, L. C. Yllescas-Calderon, and R. Parra-Michel, "Parallel and Configurable Turbo Decoder Implementation for 3GPP-LTE," in 2013 Int. Conf. Reconfigurable Comput. FPGAs, pp. 1-6, IEEE, December 2013.
[23] Yufei Wu, B. D. Woerner and T. K. Blankenship, "Data width requirements in SISO decoding with module normalization," in IEEE Transactions on Communications, vol. 49, no. 11, pp. 1861-1868, November 2001.
[24] J. Zhang and M. P. C. Fossorier, "Shuffled iterative decoding," *IEEE Trans. Commun.*, vol. 53, no. 2, pp. 209-213, February 2005.
[25] C. Chang, "Arbitrary size Benes networks", *Parallel Processing Letters*, vol. 7, no. 3, September 1997.
[26] PCT/EP2015/067527

The invention claimed is:
1. A turbo decoder circuit for performing a turbo decoding process to recover a frame of data symbols from a received signal comprising one or more parity and/or systematic soft decision values for each data symbol of the frame, the data symbols of the frame having been encoded with a turbo encoder comprising upper and lower convolutional encoders which can each be represented by a trellis, and an interleaver to interleave the data symbols between the upper and lower convolutional encoders, the turbo decoder circuit comprising
a clock,
configurable network circuitry which is configured to interleave soft decision values,
an upper decoder comprising a plurality of upper processing elements associated with the upper convolutional encoder, each of the processing elements of the upper decoder being configured, during a series of consecutive clock cycles, iteratively to receive, from the configurable network circuitry, a priori soft decision values pertaining to data symbols associated with a window of an integer number of consecutive trellis stages representing possible paths between states of the upper convolutional encoder, to perform parallel calculations associated with the window using the a priori soft decision values in order to generate corresponding extrinsic soft decision values pertaining to the data symbols, and to provide the extrinsic soft decision values to the configurable network circuitry, at least one of the processing elements of the upper decoder being configured to perform the calculations for a window associated with a different number of the trellis stages to at least one other of the processing elements of the upper decoder, and
a lower decoder comprising a plurality of lower processing elements associated with the lower convolutional encoder, each of the processing elements of the lower decoder being configured, during the series of the consecutive clock cycles, iteratively to receive, from the configurable network circuitry, a priori soft decision values pertaining to data symbols associated with a window of an integer number of consecutive trellis stages representing possible paths between states of the lower convolutional encoder, to perform parallel calculations associated with the window using the a priori soft decision values in order to generate corresponding extrinsic soft decision values pertaining to the data symbols, and to provide the extrinsic soft decision values to the configurable network circuitry, at least one of the processing elements of the lower decoder being configured to perform the calculations for a window associated with a different number of the trellis stages to at least one other of the processing elements of the lower decoder,
wherein the configurable network circuitry includes network controller circuitry which controls a configuration of the configurable network circuitry iteratively, during the consecutive clock cycles, to provide the a priori soft decision values for the upper decoder by interleaving the extrinsic soft decision values provided by the lower decoder, and to provide the a priori soft decision values for the lower decoder by interleaving the extrinsic soft decision values provided by the upper decoder, the interleaving performed by the configurable network circuitry controlled by the network controller being in accordance with a predetermined schedule, which provides the a priori soft decision values at different cycles of the one or more consecutive clock cycles to avoid contention between different a priori soft decision values being provided to the same processing element of the upper or the lower decoder during the same clock cycle.

2. A turbo decoder circuit as claimed in claim 1, wherein the processing elements for each of the upper decoder and the lower decoder are configured to read the a priori soft decision values from a memory and to write extrinsic soft decision values to the memory after the calculations are performed, and the configurable network circuitry is configured to read the extrinsic soft decision values from the memory and to write a priori soft decision values to the memory, and the reading of one or more of the extrinsic soft decision values by the configurable network in accordance with the predetermined schedule is delayed by one or more clock cycles relative to the writing of the one or more extrinsic soft decision values by the processing elements.

3. A turbo decoder circuit as claimed in claim 1, wherein the processing elements for each of the upper decoder and the lower decoder are configured to read the a priori soft decision values from a memory and to write extrinsic soft decision values to the memory after the calculations are performed, and the configurable network circuitry is configured to read the extrinsic soft decision values from the memory and to write a priori soft decision values to the memory, and at least one of the reading of one or more of the extrinsic soft decision values by the configurable network in accordance with the predetermined schedule or the writing of the one or more extrinsic soft decision values by the processing elements is skipped.

4. A turbo decoder circuit as claimed in claim 1, wherein the number of processing elements in the upper decoder or the lower decoder is not an integer factor of the number of trellis stages.

5. A turbo decoder as claimed in claim 1, wherein a difference between the minimum and the maximum number of the trellis stages within each window processed by the processing elements is one in either of the upper and lower decoders.

6. A turbo decoder circuit as claimed in claim 1, wherein each of the windows comprising the same number of trellis stages which are processed by the processing elements which are adjacent to each other.

7. A turbo decoder circuit as claimed in claim 1, wherein the upper and lower decoder comprise the same number of processing elements and each processing element of the upper decoder performs calculations for a window comprising corresponding trellis stages as the corresponding processing element of the lower decoder.

8. A turbo decoder as claimed in claim 1, wherein a processing schedule of the processing elements and the interleaving is periodic according to the same number of clock cycles, each iteration representing a period of the same schedule.

9. A turbo decoder as claimed in claim 8, wherein the period is given by a maximum of trellis stages in any one window in either the upper or lower decoder plus a non-negative integer required to reduce a requirement for skipping in accordance with the predetermined schedule to avoid contention.

10. A turbo decoder circuit as claimed in claim 1, wherein each of the processing elements is configured to perform the parallel calculations according to a periodic schedule, and each period includes a first sub-period comprising one or more of first clock cycles in the period, and a second sub-period comprising the remaining cycles in the period, during a first sub-period the processing of each window comprises forward and backward recursions within either a first sub-window comprising a first one or more of the trellis stages in the window, or a second sub-window comprising the last one or more of the trellis stages in the window, during a second sub-period, each of the processing elements is configured to perform forward and backward recursions within the other of the first and second sub-window, which comprises the remaining trellis stages in the window.

11. A turbo decoder circuit as claimed in claim 10, wherein one of the first and second sub-periods comprises a half rounding down of the clock cycles in the period and the other of the first and second sub-period comprise the remaining half rounding up of the clock cycles of the period, and during one of the first and second sub-periods comprising a half-rounding down of the clock cycles each of the processing elements performs the parallel calculations for the first or the second sub-window comprising a half rounding down of the trellis stages in the window, and during the other of the first and second sub-periods comprising a half-rounding up of the clock cycles the processing element performs calculations for the first or the second sub-window comprising a half rounding up of the trellis stages in the window.

12. A turbo decoder circuit as claimed in claim 11, wherein the processing elements are configured to perform calculations for a sub-window within a sub-period associated with a complete forward recursion within the sub-window and a complete backward recursion within the sub-window, and after performing the complete forward recursion and the complete backward recursion any remaining clock cycles are used by the processing elements to perform calculations associated with at least part of a subsequent forward and a subsequent backward recursion.

13. A turbo decoder circuit as claimed in claim 12, wherein during the first sub-period the processing elements of the upper decoder are configured to perform calculations associated with the same one of a first or a second sub-window, and the processing elements of the lower decoder are configured to perform calculations associated with the other of the first or the second sub-window, and during the second sub-period the processing elements of the upper decoder are configured to perform calculations associated with the first or the second sub-window which was not processed by the processing element during the first sub-period, and the processing elements of the lower decoder are configured to perform calculations associated with the other of the first or the second sub-window which was not processed by the processing element during the first sub-period.

14. A turbo decoder circuit as claimed in claim 10, wherein the forward recursion generates a plurality of forward state metrics corresponding to the plurality of trellis states according to a schedule which performs calculations associated with each successive trellis stage in a forward direction and the backward recursion generates a plurality of backward state metrics corresponding to the plurality of trellis states according to a schedule which performs calculations associated with each successive trellis stage in a backward direction, and either the forward recursion stores the forward state metrics in a memory according to the schedule for the forward recursion or the backward recursion stores the backward state metrics in the memory according to the schedule for the backward recursion, and the other of the forward or the backward recursions loads the stored forward or backward state metrics from the memory and combines the forward and the backward state metrics to calculate the extrinsic soft decision values according to the schedule for the forward or the backward recursion.

15. A turbo decoder circuit as claimed in claim 10, wherein the calculations performed by the processing elements according to the forward and the backward recursion comprise receiving the forward or backward state metrics pertaining to a neighbouring trellis stage, combining the forward or backward state metrics with the a priori, parity and systematic soft decision values for the data symbols and generating the forward or backward state metrics pertaining to another neighbouring trellis stage, wherein the received forward or backward state metrics are normalized before being combined with the a priori, parity and systematic soft decision values.

16. A turbo decoder circuit as claimed in claim 15, wherein the processing elements are configured to generate the extrinsic soft decision values according to a two step pipeline comprising a first step which combines the forward and backward state metrics with each other and with the parity soft decision values to form intermediate variables, and a second step which combines the intermediate variables with each other, scales the combination of intermediate variables and combines the scaled combination of intermediate variables with the systematic soft decision values, and the two steps of the pipeline are performed during the two consecutive clock cycles, and the delay imposed by the steps of the pipeline are accommodated in the delay imposed by the predetermined schedule of the configurable network to avoid contention.

17. A turbo decoder circuit as claimed in claim 1, wherein the number of data symbols in the frame is variable, and the number of trellis stages of each window for calculations performed by the upper and lower decoders is determined with respect to the frame length and the number of the processing elements of the upper and lower decoders.

18. A method of turbo decoding to recover a frame of data symbols from a received signal comprising one or more parity and/or systematic soft decision values for each data symbol of the frame, the data symbols of the frame having been encoded with a turbo encoder comprising upper and lower convolutional encoders which can each be represented by a trellis, and an interleaver to interleave the encoded data have been interleaved between the upper and lower convolutional encoders, the method comprising performing a forward and a backward iterative recursion processes using an upper decoder comprising a plurality of upper processing elements associated with the upper convolutional encoder, by iteratively receiving at each of the processing elements of the upper decoder, during a series of consecutive clock cycles, from a configurable network circuitry, a priori soft decision values pertaining to data symbols associated with a window of an integer number of consecutive trellis stages representing possible paths between states of the upper convolutional encoder, performing parallel calculations by each of the processing elements associated with the window using the a priori soft decision values in order to generate corresponding extrinsic soft decision values pertaining to the data symbols, at least one of the processing elements of the upper decoder performing the calculations for a window associated with a different number of the trellis stages to at least one other of the processing elements of the upper decoder, providing the extrinsic soft decision values to the configurable network circuitry, and performing a forward and a backward iterative recursion processes using a lower decoder comprising a plurality of lower processing elements associated with the lower convolutional encoder, by iteratively receiving at each of the processing elements of the lower decoder, during the series of the consecutive clock cycles, from the configurable network circuitry, a priori soft decision values pertaining to data symbols associated with a window of an integer number of consecutive trellis stages representing possible paths between states of the lower convolutional encoder, performing parallel calculations by each of the processing elements associated with the window using the a priori soft decision values in order to generate corresponding extrinsic soft decision values pertaining to the data symbols, at least one of the processing elements of the lower decoder performing the calculations for a window associated with a different number of the trellis stages to at least one other of the processing elements of the lower decoder, providing the extrinsic soft decision values to the configurable network circuitry, controlling a configuration of the configurable network circuitry iteratively, during the consecutive clock cycles, to provide the a priori soft decision values for the upper decoder by interleaving the extrinsic soft decision values provided by the lower decoder, and to provide the a priori soft decision values for the lower decoder by interleaving the extrinsic soft decision values provided by the upper decoder, the interleaving performed by the configurable network circuitry controlled by the network controller being in accordance with a predetermined schedule, which provides the a priori soft decision values at different cycles of the one or more consecutive clock cycles to avoid contention between different a priori soft decision value being provided to the same processing element of the upper or the lower decoder during the same clock cycle.

19. A receiver for detecting and recovering frames of data symbols which have been encoded with a turbo code, the receiver including detecting circuitry for detecting a received signal carrying the frames of data symbols, each of the frames of data symbols comprising one or more parity and/or systematic soft decision values for each data symbol of the frame, the data symbols of each frame having been encoded with a turbo encoder comprising upper and lower convolutional encoders which can each be represented by a trellis, and an interleaver to interleave the encoded data have been interleaved between the upper and lower convolutional encoders, and a turbo decoder circuit for performing a turbo decoding process to recover each of the frame of data symbols from the received signal, the turbo decoder circuit comprising a clock, configurable network circuitry which is configured to interleave soft decision values, an upper decoder comprising a plurality of upper processing elements associated with the upper convolutional encoder, each of the processing elements of the upper decoder being configured, during a series of consecutive clock cycles, iteratively to receive, from the configurable network circuitry, a priori soft decision values pertaining to data symbols associated with a window of an integer number of consecutive trellis stages representing possible paths between states of the upper convolutional encoder, to perform parallel calculations associated with the window using the a priori soft decision values in order to generate corresponding extrinsic soft decision values pertaining to the data symbols, and to provide the extrinsic soft decision values to the configurable network circuitry, at least one of the processing elements of the upper decoder being configured to perform the calculations for a window associated with a different number of the trellis stages to at least one other of the processing elements of the upper decoder, and a lower decoder comprising a plurality of lower processing elements associated with the lower convolutional encoder, each of the processing elements of the lower decoder being configured, during the series of the consecutive clock cycles, iteratively to receive, from the configurable network circuitry, a priori soft decision values pertaining to data symbols associated with a window of an integer number of consecutive trellis stages representing possible paths between states of the lower convolutional encoder, to perform parallel calculations associated with the window using the a priori soft decision values in order to generate corresponding extrinsic soft decision values pertaining to the data symbols, and to provide the extrinsic soft decision values to the configurable network circuitry, at least one of the processing elements of the lower decoder being configured to perform the calculations for a window associated with a different number of the trellis stages to at least one other of the processing elements of the lower decoder, wherein the configurable network circuitry includes network controller circuitry which controls a configuration of the configurable network circuitry iteratively, during the consecutive clock cycles, to provide the a priori soft decision values for the upper decoder by interleaving the extrinsic soft decision values provided by the lower decoder, and to provide the a priori soft decision values for the lower decoder by interleaving the extrinsic soft decision values provided by the upper decoder, the interleaving performed by the configurable network circuitry controlled by the network controller being in accordance with a predetermined schedule, which provides the a priori soft decision values at different cycles of the one or more consecutive clock cycles to avoid contention between different a priori soft decision value being provided to the same processing element of the upper or the lower decoder during the same clock cycle.

20. A receiver as claimed in claim 19, wherein a number of data symbols in each of the frames varies dynamically from one from to another.

21. An infrastructure equipment forming part of a radio access network of a wireless communications network, the infrastructure equipment including a receiver as claimed in claim 19.

22. A communications device for transmitting or receiving data with a wireless communications network, the communications device including a receiver according to claim 19.

* * * * *